(12) United States Patent
Lee et al.

(10) Patent No.: US 12,538,471 B2
(45) Date of Patent: Jan. 27, 2026

(54) SEMICONDUCTOR DEVICE

(71) Applicant: SAMSUNG ELECTRONICS CO., LTD., Suwon-si (KR)

(72) Inventors: Seok Hwan Lee, Yongin-si (KR); Ki Seok Lee, Hwaseong-si (KR); Sang Ho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 654 days.

(21) Appl. No.: 17/881,032

(22) Filed: Aug. 4, 2022

(65) Prior Publication Data
US 2023/0139252 A1 May 4, 2023

(30) Foreign Application Priority Data

Nov. 3, 2021 (KR) .................. 10-2021-0149786

(51) Int. Cl.
*H10B 12/00* (2023.01)
*H01L 23/528* (2006.01)

(52) U.S. Cl.
CPC ....... *H10B 12/315* (2023.02); *H01L 23/5283* (2013.01)

(58) Field of Classification Search
CPC .... H10B 12/315; H10B 12/34; H10B 12/053; H10B 12/482; H10B 12/485; H01L 23/5283; H01L 21/76224
See application file for complete search history.

(56) References Cited

U.S. PATENT DOCUMENTS

| | | | |
|---|---|---|---|
| 8,674,473 B2 | 3/2014 | Im | |
| 8,846,472 B2 | 9/2014 | Yi | |
| 9,230,612 B2 | 1/2016 | Park | |
| 9,276,074 B2 | 3/2016 | Choi et al. | |
| 9,871,045 B2 | 1/2018 | Yeom et al. | |
| 2015/0380508 A1* | 12/2015 | Kim | H10B 12/482 257/773 |

(Continued)

FOREIGN PATENT DOCUMENTS

| KR | 10-2011-0116357 | 10/2011 |
|---|---|---|
| KR | 10-1116732 | 2/2012 |
| KR | 10-2012-0027697 | 3/2012 |

(Continued)

OTHER PUBLICATIONS

Office Action dated Jun. 23, 2025 issued in Korean Patent Application No. KR 10-2021-0149786. (Note: US 2019/0067294 A1 and US 2015/0380508 A1 cited therein are already of record.).

*Primary Examiner* — Jonathan Han
(74) *Attorney, Agent, or Firm* — MORGAN, LEWIS & BOCKIUS LLP

(57) ABSTRACT

A semiconductor device includes a device isolation layer defining a cell active area in a substrate. A plurality of buried contacts is electrically connected with the substrate and arranged in a first direction. A bit line structure extends in a second direction between adjacent buried contacts of the plurality of buried contacts. The bit line structure includes a bit line pass portion and a bit line contact portion. The bit line structure is electrically connected with the cell active area. A first buffer pattern is disposed between the substrate and the bit line pass portion. The first buffer pattern has a T-shape in a cross-section taken along the first direction.

20 Claims, 79 Drawing Sheets

(56) References Cited

U.S. PATENT DOCUMENTS

2019/0067294 A1* 2/2019 Lee ..................... H10B 12/315

FOREIGN PATENT DOCUMENTS

| KR | 10-2012-0098174 | | 9/2012 |
| KR | 10-2013-0037880 | | 4/2013 |
| KR | 10-2016-0001426 | A | 1/2016 |
| KR | 10-2019-0024251 | A | 3/2019 |

* cited by examiner

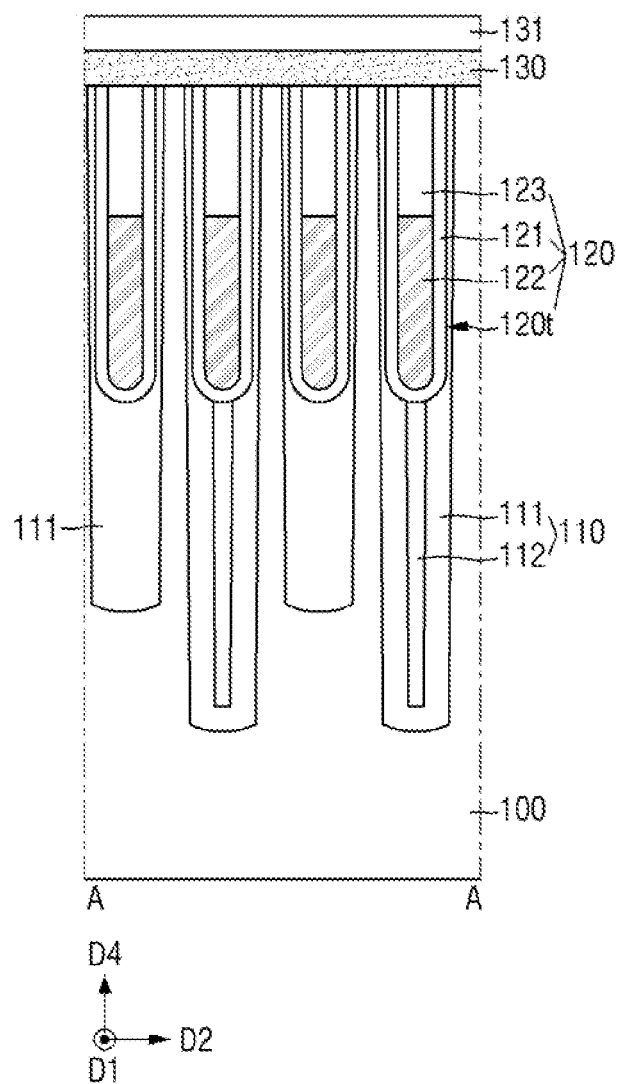

SEMICONDUCTOR DEVICE

CROSS-REFERENCE TO RELATED APPLICATION

This application claims priority under 35 § 119 to Korean Patent Application No. 10-2021-0149786, filed on Nov. 3, 2021 in the Korean intellectual Property Office, the disclosure of which is incorporated by reference in its entirety herein.

1. TECHNICAL FIELD

The present disclosure relates to a semiconductor device.

2. DISCUSSION OF RELATED ART

As semiconductor devices become increasingly highly integrated, individual circuit patterns are becoming finer to implement more semiconductor devices in the same area. For example, with the increase in the degree of integration of the semiconductor device, the design rule for components of the semiconductor device has been reduced.

In highly scaled semiconductor devices, a process of forming a plurality of wiring lines and a plurality of buried contacts (BC) interposed between the wiring lines has become increasingly complex and difficult.

SUMMARY

Aspects of the present disclosure is to provide a semiconductor device with increased product reliability.

Aspects of the present disclosure are not limited to those mentioned above and additional objects of the present disclosure, which are not mentioned herein, will be clearly understood by those skilled in the art from the following description of the present disclosure.

However, aspects of the present disclosure are not restricted to the ones set forth herein. The above and other aspects of the present disclosure will become more apparent to one of ordinary skill in the art, to which the present disclosure pertains by referencing the detailed description of the present disclosure given below.

According to an embodiment of the present disclosure, a semiconductor device includes a device isolation layer defining a cell active area in a substrate. A plurality of buried contacts is electrically connected with the substrate and arranged in a first direction. A bit line structure extends in a second direction between adjacent buried contacts of the plurality of buried contacts. The bit line structure includes a bit line pass portion and a bit line contact portion. The bit line structure is electrically connected with the cell active area. A first buffer pattern is disposed between the substrate and the bit line pass portion. The first buffer pattern has a T-shape in a cross-section taken along the first direction.

According to an embodiment of the present disclosure, a semiconductor device includes a substrate including a device isolation layer and a cell active area defined by the device isolation layer. A plurality of gate electrodes extends in a first direction in the substrate and is arranged in a second direction. A plurality of buried contacts is disposed in the first direction between adjacent gate electrodes of the plurality of gate electrodes. A plurality of contact pads is electrically connected with the substrate and is disposed between the substrate and the plurality of buried contacts. A plurality of landing pads is disposed on the plurality of buried contacts and is electrically connected with the plurality of buried contacts. A first buffer pattern is disposed on the substrate. A bit line structure extends in the second direction between adjacent buried contacts of the plurality of buried contacts. The bit line structure includes a bit line pass portion and a bit line contact portion. The bit line contact portion is electrically connected with the cell active area by passing through the first buffer pattern.

According to an embodiment of the present disclosure, a semiconductor device includes a device isolation layer defining a cell active area in a substrate. A plurality of gate electrodes extends in a first direction in the substrate and is arranged in a second direction. A plurality of buried contacts is electrically connected with the substrate and is arranged in the first direction between the gate electrodes adjacent to each other. A plurality of landing pads is disposed on the plurality of buried contacts and is electrically connected with the plurality of buried contacts. A plurality of capacitor structures is disposed on the plurality of landing pads and is electrically connected with the plurality of landing pads. A bit line structure extends in the second direction between adjacent buried contacts of the plurality of buried contacts. The bit line structure includes a bit line pass portion and a bit line contact portion. The bit line contact portion is electrically connected with the substrate. A first buffer pattern is disposed between the substrate and the bit line pass portion. The first buffer pattern has a T-shape in a cross-section taken along the first direction. A second buffer pattern is disposed on the first buffer pattern. The bit line pass portion passes through the second buffer pattern and is disposed directly on the first buffer pattern.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF EMBODIMENTS

Figure 1:
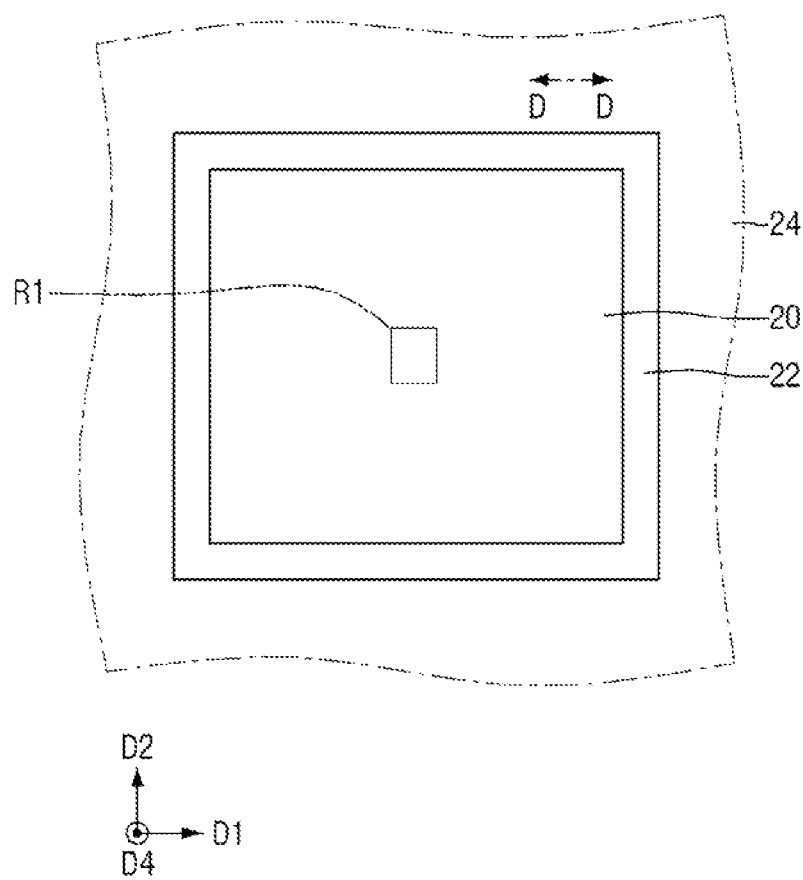
FIG. 1 is a schematic layout view illustrating a semiconductor memory device according to an embodiment of the present disclosure.
Figure 2:
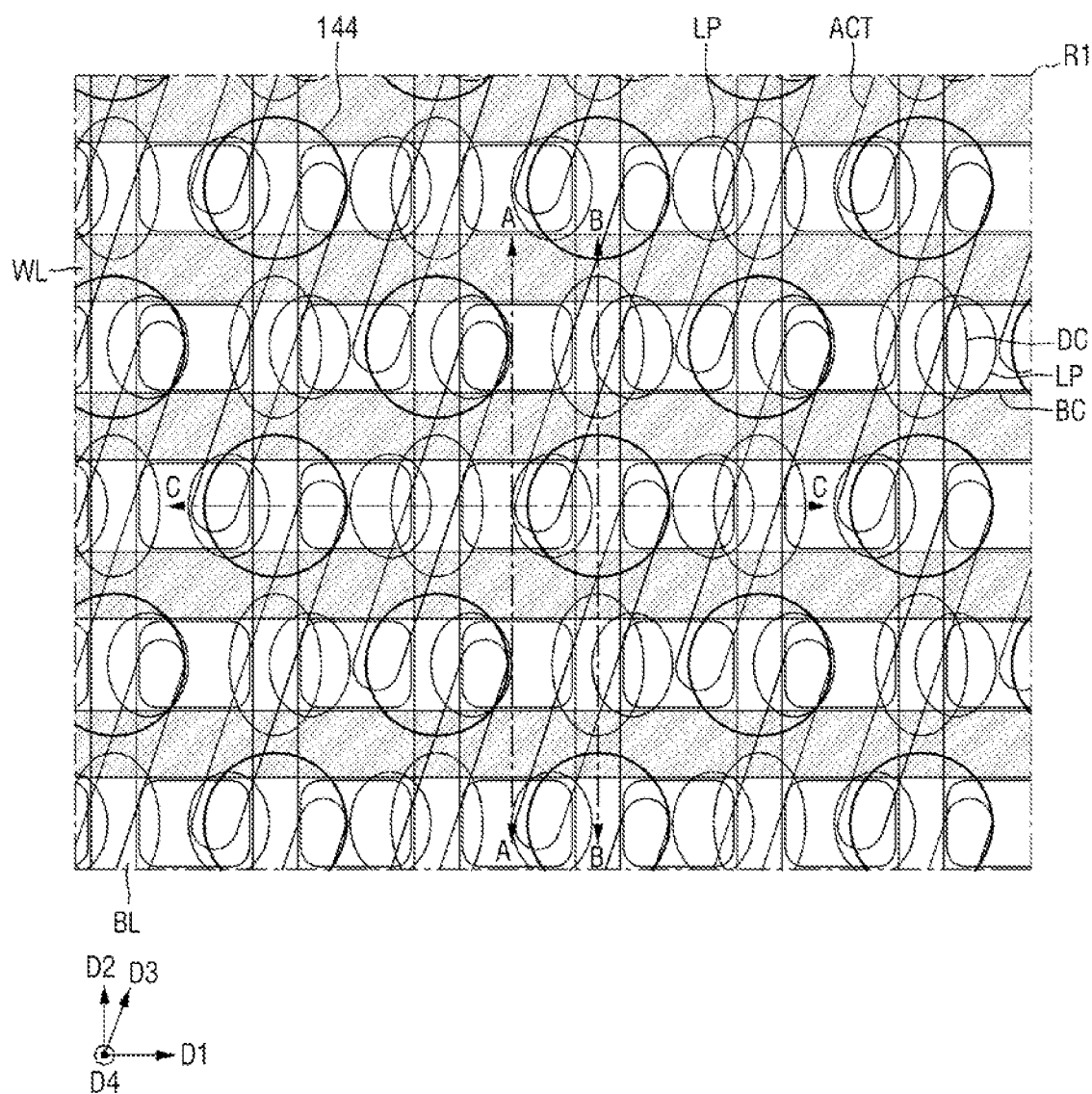
FIG. 2 is a schematic layout illustrating an area R1 of FIG. 1 according to an embodiment of the present disclosure.
Figure 3A:
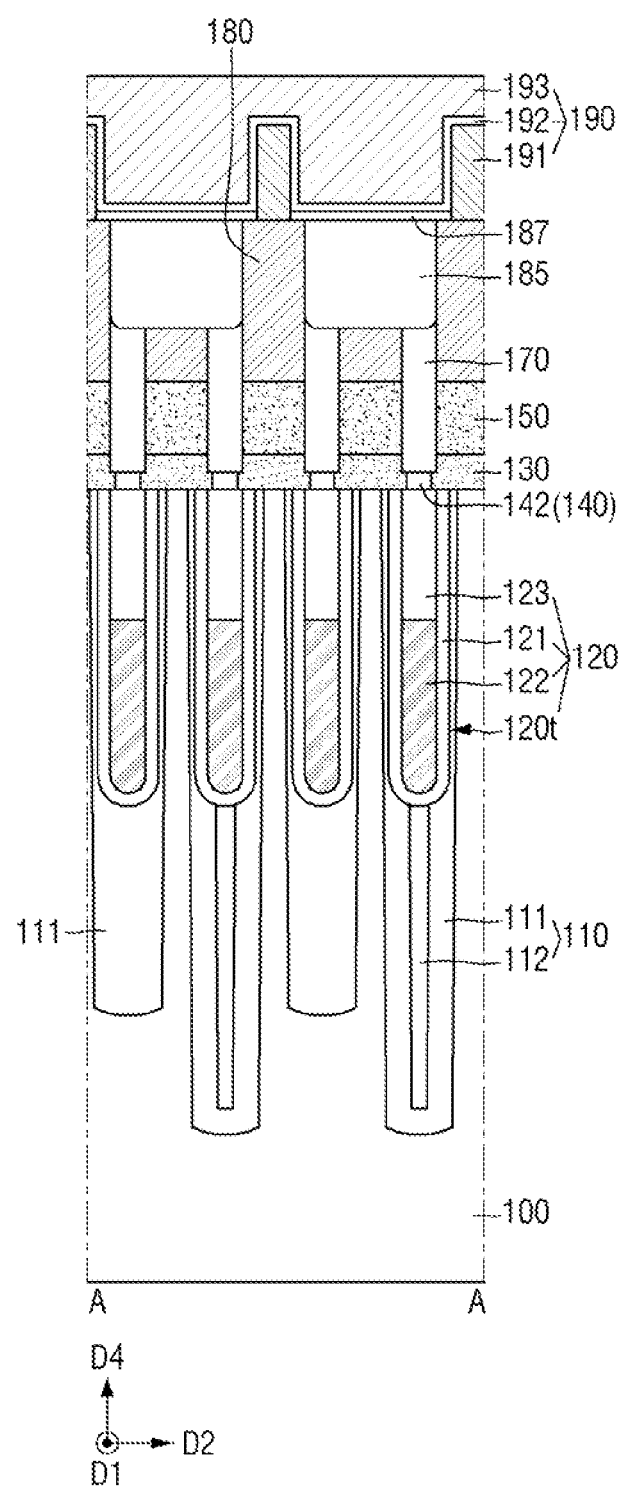
FIG. 3A is a cross-sectional view taken along line A-A of FIG. 2 according to an embodiment of the present disclosure.
Figure 3B:
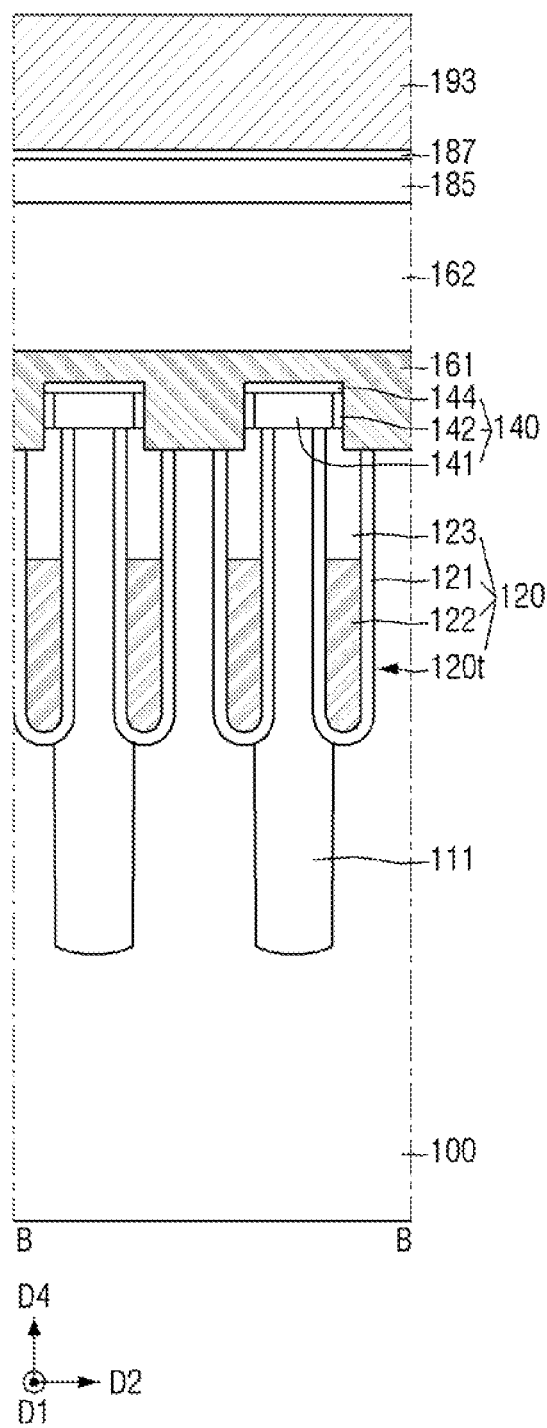
FIG. 3B is a cross-sectional view taken along line B-B of FIG. 2 according to an embodiment of the present disclosure.
Figure 3C:
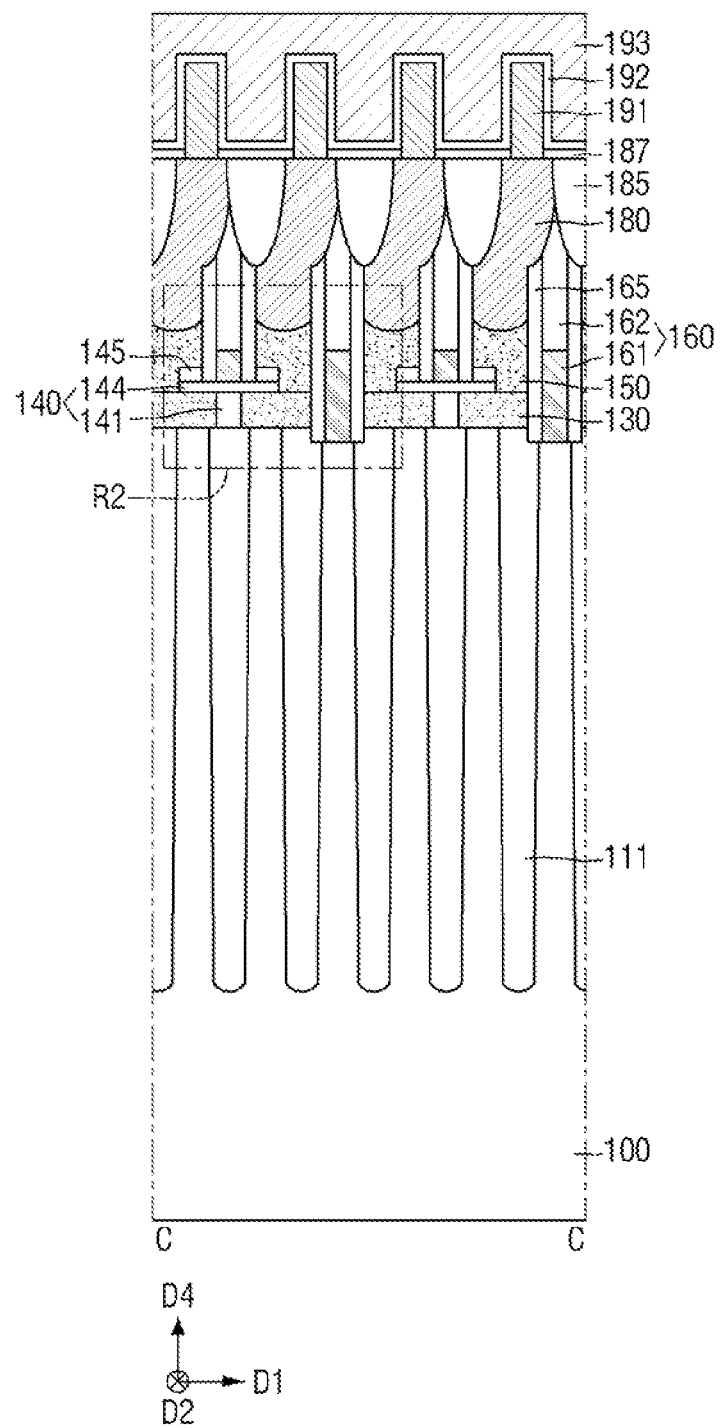
FIG. 3C is a cross-sectional view taken along line C-C of FIG. 2 according to an embodiment of the present disclosure.
Figure 3D:
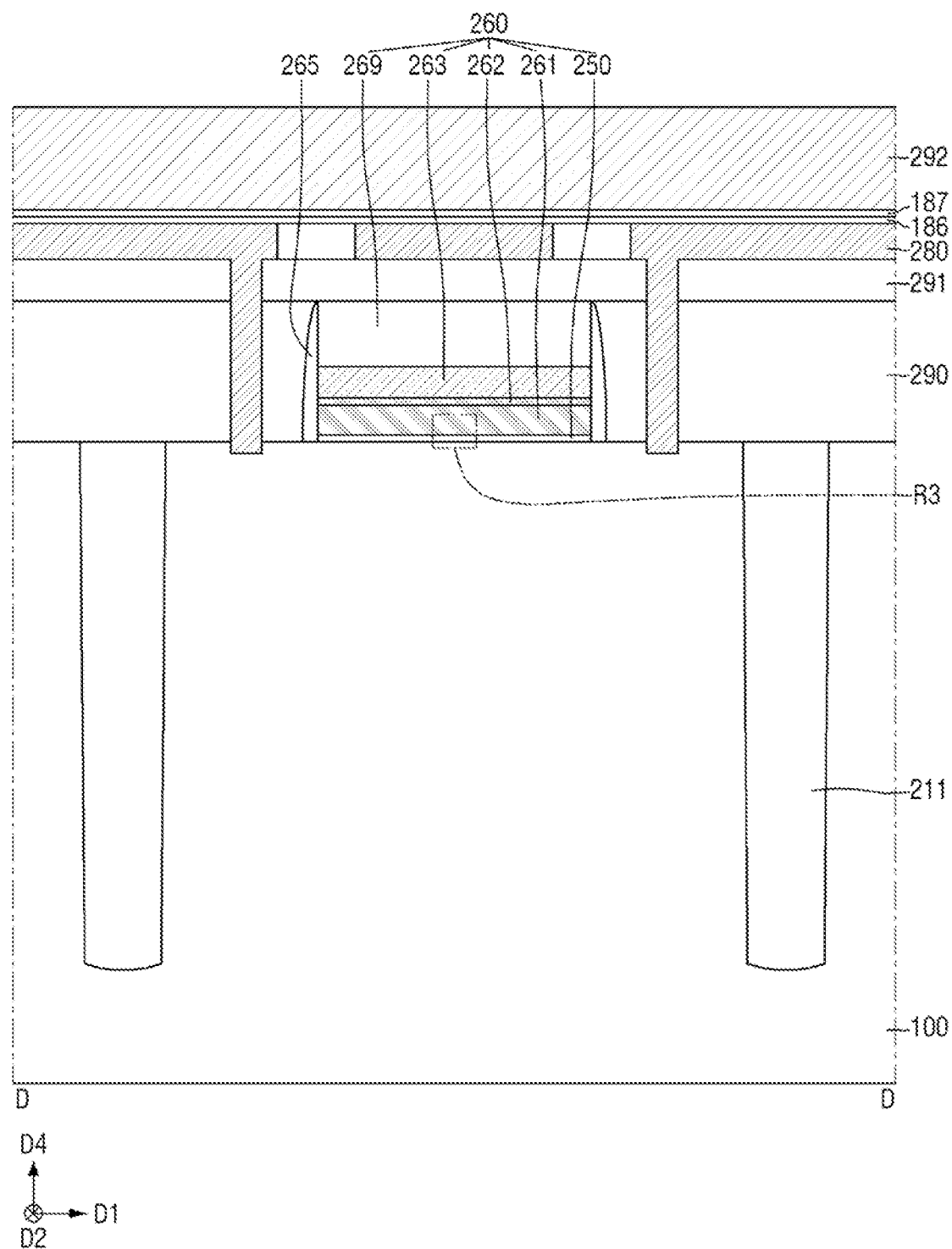
FIG. 3D is a cross-sectional view taken along line D-D of FIG. 1 according to an embodiment of the present disclosure.
Figure 4:
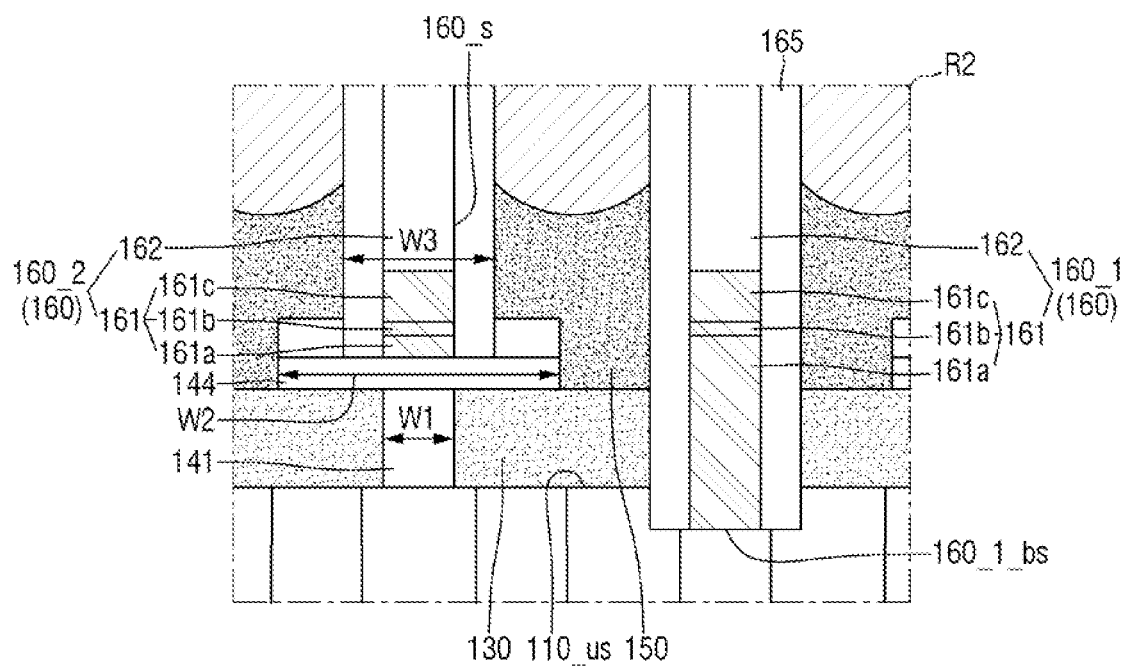
FIG. 4 is an enlarged cross-sectional view illustrating an area R2 of FIG. 3C according to an embodiment of the present disclosure.
Figure 5:
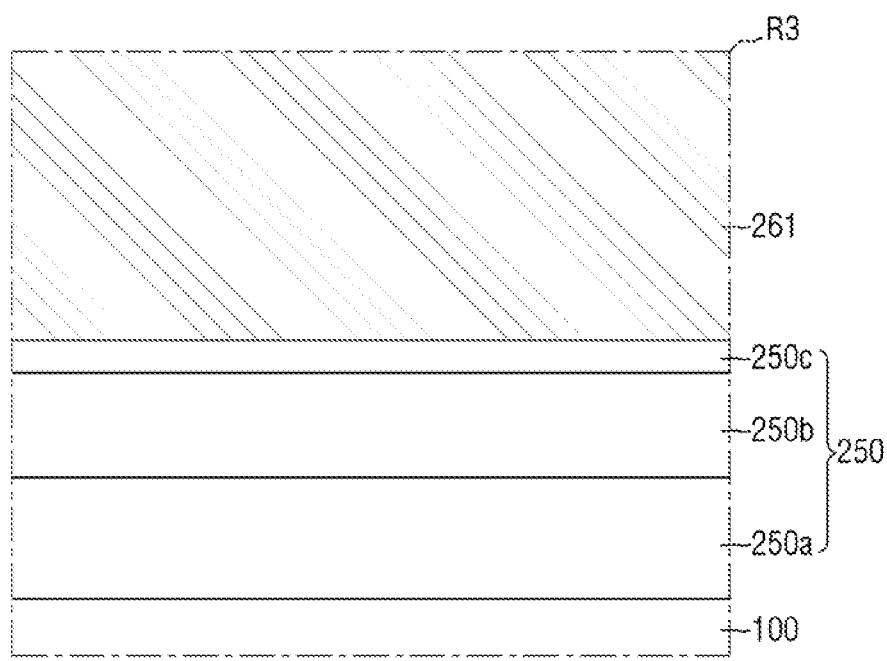
FIGS. 5 and 6 are enlarged cross-sectional views illustrating an area R3 of FIG. 3D according to embodiments of the present disclosure.
Figure 6:
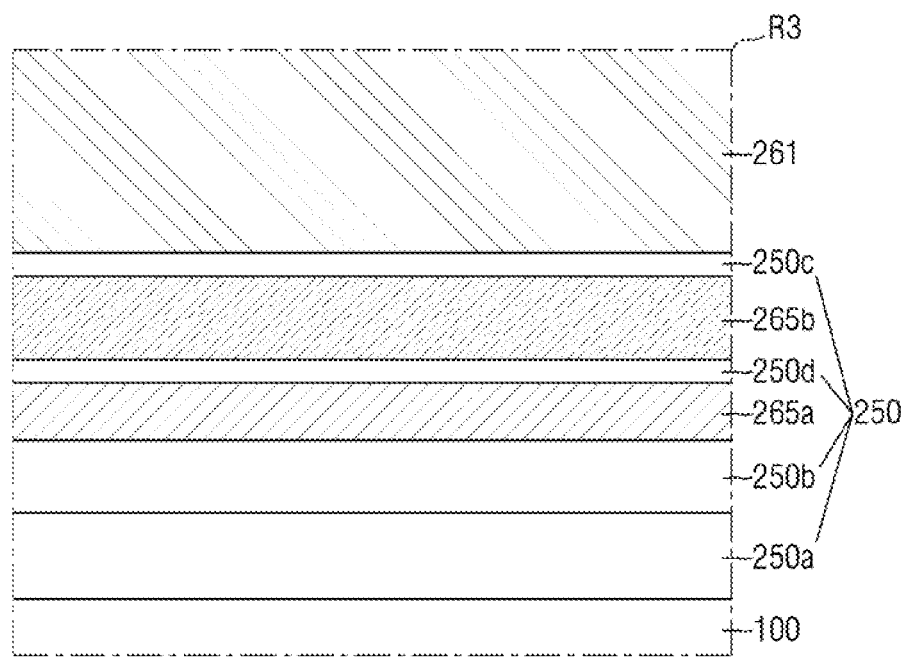
Figure 7:
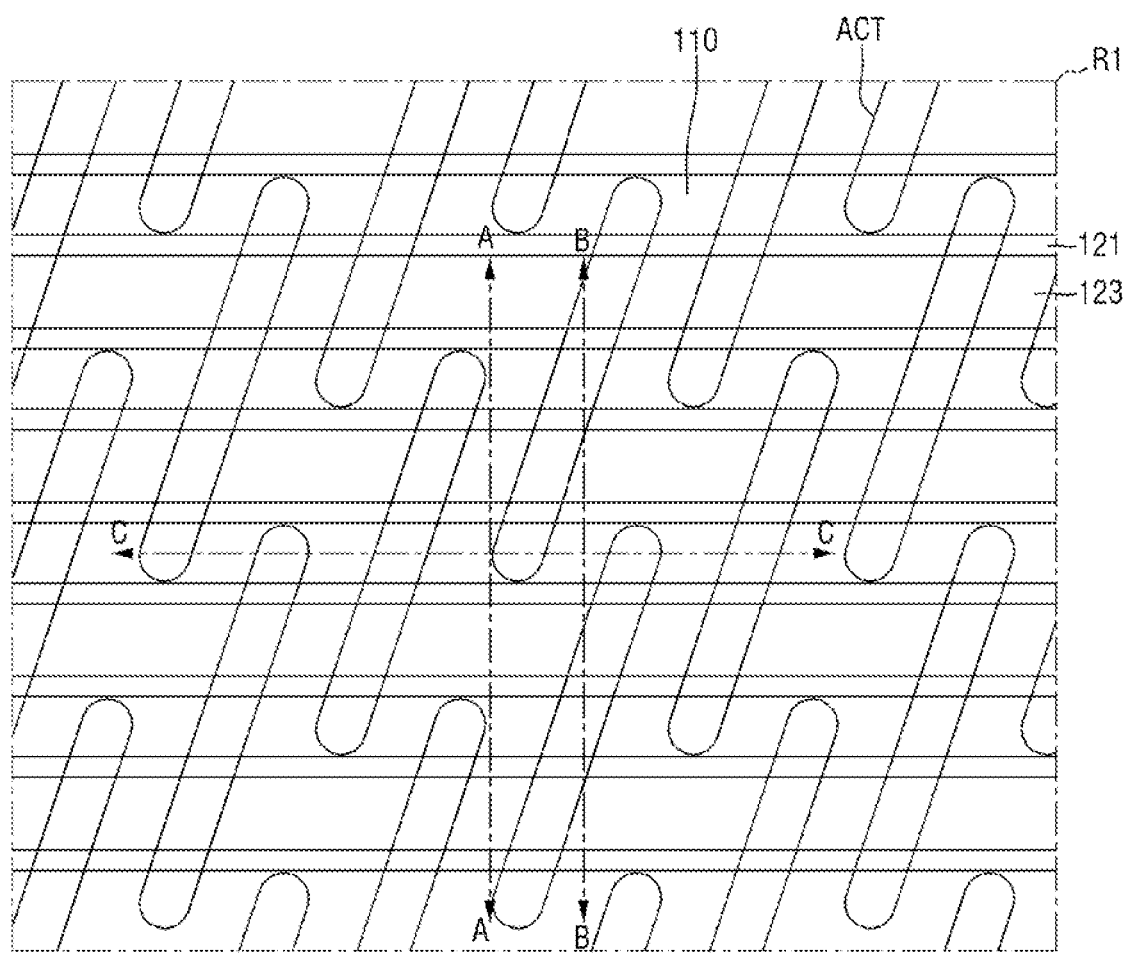
FIGS. 7 to 29C are views illustrating intermediate steps to describe a method of manufacturing a semiconductor device according to embodiments of the present disclosure.
Figure 7:
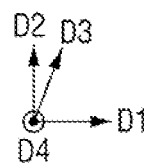
Figure 8A:
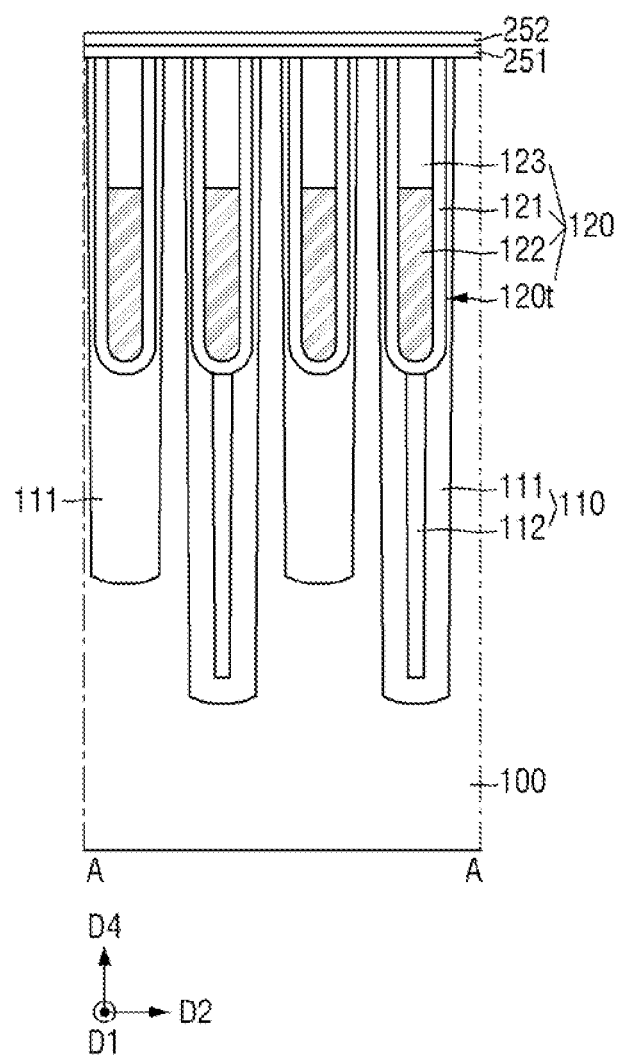
Figure 8B:
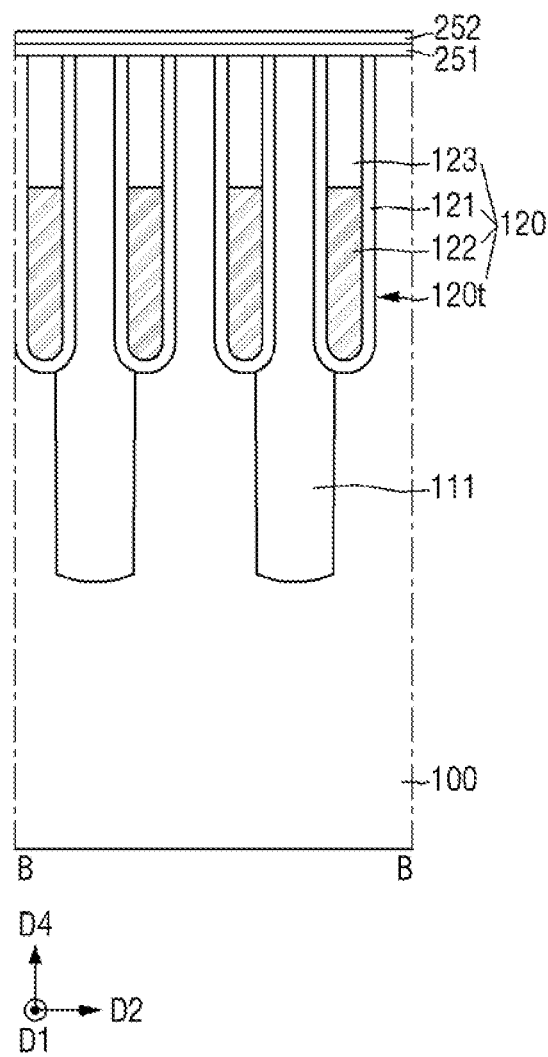
Figure 8C:
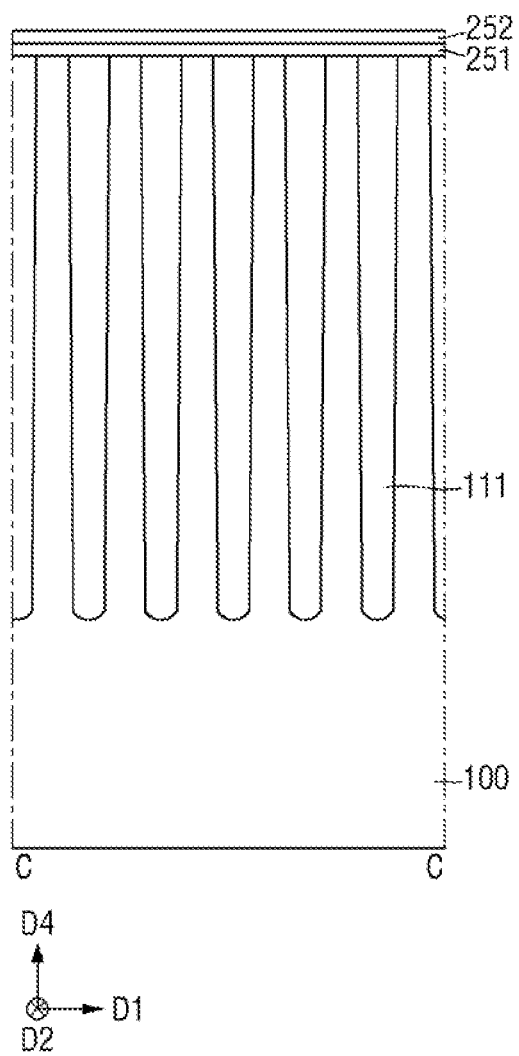
Figure 8D:
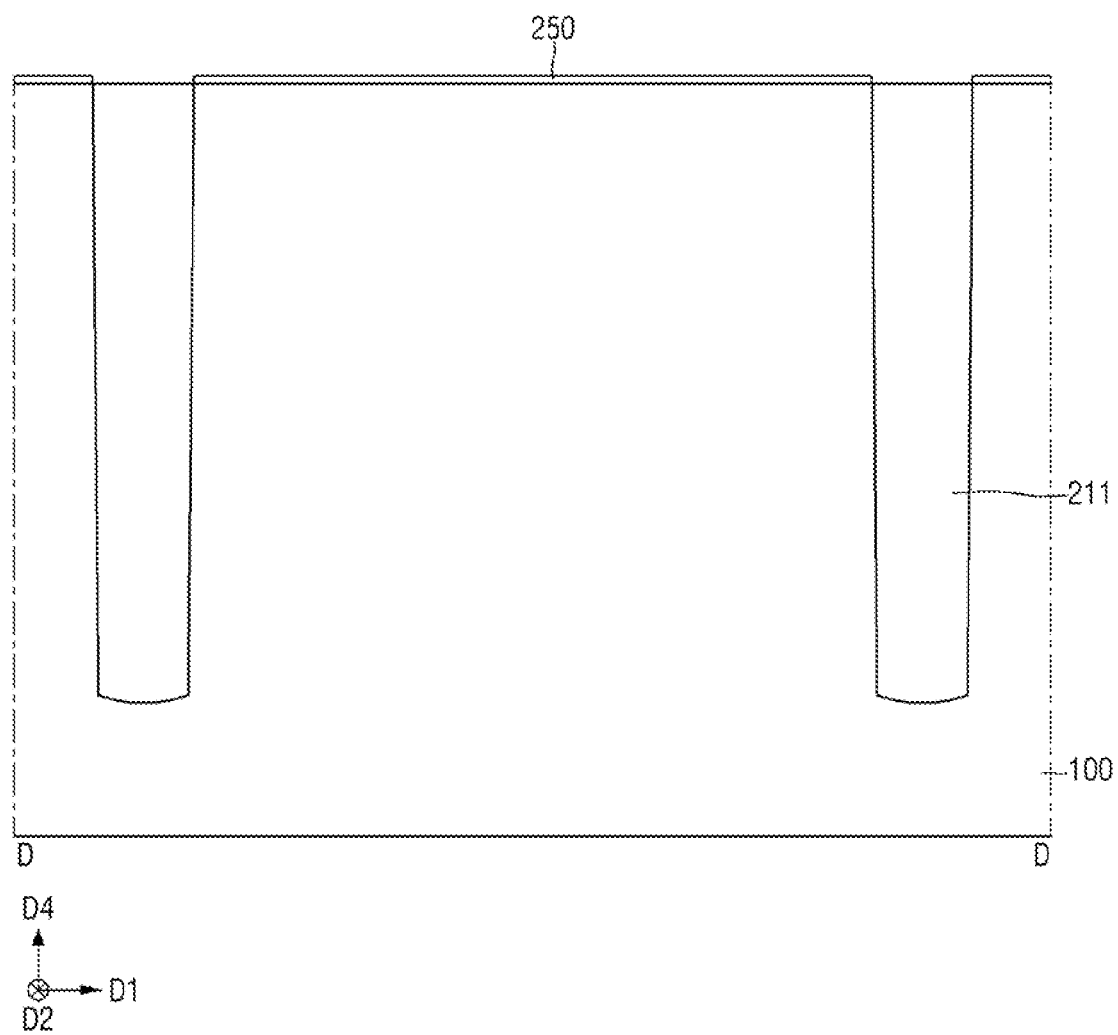
Figure 9A:
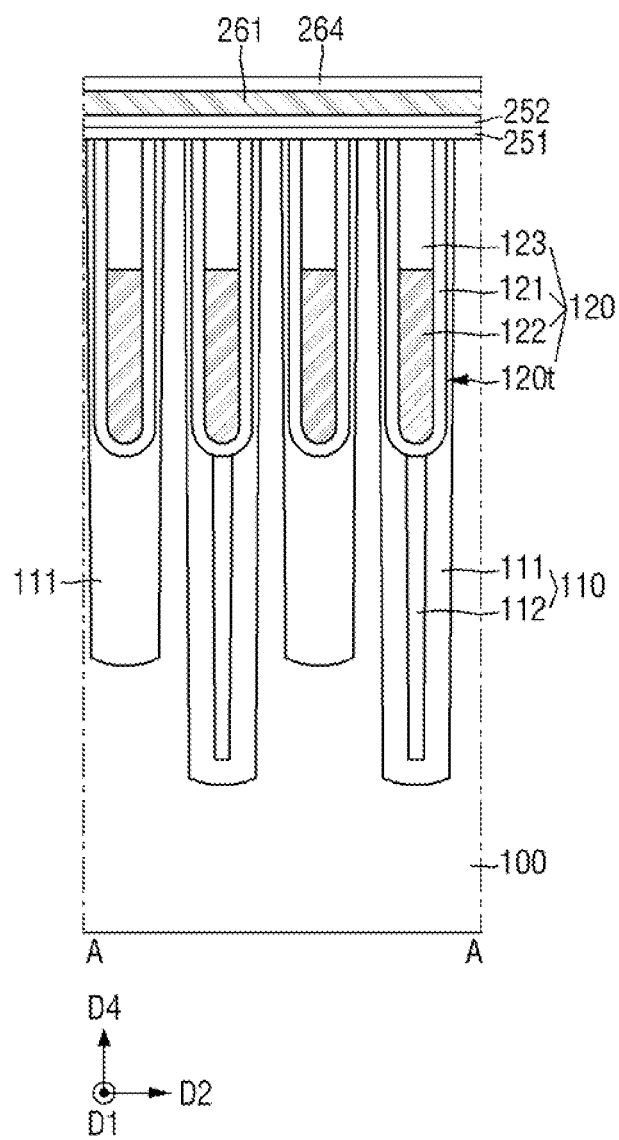
Figure 9B:
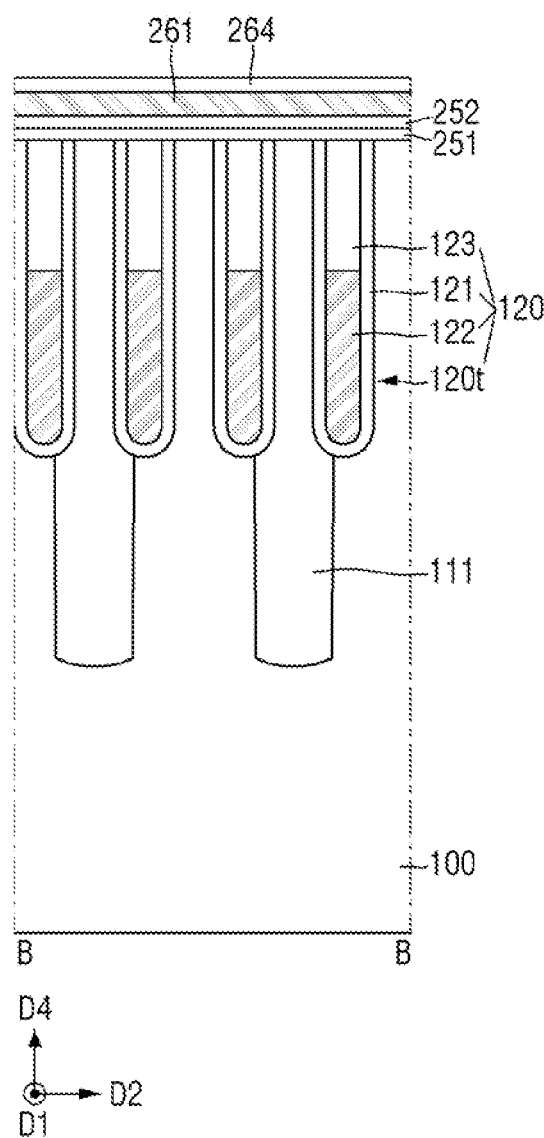
Figure 9C:
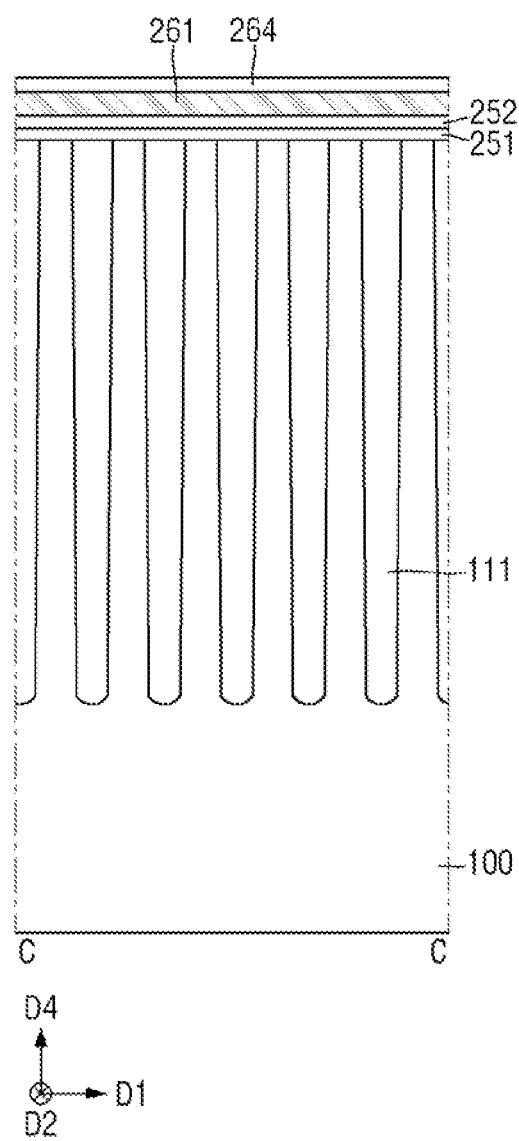
Figure 9D:
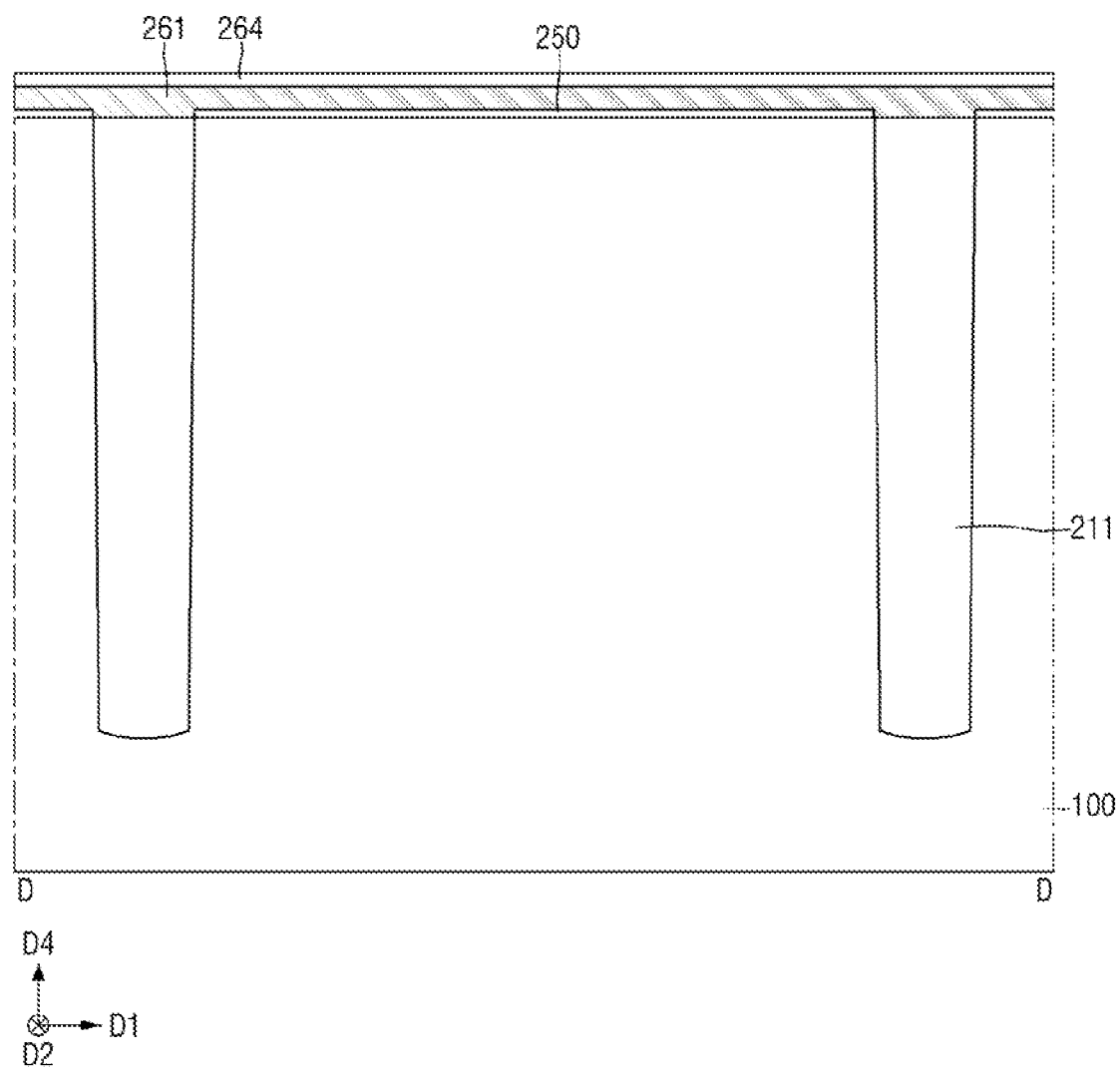
Figure 10A:
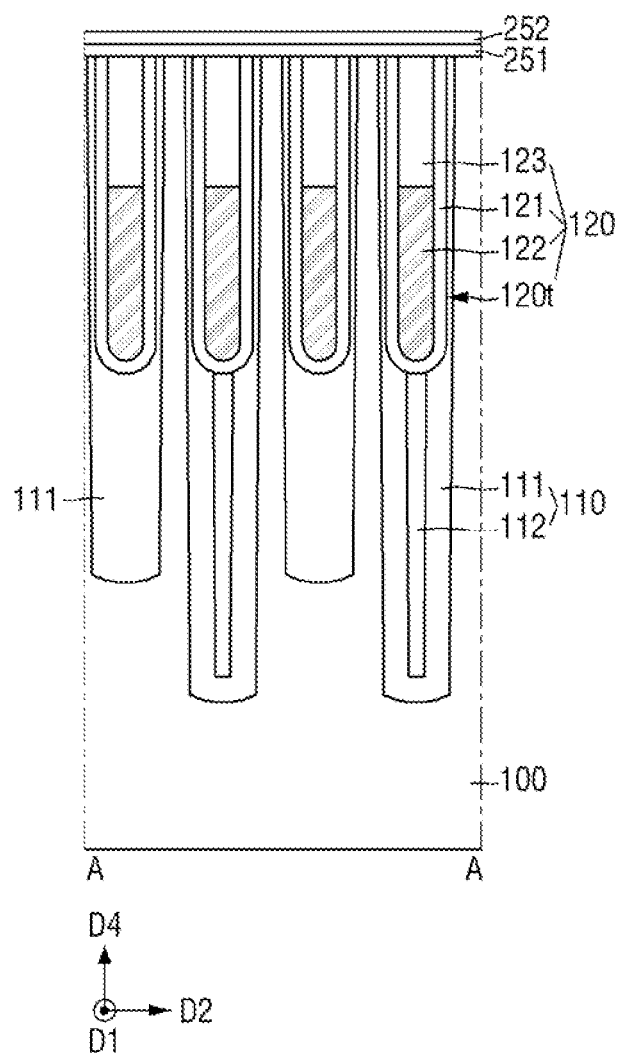
Figure 10B:
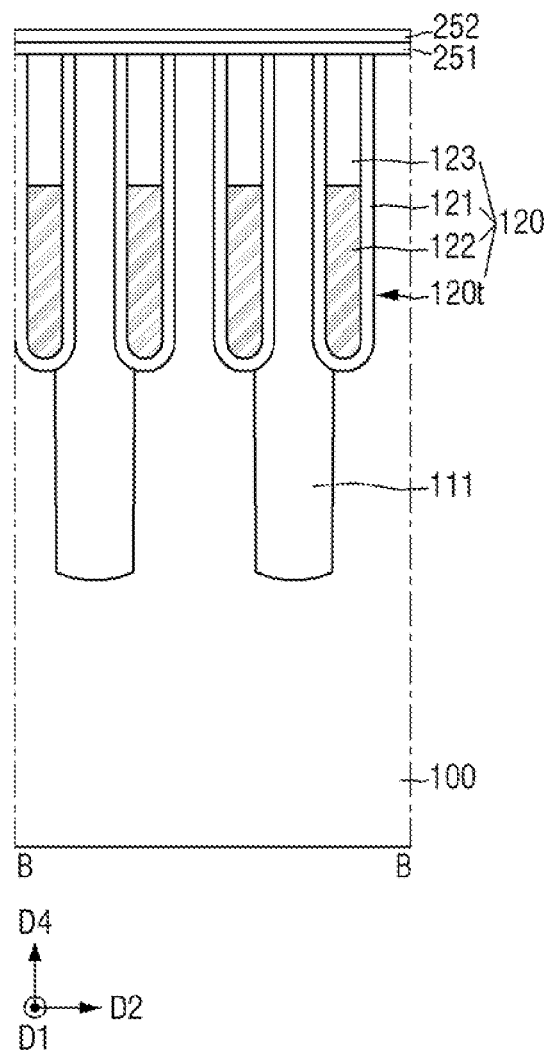
Figure 10C:
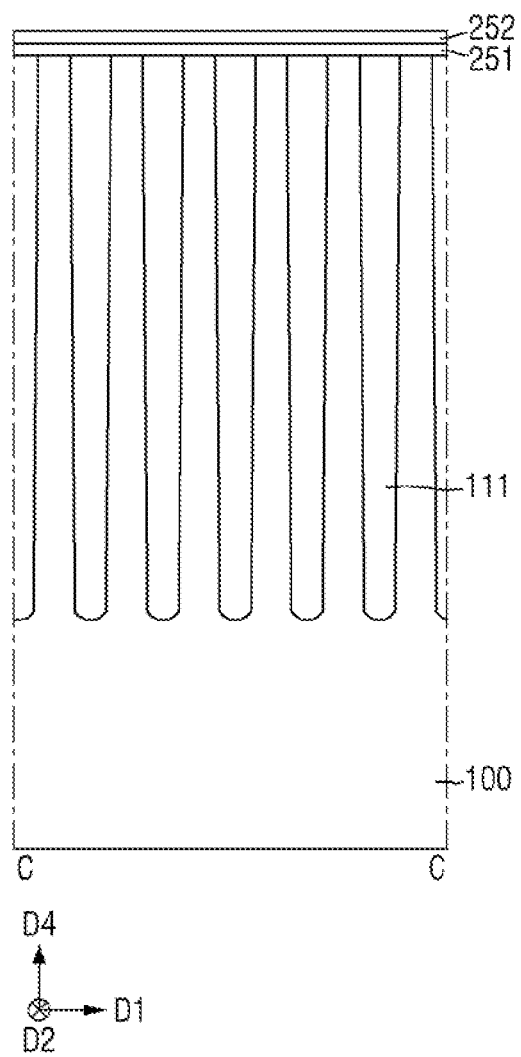
Figure 10D:
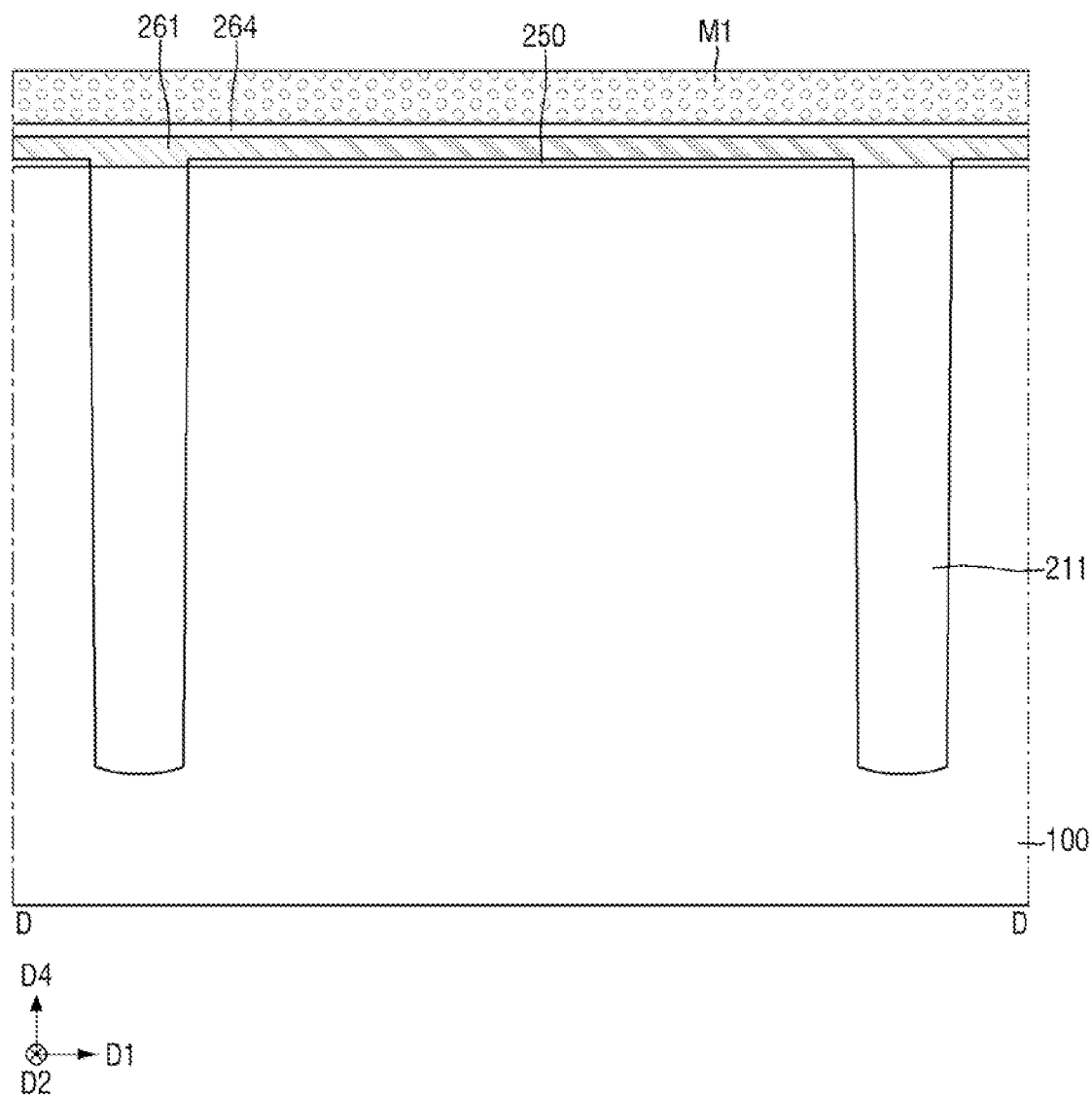
Figure 11A:
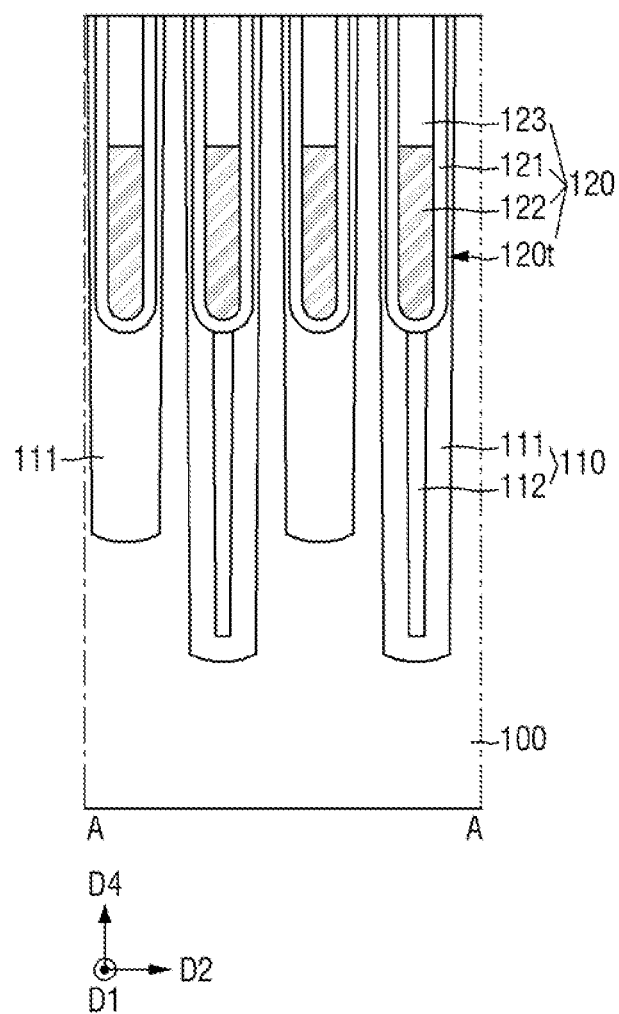
Figure 11B:
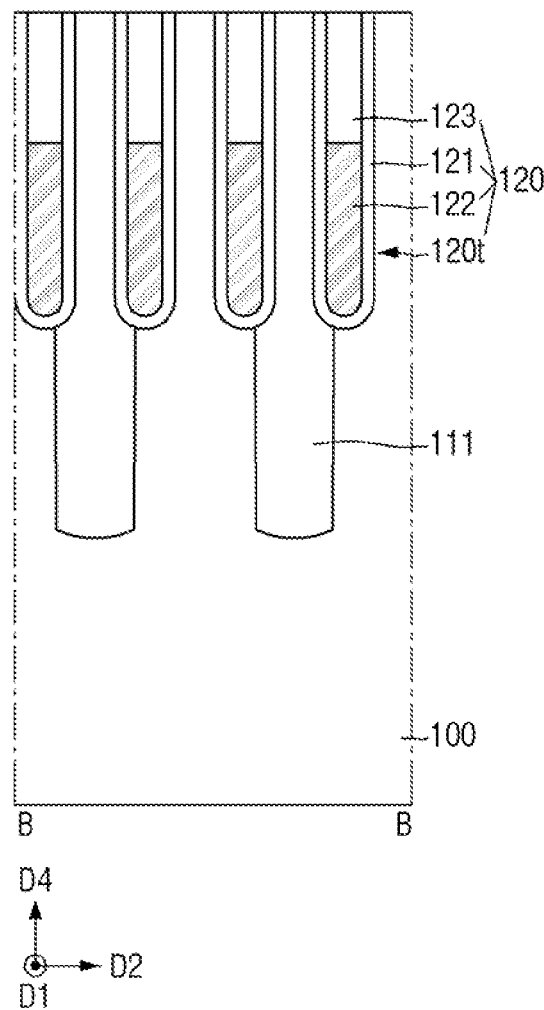
Figure 11C:
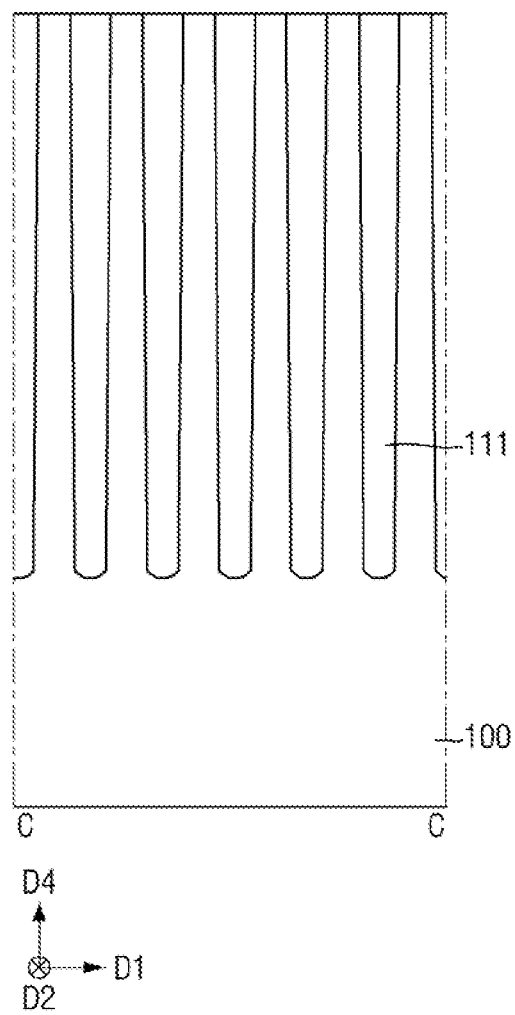
Figure 11D:
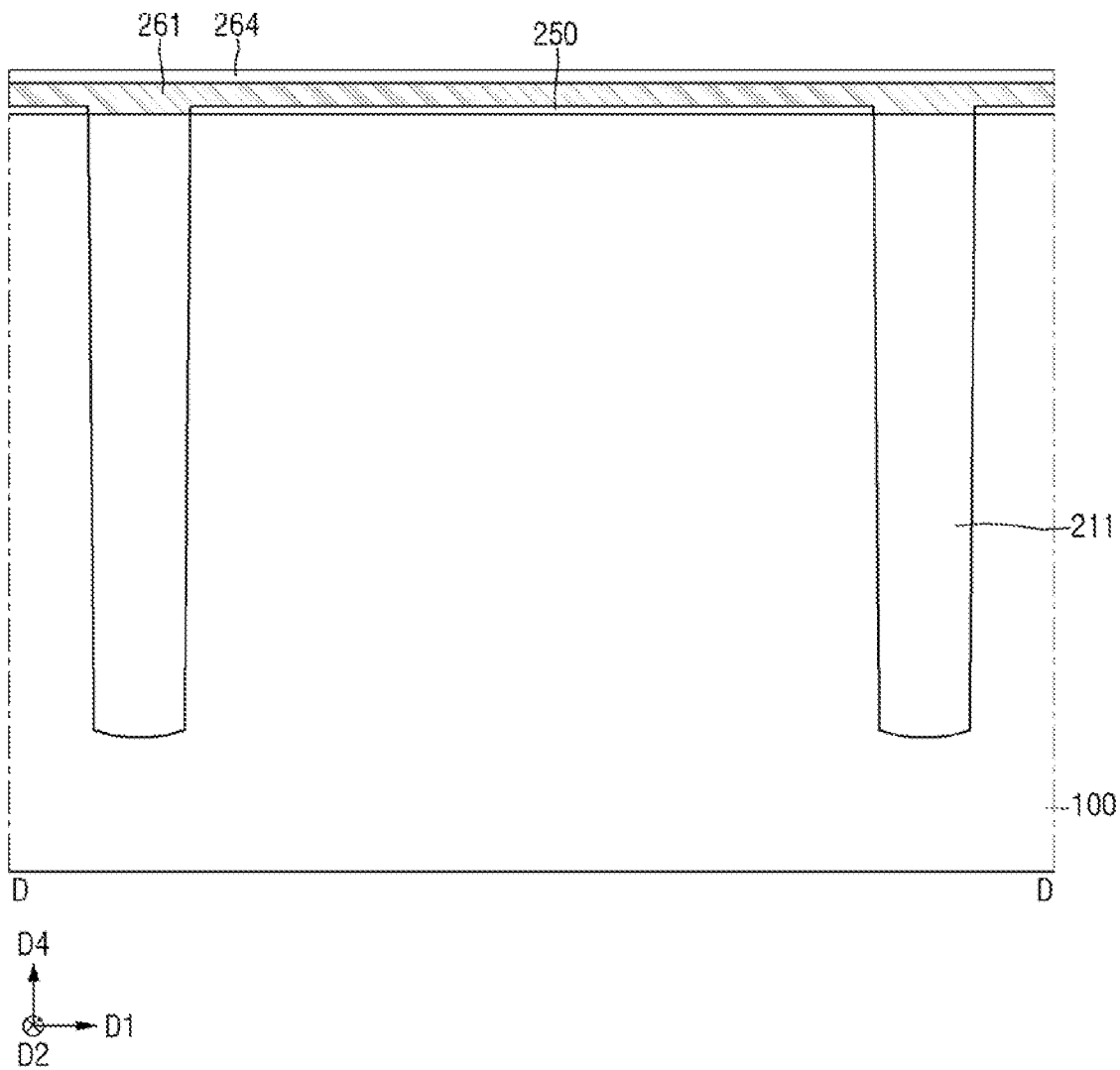
Figure 12:
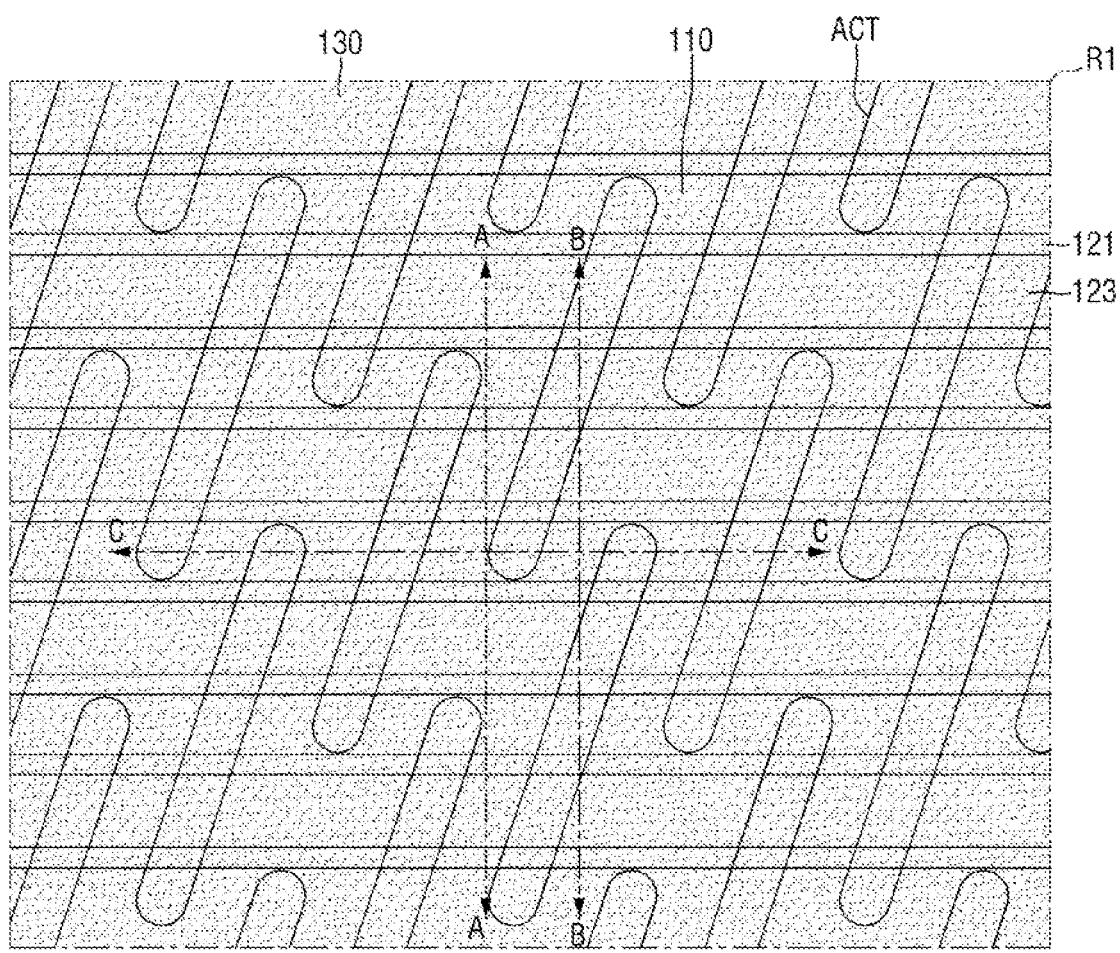
Figure 12:
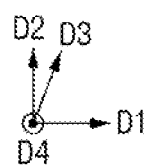
Figure 13B:
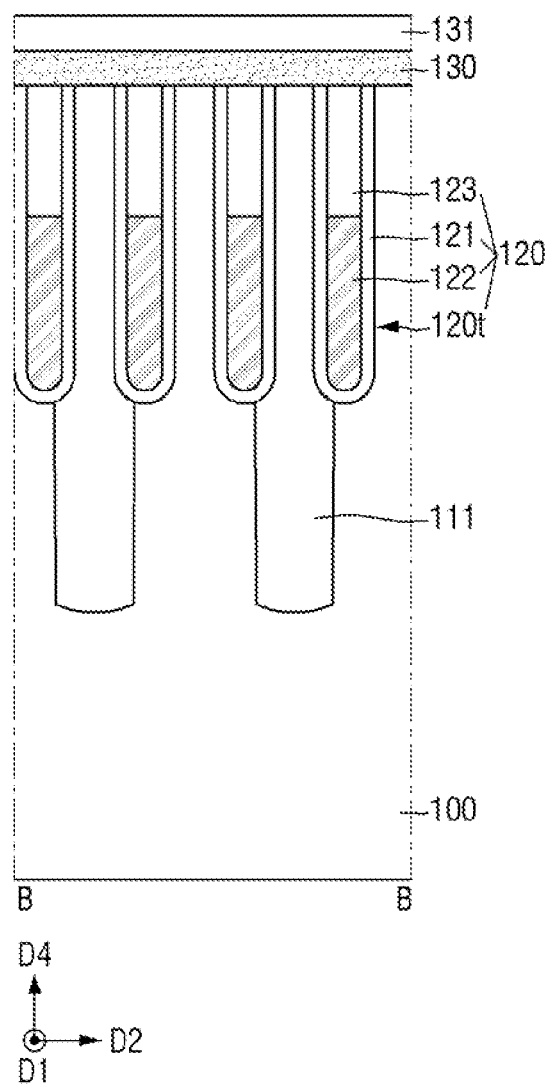
Figure 13C:
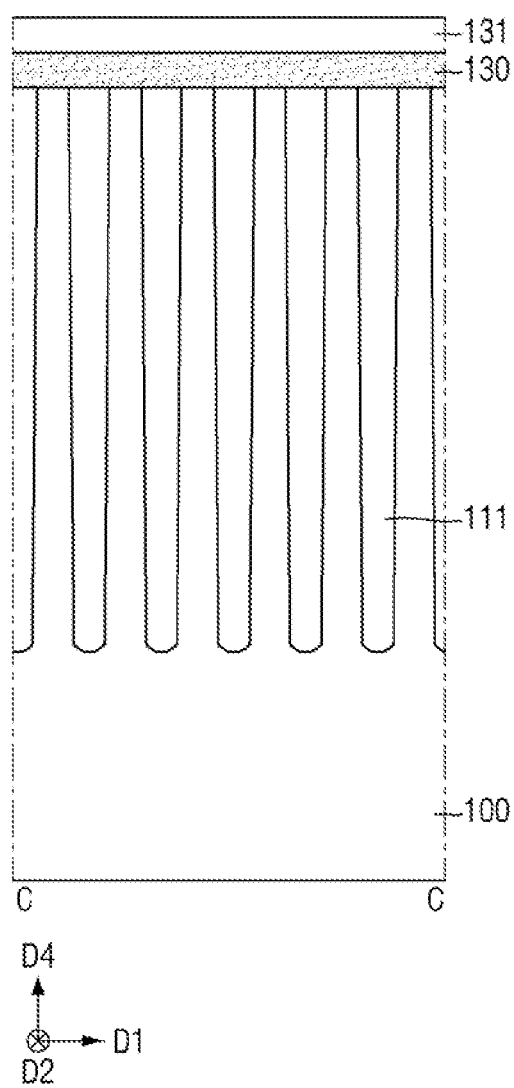
Figure 13D:
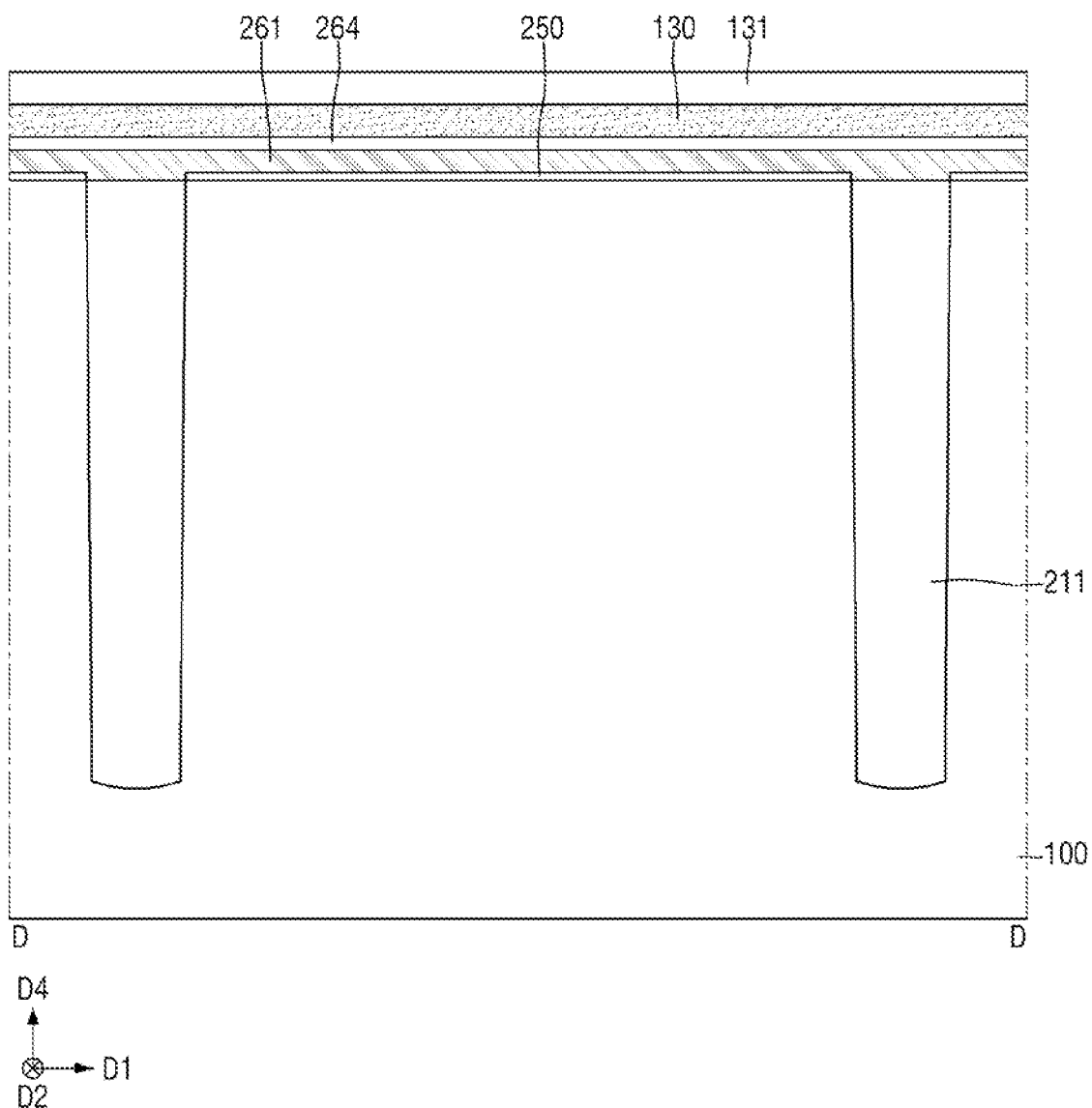
Figure 14:
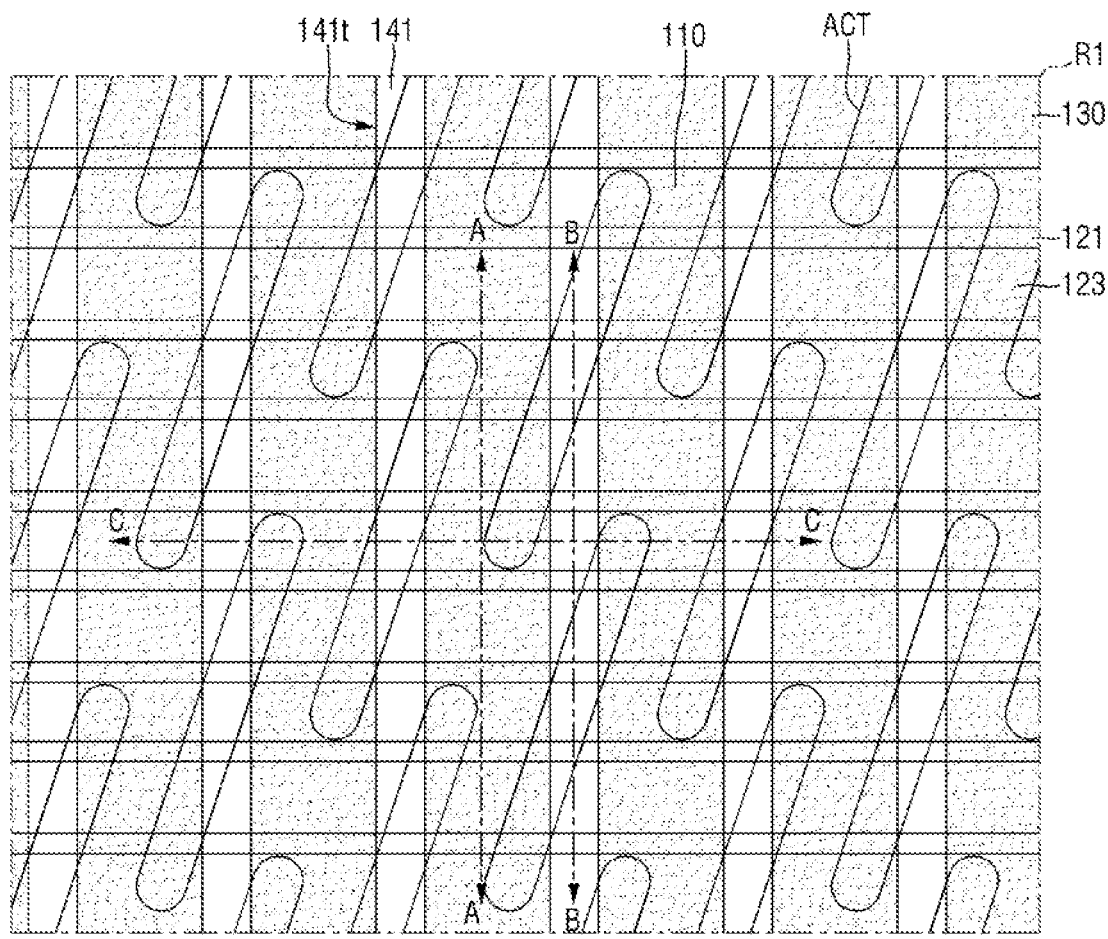
Figure 14:
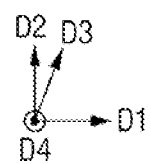
Figure 15A:
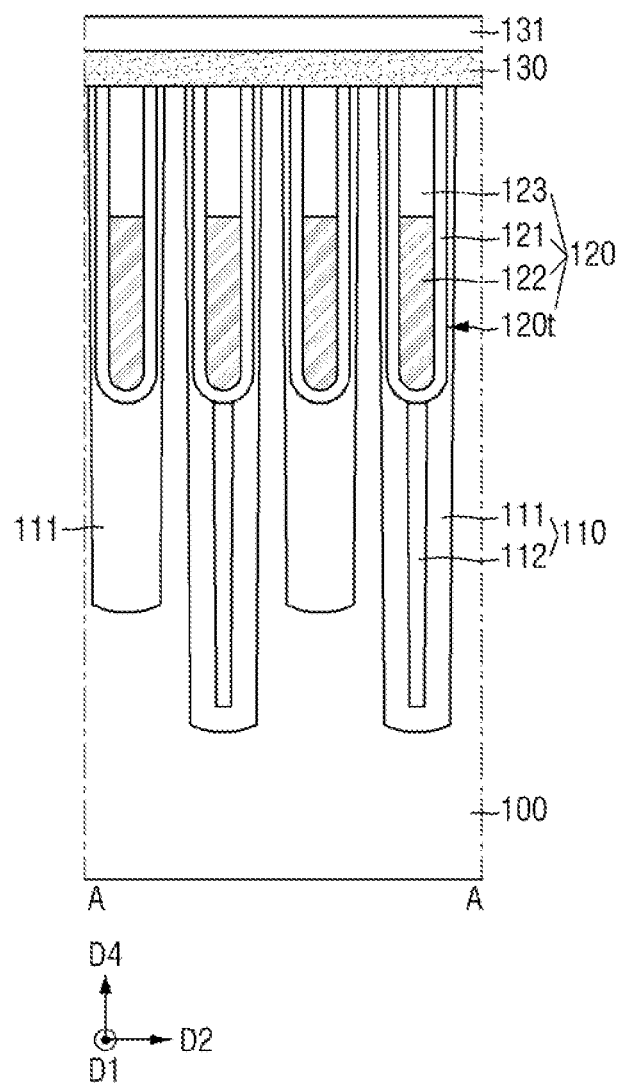
Figure 15B:
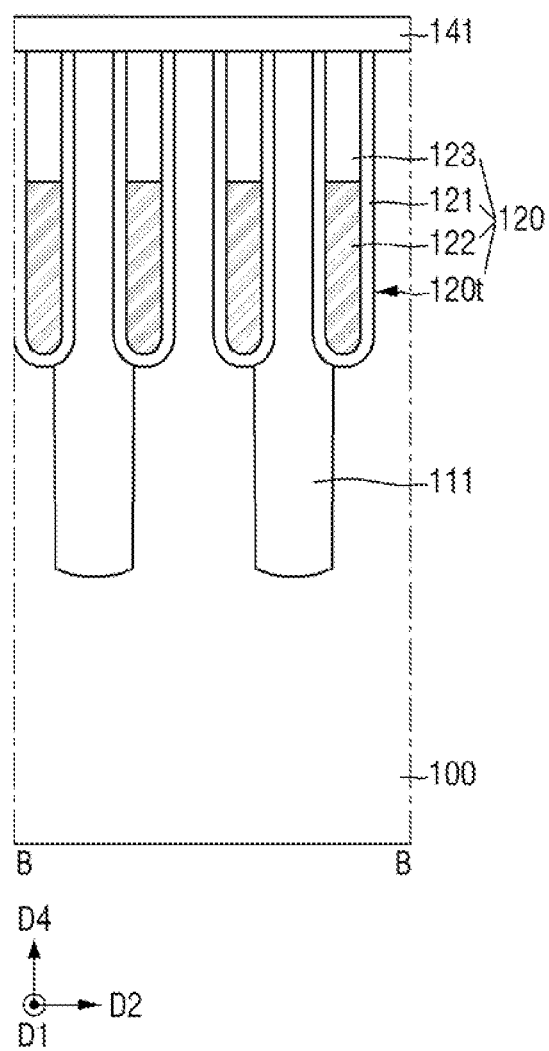
Figure 15C:
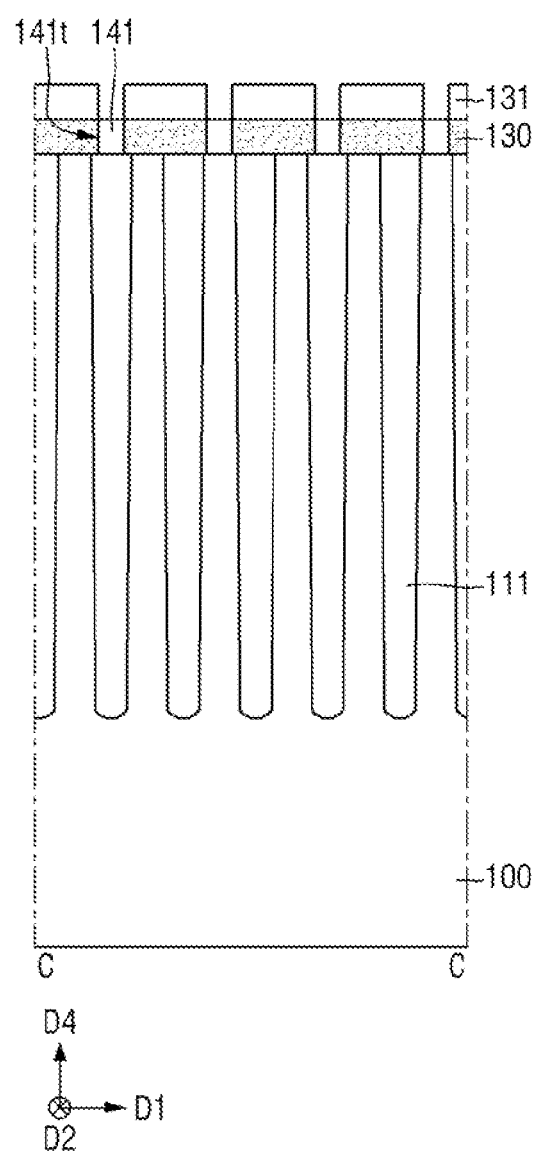

FIG. 1 is a schematic layout view illustrating a semiconductor memory device according to some embodiments of the present disclosure. FIG. 2 is a schematic layout illustrating an area R1 of FIG. 1. FIG. 3A is a cross-sectional view taken along line A-A of FIG. 2. FIG. 3B is a cross-sectional view taken along line B-B of FIG. 2. FIG. 3C is a cross-sectional view taken along line C-C of FIG. 2. FIG. 3D is a cross-sectional view taken along line D-D of FIG. 1. FIG. 4 is an enlarged view illustrating an area R2 of FIG. 3C. FIGS. 5 and 6 are enlarged views illustrating an area R3 of FIG. 3D.

Although a dynamic random access memory (DRAM) is shown in the drawing related to a semiconductor memory device according to some embodiments by way of example, the present disclosure is not necessarily limited thereto.

Referring to FIGS. 1 to 3, a semiconductor device according to some embodiments may include a cell area 20, a cell boundary area 22 and a peripheral area 24.

The cell boundary area 22 may be formed along the periphery of the cell area 20 (e.g., in the first and second directions D1, D2). The cell boundary area 22 may separate the cell area 20 from the peripheral area 24.

The cell area 20 may include a plurality of cell active areas ACT. The cell active area ACT may be defined by a device isolation layer (110 of FIG. 4) formed in a substrate (100 of FIG. 4). In an embodiment, with the reduction in the design rule of the semiconductor device, the cell active area ACT may be disposed in the form of a diagonal line or oblique line. For example, the cell active area ACT may be extended in a third direction D3 that extends between the first and second directions D1, D2.

A plurality of gate electrodes may be disposed in the first direction D1 across the cell active area ACT. The plurality of gate electrodes may be extended in the first direction D1 to be parallel with each other. In an embodiment, the plurality of gate electrodes may be, for example, a plurality of word lines WL. The word lines WL may be disposed at constant intervals (e.g., in the second direction D2). A width of the word line WL or a distance between the word lines WL may be determined in accordance with the design rule.

In an embodiment, each of the cell active areas ACT may be divided into three portions by two word lines WL extended in the first direction D1. The cell active area ACT may include a storage connection area and a bit line connection area. In an embodiment, the bit line connection area may be positioned at a middle portion of the cell active area ACT, and the storage connection area may be positioned at an end portion of the cell active area ACT.

A plurality of bit lines BL extended in a second direction D2 perpendicular to the word line WL may be disposed on the word lines WL. The plurality of bit lines BL may be extended to be parallel with each other. The bit lines BL may be disposed at constant intervals (e.g., in the first direction D1). A width of the bit line BL or a distance between the bit lines BL may be determined in accordance with the design rule.

The semiconductor device according to some embodiments may include various contact arrangements formed on the cell active area ACT. Various contact arrangements may include, for example, a direct contact DC, a buried contact BC and a landing pad LP.

In an embodiment, the direct contact DC may refer to a contact for electrically connecting the cell active area ACT to the bit line BL. The buried contact BC may refer to a contact for connecting the cell active area ACT to a lower electrode 191 of a capacitor in the layout structure, a contact area of the buried contact BC and the cell active area ACT may be relatively small. Therefore, a conductive landing pad LP may be introduced to enlarge the contact area with the lower electrode 191 of the capacitor together with enlarging the contact area with the cell active area ACT.

The landing pad LP may be disposed between the cell active area ACT and the buried contact BC, and may be disposed between the buried contact BC and the lower electrode of the capacitor. In the semiconductor device according to some embodiments, the landing pad LP may be disposed between the buried contact BC and the lower electrode of the capacitor. By enlarging the contact area through the introduction of the landing pad LP, the contact resistance between the cell active area ACT and the lower electrode of the capacitor may be reduced.

The direct contact DC may be connected to the middle portion of the cell active area ACT. The buried contact BC may be connected to the end portion of the cell active area ACT. As the buried contact BC is disposed at both ends of the cell active area ACT, the landing pad LP may be disposed to be adjacent to both ends of the cell active area ACT and to partially overlap the buried contact BC. For example, the buried contact BC may be formed to overlap the cell active area ACT and the device isolation layer 110 between adjacent word lines WL and between adjacent bit lines BL.

The word line WL may be formed in a structure buried in the substrate 100. The word line may be disposed across the cell active area ACT between the direct contacts DC or the buried contacts BC. In an embodiment, two word lines WL may be disposed across one cell active area ACT. As the cell active area ACT is extended along the third direction D3, the word line WL may have an angle less than 90° with respect to the cell active area ACT.

The direct contact DC and the buried contact BC may be symmetrically disposed. For example, the direct contact DC and the buried contact BC may be disposed on a straight line along the first direction D1 and the second direction D2. Unlike the direct contact DC and the buried contact BC, the landing pad LP may be disposed in a zigzag pattern in the second direction D2 in which the bit line BL is extended. In addition, the landing pad LP may be disposed to overlap the same side portion of the respective bit lines BL in the first direction D1 in which the word line WL is extended. For example, each landing pad LP of a first line may overlap a left side of the corresponding bit line BL, and each landing pad LP of a second line may overlap a right side of the corresponding bit line BL.

An upper portion 144 of a first buffer pattern 140, which will be described later, may be disposed on the bit line BL between the end portions of the cell active area ACT, which are adjacent to each other in the first direction D1. The upper portion 144 may be disposed in a straight line along the first direction D1 and the second direction D2. The upper portion 144 may have a circular shape on a plane including, for example, the first direction D1 and the second direction D2, as shown in an embodiment of FIG. 2.

Referring to FIGS. 2 and 3A-3D, the semiconductor device according to some embodiments may include a gate structure 120, a bit line structure 160, a first buffer pattern 140, a second buffer pattern 145, a buried contact 150, a landing pad 180 and a capacitor structure 190.

In an embodiment, the substrate 100 may be bulk silicon or silicon-on-insulator (SOI). Alternatively, the substrate 100 may be a silicon substrate, or may include other materials such as silicon germanium, silicon germanium on insulator (SGOI), indium antimonide, lead telluride compound, indium arsenide, indium phosphide, gallium arsenide or gallium antimonide. However, embodiments of the present disclosure are not necessarily limited thereto. The following description will be based on that the substrate 100 is a silicon substrate for convenience of explanation.

The device isolation layer 110 may be formed in the substrate 100. The device isolation layer 110 may have a shallow trench isolation (STI) structure having excellent device isolation characteristics. The device isolation layer 110 may define the cell active area ACT in the substrate 100 of the cell area 20. In an embodiment, the cell active area ACT defined by the device isolation layer 110 may have a long island shape including a short axis and a long axis as shown in FIG. 1. The cell active area ACT may have an oblique shape so as to have an angle less than 90° with respect to the word line formed in the device isolation layer 110. In addition, the cell active area ACT may have an oblique shape so as to have an angle less than 90° with respect to the bit line BL formed on the device isolation layer 110.

In an embodiment, the device isolation layer 110 may include, but is not necessarily limited to, at least one of a silicon oxide layer, a silicon nitride layer or a silicon oxynitride layer. For example, the device isolation layer 110 may include a first insulating layer 111 or may include a first insulating layer 111 and a second insulating layer 112, depending on a width in the first direction D1. In an embodiment, the first insulating layer 111 may include an oxide layer and the second insulating layer 112 may include a nitride layer. However, embodiments of the present disclosure are not necessarily limited thereto.

Although an upper surface of the device isolation layer 110 and an upper surface of the substrate 100 are shown as being positioned on the same plane (e.g., in the fourth direction D4), it is only for convenience of description, and embodiments of the present disclosure are not necessarily limited thereto.

The gate structure 120 may be formed in the substrate 100 and the device isolation layer 110. The gate structure 120 may be formed across the device isolation layer 110 and the cell active area ACT defined by the device isolation layer 110. One gate structure 120 may be formed in the substrate 100 and the device isolation layer 110, which are positioned in the first direction D1 in which the gate structure 120 is extended. In an embodiment, the gate structure 120 may include a gate trench 120t, a gate insulating layer 121, a gate electrode 122 and a gate capping pattern 123, which are formed in the substrate 100 and the device isolation layer 110. In this embodiment, the gate electrode 122 may correspond to the word line WL.

The gate insulating layer 121 may be extended along a sidewall and a bottom surface of the gate trench 120t. The gate insulating layer 121 may be extended along a profile of at least a portion of the gate trench 120t. In an embodiment, the gate insulating layer 121 may include at least one compound selected from silicon oxide, silicon nitride, silicon oxynitride, and a high dielectric constant material having a dielectric constant greater than that of silicon oxide. In an embodiment, the high dielectric constant material may include, but is not limited to, at least one compound selected from hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

The gate electrode 122 may be formed on the gate insulating layer 121. The gate electrode 122 may fill a portion of the gate trench 120t.

In an embodiment, the gate electrode 122 may include at least one compound selected from, for example, polysilicon, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), (Ir), osmium (Os), silver (Ag), gold (Au), zinc (Zn) and vanadium (V), and combinations thereof.

The gate capping pattern 123 may be formed on the gate electrode 122 (e.g., directly thereon in the fourth direction D4). The gate capping pattern 123 may fill the remaining gate trench 120t on which the gate electrode 122 is formed. The gate insulating layer 121 is shown as being extended along a sidewall of the gate capping pattern 123. However, embodiments of the present disclosure are not necessarily limited thereto.

In an embodiment, the gate capping pattern 123 may include at least one compound selected from, for example, silicon nitride (SiN), silicon oxynitride (SiON), silicon oxide (SiO$_2$), silicon carbonitride (SiCN), silicon oxycarbonitide (SiOCN), and combinations thereof.

The lowermost position of the gate structure 120 formed in the substrate 100 may be different from the lowermost position of the gate structure 120 formed in the device isolation layer 110. In the process of forming the gate trench 120t, an etch rate of the substrate 100 and an etch rate of the device isolation layer 110 are different from each other, whereby the lowermost position of the gate structure 120 formed in the substrate 100 may be different from the lowermost position of the gate structure 120 formed in the device isolation layer 110. In an embodiment, an impurity doping area may be formed on at least one side of the gate structure 120. The impurity doping area may be a source/drain area of a transistor.

Referring to an embodiment of FIG. 4, the bit line structure 160 may be formed on the substrate 100 and the device isolation layer 110, in which the gate structure 120 is formed. The bit line structure 160 may cross the device isolation layer 110 and the cell active area ACT defined by the device isolation layer 110. The bit line structure 160 may include a bit line contact portion 160_1 and a bit line pass portion 160_2.

The bit line contact, portion 160_1 may be a portion electrically connected to the cell active area ACT. For example, the hit line structure 160 may be connected to the cell active area ACT in the bit line contact portion 160_1. The bit line contact portion 160_1 may be connected to the middle portion of the cell active area ACT. The bit line contact portion 160_1 may be a portion where a direct contact DC is positioned. A portion of the hit line contact portion 160_1 may correspond to a direct contact DC.

The bit line contact portion 160_1 may be recessed into the substrate 100. A lowest surface of the bit line structure 160, such as a bottom surface 160_1_bs of the bit line contact portion 160_1 may be disposed below an uppermost surface 110_us of the substrate 100.

The bit line pass portion 160_2 is electrically connected to the cell active area ACT through the bit line contact portion 160_1. The bit line pass portion 160_2 may be disposed between the bit line contact portions 160_1 adjacent to each other in the second direction D2, The hit line pass portion 160_2 may be positioned on the device isolation layer 110 between the buried contacts BC adjacent to each other in the first direction D1.

The bit line structure 160 may include a bit line stack 161, a hit line capping pattern 162 and a bit line spacer 165. The bit line stack 161 may fill at least a portion of a bit line trench defined by the bit line spacer 165. In an embodiment, as shown in FIG. 4, the bit line stack 161 may include, for example, a first conductive layer 161a, a second conductive layer 161b and a third conductive layer 161c. However, embodiments of the present disclosure are not necessarily limited thereto and the number of conductive layers of the bit line stack 161 may vary. The first to third conductive layers 161a, 161b, 161c may be sequentially stacked on the substrate 100 and the device isolation layer 110 (e.g., in the fourth direction D4). In an embodiment, each of the first to third conductive layers 161a, 161b and 161c may include at least one compound selected from, for example, a semiconductor material doped with impurities, a conductive silicide compound, a conductive metal nitride or a metal. For example, the first conductive layer 161a may include a doped semiconductor material pattern, the second conductive layer 161b may include a conductive silicide pattern and the third conductive layer 161c may include a metallic conductive layer pattern. However, embodiments of the present disclosure are not necessarily limited thereto. The metallic conductive layer pattern may include at least one material selected from a conductive metal nitride and a metal. However, embodiments of the present disclosure are not necessarily limited thereto.

Although the third conductive layer 161c is shown as a single layer, it is only for convenience of description, and the third conductive layer 161c may be comprised of two or more layers. The third conductive layer 161c may include a barrier conductive layer and a filling conductive layer for filling a barrier recess defined by the barrier conductive layer. The barrier conductive layer may be extended along a portion of a bottom surface and a sidewall of the filling conductive layer.

In the bit line contact portion 160_1, a portion of the first conductive layer 161a may correspond to the direct contact DC. The first conductive layer 161a may electrically connect the bit line stack 161 with the cell active area ACT.

The bit line capping pattern 162 may be disposed on the bit line stack 161 (e.g., directly thereon in the fourth direction D4). The bit line capping pattern 162 may fill the remainder of the bit line trench not filled by the bit line stack 161. In an embodiment, the bit line capping pattern 162 may include at least one compound selected from, for example, silicon oxide, silicon oxycarbide (SiOC), silicon nitride (SiN), silicon oxynitride (SiON), and silicon oxycarbonitride (SiOCN).

The first buffer pattern 140 may be disposed on the substrate 100. The first buffer pattern 140 may include lower portions 141 and 142, and an upper portion 144 on the lower portions 141 and 142. The lower portions 141 and 142 may include a first buffer layer and a second buffer layer, respectively, and may be referred to as a first buffer layer and a second buffer layer, respectively.

The first buffer layer 141 may be disposed between the substrate 100 and the bit line structure 160 (e.g., in the fourth direction D4). The first buffer layer 141 may be extended along the second direction D2 on the substrate 100. The second buffer layer 142 may cross the first buffer layer 141. The second buffer layer 142 may be disposed on the gate structure 120. The second buffer layer 142 may be extended along the first direction D1 on the gate structure 120. Referring to an embodiment of FIG. 3A, the lower portion 142 disposed on the substrate 100 overlapped with the gate structure 120 may include a second buffer layer 142. Referring to an embodiment of FIG. 3B, the lower portions 141 and 142 including the first buffer layer and the second buffer layer may be disposed on the substrate 100 in which the bit line contact portion 160_1 and the gate structure 120 overlap each other. Referring to an embodiment of FIG. 3C, the lower portion 141 disposed between the bit line contact portion 160_1 and the substrate 100 may include a first buffer layer.

The upper portion 144 may be disposed on the lower portions 141 and 142, and may include and may be referred to as a third buffer layer. The upper portion 144 may be disposed on the lower portion 141 including the first buffer layer and the lower portions 141 and 142 including the first buffer layer and the second buffer layer. The upper portion 144 may be disposed between the lower portion 141 and the bit line structure 160 and between the lower portions 141 and 142 and the bit line structure 160.

In an embodiment, the first buffer pattern 140 may have a T-shaped cross-section (e.g., in a plane defined in the first and fourth directions D1, D4). For example, the first buffer pattern 140 may have a T-shape in the cross-sectional view (FIG. 3C) taken along the first direction D1 between the adjacent word lines WL. A width W1 of the first buffer layer 141 in the first direction D1 may be less than a width W2 of the upper portion 144 in the first direction D1, At least a portion of the upper portion 144 may be protruded from one sidewall of the first buffer layer 141 in the first direction D1.

For example, the middle portion of the upper portion 144 in the first direction D1 may be disposed directly on the first buffer layer 141. For example, in the first direction D1, a length of the upper portion 144 protruded from one sidewall of the first buffer layer 141 may be the same as a length of the upper portion 144 protruded from the opposite sidewall of the first buffer layer 141. However, embodiments of the present disclosure are not necessarily limited thereto. For example, in an embodiment, in the first direction D1, the length of the upper portion 144 protruded from one sidewall of the first buffer layer 141 may be different from the length of the upper portion 144 protruded from the opposite sidewall of the first buffer layer 141.

The bit line structure 160 may be electrically connected to the cell active area by passing through the first buffer pattern 140. The bit line contact portion 160_1 may be in contact with the cell active area by passing through the first buffer pattern 140.

The bit line pass portion 160_2 may be disposed on the first buffer pattern 140 (e.g., disposed directly thereon). For example, a width W3 of the trench, in which the bit line structure 160 and the bit line spacer 165 are disposed, in the first direction D1 may be less than the width W2 of the upper portion 144 in the first direction D1.

As shown in an embodiment of FIG. 3B, the first buffer pattern 140 may have a rectangular shape in the cross-sectional view in which the bit line BL is cut in the second direction D2 (e.g., in a plane defined in the second and fourth directions D2, D4). in an embodiment, the width of the first buffer layer 141 in the second direction D2 may be substantially the same as the width of the tipper portion 144 in the second direction D2.

The second buffer layer 142 may be disposed on the gate structure 120. The second buffer layer 142 may be disposed on the gate capping pattern 123 (e.g., directly thereon in the fourth direction D4). For example, the width of the second buffer layer 142 in the second direction D2 may be less than the width of the gate capping pattern 123 in the second direction D2.

In an embodiment, the lower portions 141 and 142 may include a material different from that of the upper portion 144. The first buffer layer 141 and the second buffer layer 142 may include the same material. For example, in an embodiment, the lower portions 141 and 142 may include silicon nitride, and the upper portion 144 may include silicon oxide.

The second buffer pattern 145 may be disposed on at least a portion of the first buffer pattern 140. The second buffer pattern 145 may be disposed on the first buffer pattern 140 that includes the upper portion 144. The second buffer pattern 145 may be disposed on a first portion of the first buffer pattern 140 that is not overlapped with the bit line structure 160 in a fourth direction D4. The second buffer pattern 145 may not be disposed on a second portion of the first buffer pattern 140 that is overlapped with the bit line structure 160 in the fourth direction D4. The second buffer pattern 145 may be disposed on an upper surface of the first buffer pattern 140 in which the bit line structure 160 is not disposed. The bit line structure 160 may be disposed on the first buffer pattern 140 by passing through the second buffer pattern 145. The second buffer pattern 145 may be disposed on a portion of a sidewall of the bit line structure 160 on the first buffer pattern 140 and may protrude from the sidewall of the bit line structure 160 (e.g., in the first direction D1).

The second buffer pattern 145 may include a material different from that of the upper portion 144. In an embodiment, the second buffer pattern 145 may include, for example, silicon nitride.

Although lower surfaces of the lower portions 141 and 142 and the uppermost surface 110_us of the substrate 100 are shown as being positioned on the same plane (e.g., in the fourth direction D4), it is only for convenience of description, and embodiments of the present disclosure are not necessarily limited thereto. The tower surfaces of the lower portions 141 and 142 may be disposed below the uppermost surface 110_us of the substrate 100.

The bit line spacer 165 may be disposed on a sidewall 160_s of the bit line structure 160. The bit line spacer 165 may be recessed into the substrate 100 in the hit line contact portion 160_1. The bit line spacer 165 may be disposed on the first buffer pattern 140 in the bit line pass portion 160_2. For example, a lower surface of the bit line spacer 165 may directly contact an upper surface of the upper portion 144 of the first buffer pattern 140. The bit line spacer 165 may be disposed on the first buffer pattern 140 by passing through the second buffer pattern 145.

In an embodiment, the bit line spacer 165 may be a single layer. However, embodiments of the present disclosure are not necessarily limited thereto and the bit line spacer 165 may be a multi-layer. For example, the bit line spacer 165 may include one layer selected from a silicon oxide layer, a silicon nitride layer, a silicon oxynitride layer (SiON), a silicon oxycarbonitride layer (SiOCN), an air layer or combinations thereof.

Fence patterns 170 may be formed on the substrate 100 and the device isolation layer 110. The fence pattern 170 may be formed to overlap (e.g., in the fourth direction D4) the gate structure 120 formed in the substrate 100 and the device isolation layer 110. The second lower portion 142 may be disposed between the fence pattern 170 and the gate structure 120 (e.g., in the fourth direction D4). The fence pattern 170 may be extended to be relatively long along the first direction D1 on the second lower portion 142. The fence pattern 170 may be disposed between the bit line structures 160 extended in the second direction D2. The fence pattern 170 may separate adjacent buried contacts 150 from each other. A width of the fence pattern 170 in the first direction D1 may be greater than a width of the second lower portion 142 in the first direction D1.

In an embodiment, the fence pattern 170 may include at least one compound selected from, for example, silicon oxide, silicon nitride, silicon oxynitride and combinations thereof. Although the fence pattern 170 is shown as a single layer, it is only for convenience of description, and embodiments of the present disclosure are not necessarily limited thereto. For example, in an embodiment, the fence pattern 170 may be multi-layered.

Contact pads 130 may be formed between adjacent gate structures 120 and between adjacent bit line structures 160. The contact pad 130 may overlap the substrate 100 and the device isolation layer 110 between adjacent gate structures 120 and between adjacent bit line structures 160. The contact pad 130 may be electrically connected with the substrate 100. The contact pads 130 may be separated from each other by the first buffer pattern 140 and the fence pattern 170.

The contact pad 130 may be disposed on sidewalls of the lower portions 141 and 142, and the buried contact 150 may be disposed on a sidewall and upper surface of the upper portion 144. The contact pad 130 may overlap the lower surface of the upper portion 144 exposed by the first buffer layer 141. The upper surface of the contact pad 130 may directly contact a lower surface of the upper portion 144 of the first buffer pattern 140. An upper surface of the contact pad 130 may be disposed above an upper surface of the second buffer layer 142, for example.

The buried contacts 150 may be formed between adjacent gate structures 120 and between adjacent bit line structures 160. The buried contact 150 may overlap the substrate 100 and the device isolation layer 110 between the adjacent gate structures 120 and between the adjacent bit line structures 160. The buried contact 150 may be disposed on the contact pad 130. The buried contact 150 may be electrically connected to the cell active area through the contact pad 130. In this embodiment, the buried contact 150 may correspond to the buried contact BC of FIG. 2.

The buried contact 150 may include a portion extended along the sidewall of the bit line structure 160, a portion extended along a sidewall of the fence pattern 170 and a portion extended along a sidewall of the second buffer pattern 145. The bit line pass portion 160_2 may fill a trench having a sidewall defined by the contact pad 130, the buried contact 150 and the second buffer pattern 145. The bit line contact portion 160_1 may till a trench having a sidewall is defined by the contact pad 130 and the buried contact 150.

The contact pad 130 and the buried contact 150 may include the same material. In an embodiment, the contact pad 130 and the buried contact 150 may include at least one compound selected from, for example, a semiconductor material doped with impurities, a conductive silicide compound, a conductive metal nitride and a metal.

The landing pad 180 may be formed on the buried contact 150. The landing pad 180 may be electrically connected with the buried contact 150. In this embodiment, the landing pad 180 may correspond to the landing pad LP of FIG. 2. The landing pad 180 may overlap a portion of the upper surface of the bit line structure 160, and may not overlap the upper surface of the bit line structure 160. In an embodiment, the landing pad 180 may include at least one compound selected from, for example, a semiconductor material doped with impurities, a conductive silicide compound, a conductive metal nitride and a metal.

A pad isolation layer 185 may be formed on the landing pad 180, the bit line structure 160 and the fence pattern 170. The pad isolation layer 185 may define an area of the landing pad 180, which forms a plurality of isolation areas. Further, the pad isolation layer 185 may be patterned to expose a portion of the upper surface of the landing pad 180. The pad isolation layer 185 may include an insulating material to electrically separate a plurality of landing pads 180 from each other. For example, in an embodiment, the pad isolation layer 185 may include at least one layer selected from a silicon oxide layer, a silicon nitride layer, a silicon oxynitride layer or combinations thereof. However, embodiments of the present disclosure are not limited thereto.

A peripheral device isolation layer 211 may be formed in the substrate 100 of the peripheral area 24. The peripheral device isolation layer 211 may define a peripheral active area in the peripheral area 24. An upper surface of the peripheral device isolation layer 211 is shown as being positioned on the same plane as the upper surface of the substrate 100 (e.g., in the fourth direction D4). However, embodiments of the present disclosure are not necessarily limited thereto. In an embodiment, the peripheral device isolation layer 211 may include at least one layer selected from, the example, a silicon oxide layer, a silicon nitride layer or a silicon oxynitride layer. However, embodiments of the present disclosure are not necessarily limited thereto.

A peripheral gate structure 260 may be formed on the peripheral area 24. The peripheral gate structure 260 may be disposed on a peripheral active area defined by the peripheral device isolation layer 26.

The peripheral gate structure 260 may include a peripheral gate insulating layer 250, first to third peripheral gate conductive layers 261, 262 and 263 and a peripheral gate capping pattern 269, which are sequentially stacked on the substrate 100 (e.g., in the fourth direction D4). The peripheral gate structure 260 may include a peripheral spacer 265 disposed on sidewalls of the first to third peripheral gate conductive layers 261, 262 and 263 and on a sidewall of the peripheral gate capping pattern 269.

In an embodiment, the peripheral gate insulating layer 250 may include, for example, silicon oxide, silicon nitride, and silicon oxynitride.

Referring to FIG. 5, the peripheral gate insulating layer 250 may include, for example, a first peripheral gate insulating layer 250a, a second peripheral gate insulating layer 250b and a third peripheral gate insulating layer 250c. The first peripheral gate insulating layer 250a may include, for example, silicon oxide, silicon nitride, and silicon oxynitride, and the second peripheral gate insulating layer 250b may include a high dielectric constant material having a dielectric constant higher than that of the silicon oxide. The third peripheral gate insulating layer 250c may include a dipole-forming material. In an embodiment, a work function control layer may be further disposed between the peripheral gate insulating layer 250 and the first peripheral gate conductive layer 261.

Referring to FIG. 6, the peripheral gate structure 260 may further include work function control layers 265a and 265b and a fourth peripheral gate insulating layer 250d as compared with the peripheral gate structure 260 of an embodiment of FIG. 5. The work function control layer 265a, the fourth peripheral gate insulating layer 250d and the work function control layer 265b may be sequentially stacked between the second peripheral gate insulating layer 250b and the third peripheral gate insulating layer 250c (e.g., in the fourth direction D4). The fourth peripheral gate insulating layer 250d may include a dipole-forming material. In an embodiment, a work function control layer may be further disposed between the peripheral gate insulating layer 250 and the first peripheral gate conductive layer 261.

A peripheral wiring line 280 may be disposed on both sides of the peripheral gate structure 260. The peripheral wiring line 280 may be extended to the substrate 100 of the peripheral area 24 by passing through the first and second insulating layers 290 and 291. The peripheral wiring line 280 is connected with the substrate 100 of the peripheral area 24.

An interlayer insulating layer 187 may be formed on the second insulating layer 291, the landing pad 180 and the pad isolation layer 185.

The capacitor structure 190 may be formed on the interlayer insulating layer 187. The capacitor structure 190 may be electrically connected with the landing pad 180. For example, the capacitor structure 190 may be electrically connected with the buried contact 150. In an embodiment as shown in FIG. 3A, the capacitor structure 190 includes a lower electrode 191, a capacitor insulating layer 192 and an upper electrode 193.

The lower electrode 191 is shown as having a cylinder shape. However, embodiments of the present disclosure are not necessarily limited thereto. For example, in an embodiment, the lower electrode 191 may have a pillar shape, or may have an L-shape. The capacitor insulating layer 192 is formed on the lower electrode 191. The capacitor insulating layer 192 may be formed along a profile of the lower electrode 191. The capacitor insulating layer 192 may be formed along outer and inner walls of the lower electrode 191. The upper electrode 193 is formed on the capacitor insulating layer 192. The upper electrode 193 may surround the outer wall of the lower electrode 191.

In an embodiment, the lower electrode 191 may include, for example, a doped semiconductor material, a conductive metal nitride (e.g., titanium nitride, tantalum nitride or tungsten nitride), a metal (e.g., ruthenium, iridium, titanium or tantalum) and a conductive metal oxide (e.g., iridium oxide, etc.). However, embodiments of the present disclosure are not necessarily limited thereto. In an embodiment, the capacitor insulating layer 192 may include, but is not limited to one compound selected from silicon oxide, silicon nitride, silicon oxynitride, a high dielectric constant material, and combinations thereof. The upper electrode 193 may include at least one compound selected from, for example, a doped semiconductor material, a metal, a conductive metal nitride or a metal silicide.

FIGS. 7 to 29 are views illustrating intermediate steps to describe a method of manufacturing a semiconductor device according to some embodiments. For reference, the drawings named with 'A' correspond to cross-sectional views taken along line A-A of FIG. 2, the drawings named with 'B' correspond to cross-sectional views taken along line B-B of FIG. 2, the drawings named with 'C' correspond to cross-sectional views taken along line C-C of FIG. 2, and the drawings named with 'D' correspond to cross-sectional views taken along line D-D of FIG. 1.

Referring to FIGS. 7 and 8A-8D, the device isolation layer 110 defining the cell active area ACT extended in the third direction D3 may be formed in the cell area 20. The plurality of gate structures 120 extended in the first direction D1 may be formed in the substrate 100 and the device isolation layer 110.

Subsequently, the peripheral gate insulating layer 250 may be formed. The peripheral gate insulating layer 250 may be formed on the substrate 100 of the peripheral area 24. The peripheral gate insulating layer 250 may expose the upper surface of the substrate 100 of the cell area 20.

A first sacrificial layer 251 and a second sacrificial layer 252 may be formed on the substrate 100 of the cell area 20. In an embodiment, the first sacrificial layer 251 and the second sacrificial layer 252 may be formed in the cell area 20, and may not be formed in the peripheral area 24.

The first sacrificial layer 251 and the second sacrificial layer 252 may include an insulating material. In an embodiment, the first sacrificial layer 251 and the second sacrificial layer 252 may include various insulating materials such as silicon oxide, silicon nitride and metal oxide. For example, the first sacrificial layer 251 may include silicon oxide, and the second sacrificial layer 252 may include silicon nitride. Further, additional sacrificial layers may be further formed.

Referring to embodiments of FIGS. 9A-9D, a first peripheral gate conductive layer 261 may be formed on the peripheral device isolation layer 211 exposed by the second sacrificial layer 252, the peripheral gate insulating layer 250 and the peripheral gate insulating layer 250. A first passivation layer 266 may be formed on the first peripheral gate conductive layer 261. In an embodiment, the first passivation layer 266 may include, for example, an oxide.

Referring to embodiments of FIGS. 10A-10D, a first mask pattern M1 may be formed on the peripheral area 24. The first mask pattern M1 may expose the cell area 20. The first peripheral gate conductive layer 261 and the first passivation layer 266 of the cell area 20 may be removed using the first mask pattern M1. Therefore, the second sacrificial layer 252 of the cell area 20 may be exposed.

Referring to embodiments of FIGS. 11A-11D, the first and second sacrificial layers 251 and 252 on the cell area 20 may be removed using the mask pattern M1. Therefore, the upper surface of the substrate 100 of the cell area 20 may be exposed. The first mask pattern M1 may then be removed.

Referring to embodiments of FIGS. 12 and 13A-13D, the contact pad 130 and a second passivation layer 131 may be sequentially formed. The contact pad 130 and the second passivation layer 131 may be formed on the cell area 20 and the cell peripheral area 24. In an embodiment, the second passivation layer 131 may include, for example, an oxide.

Referring to embodiments of FIGS. 14 and 15A-15C, a first trench 141t may be formed on the cell area 20. The first trench 141t may be extended in the second direction D2. The first trench 141t1 may be formed at a position where the bit line structure 160 is to be formed. The first trench 141t may pass through the contact pad 130 and the second passivation layer 131 to expose the upper surface of the substrate 100. Although a bottom surface of the first trench 141t is shown as being positioned on the same plane as the upper surface of the substrate 100 (e.g., in the fourth direction D4), embodiments of the present disclosure are not necessarily limited thereto. The bottom surface of the first trench 141t may be disposed below the upper surface of the substrate 100 and positioned in the substrate 100.

Subsequently, a first buffer layer 146 may be formed in the first trench 141t. The first buffer layer 146 may fill at least a portion of the first trench 141. In an embodiment, an upper surface of the first buffer layer 146 may be disposed on the same plane as the upper surface of the contact pad 130 (e.g., in the fourth direction D4). The first buffer layer 146 may be formed in such a manner that a buffer layer for filling the first trench 141t is formed and then its upper portion is etched by an etch-back process.

Then, the second passivation layer 131 may be removed.

Figure 16:
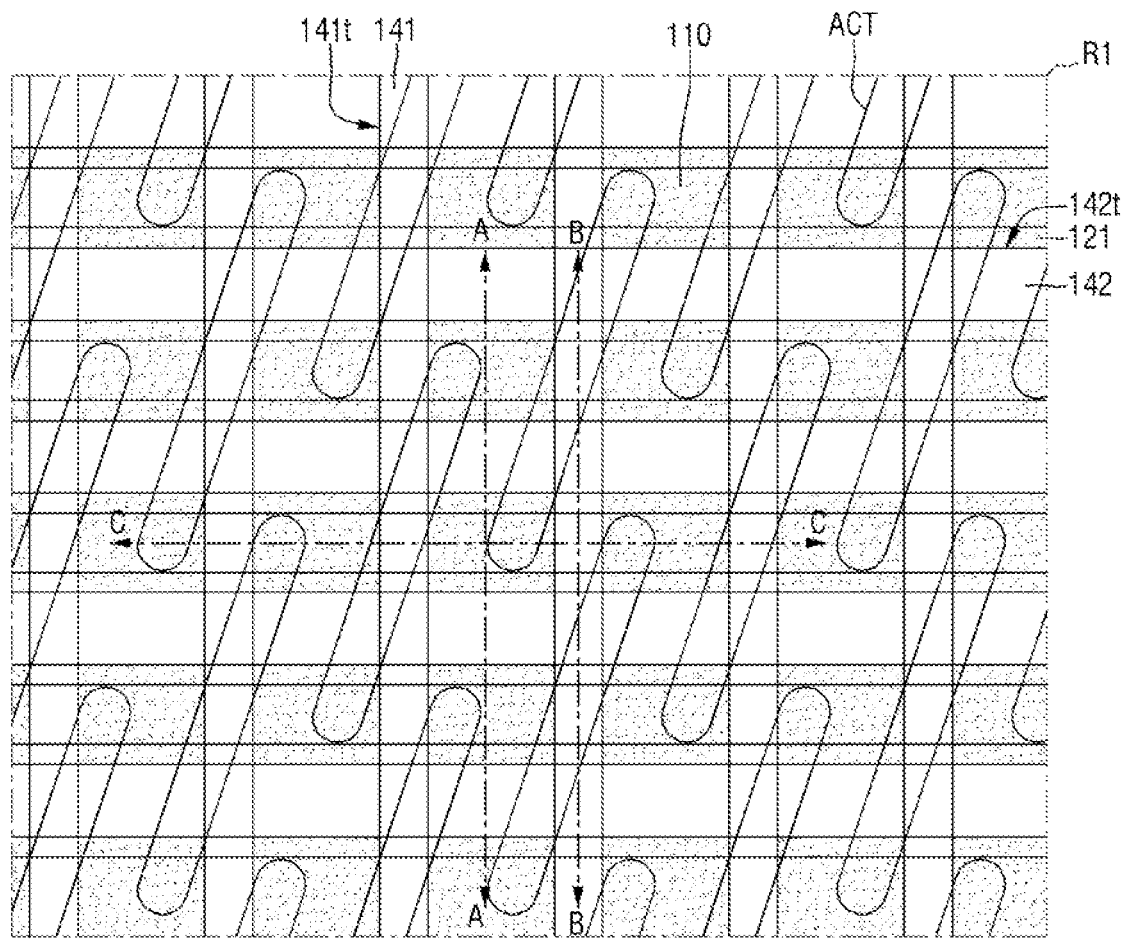
Figure 16:
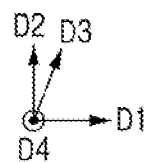
Figure 17A:
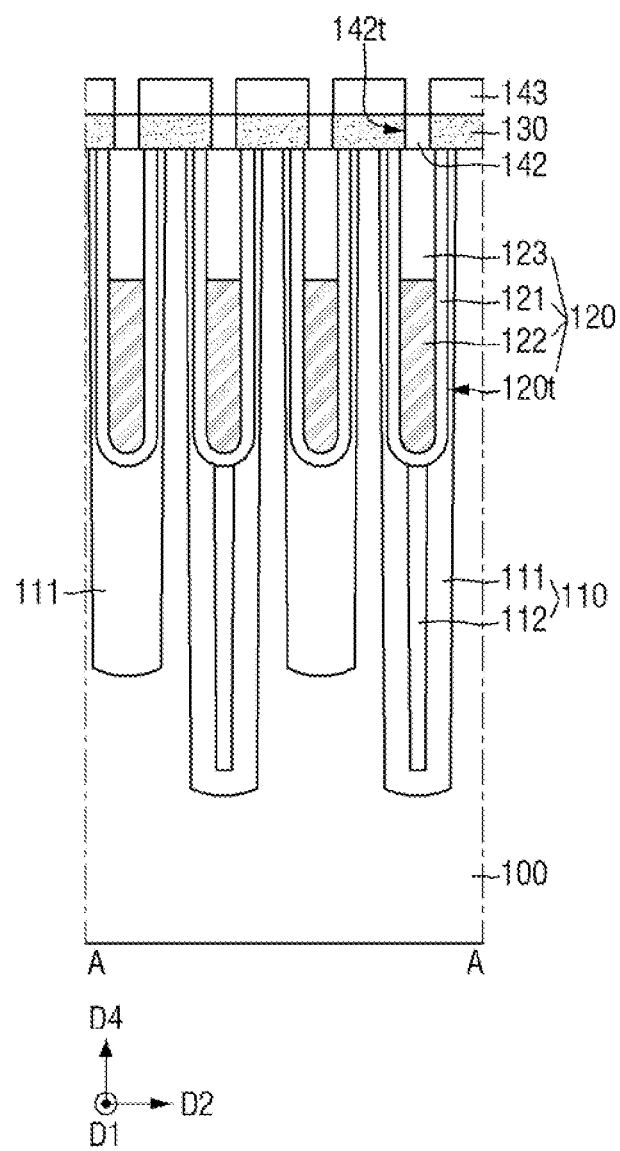
Figure 17B:
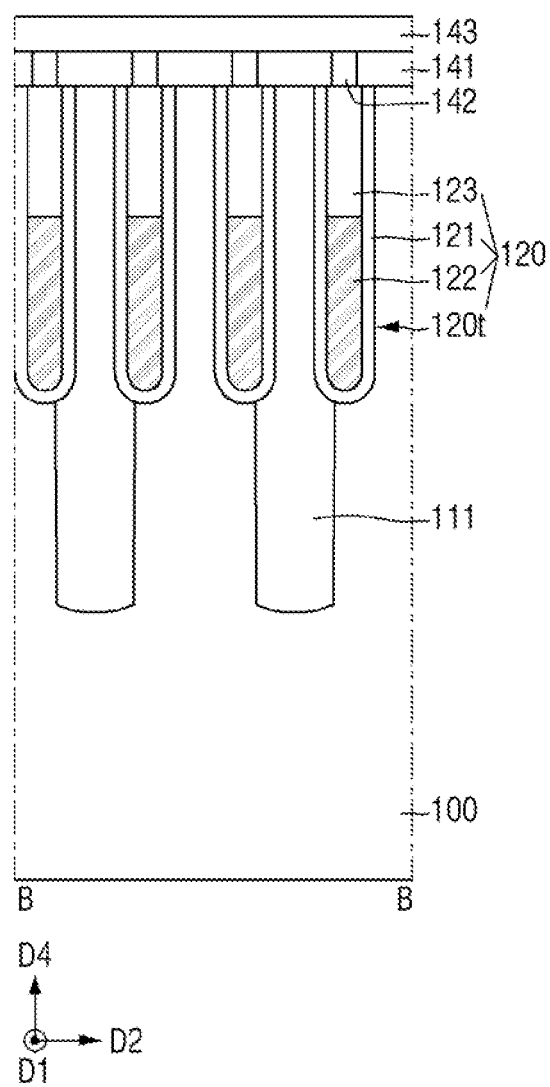
Figure 17C:
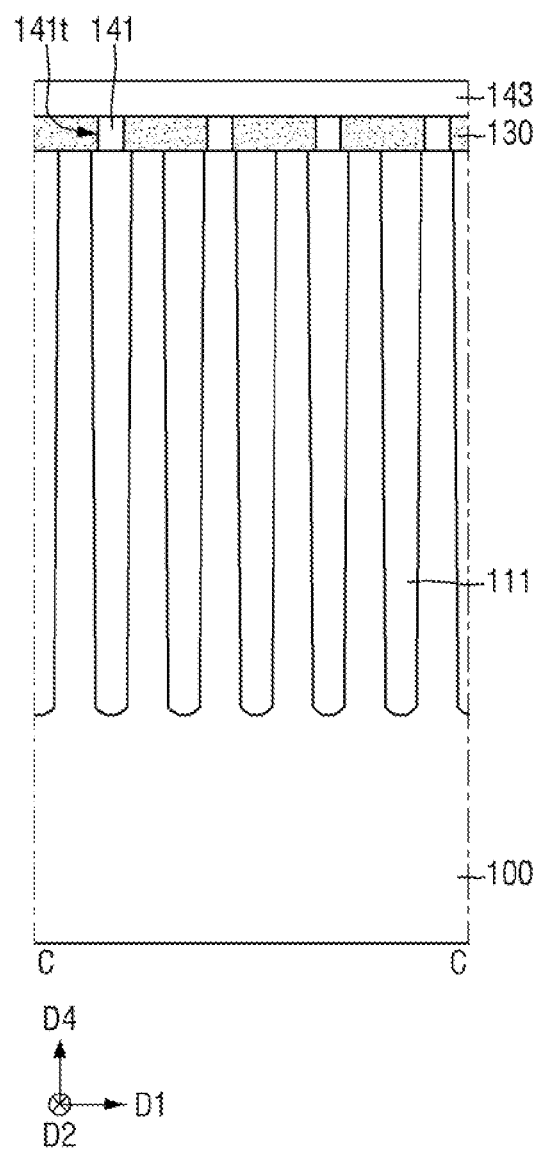
Figure 18A:
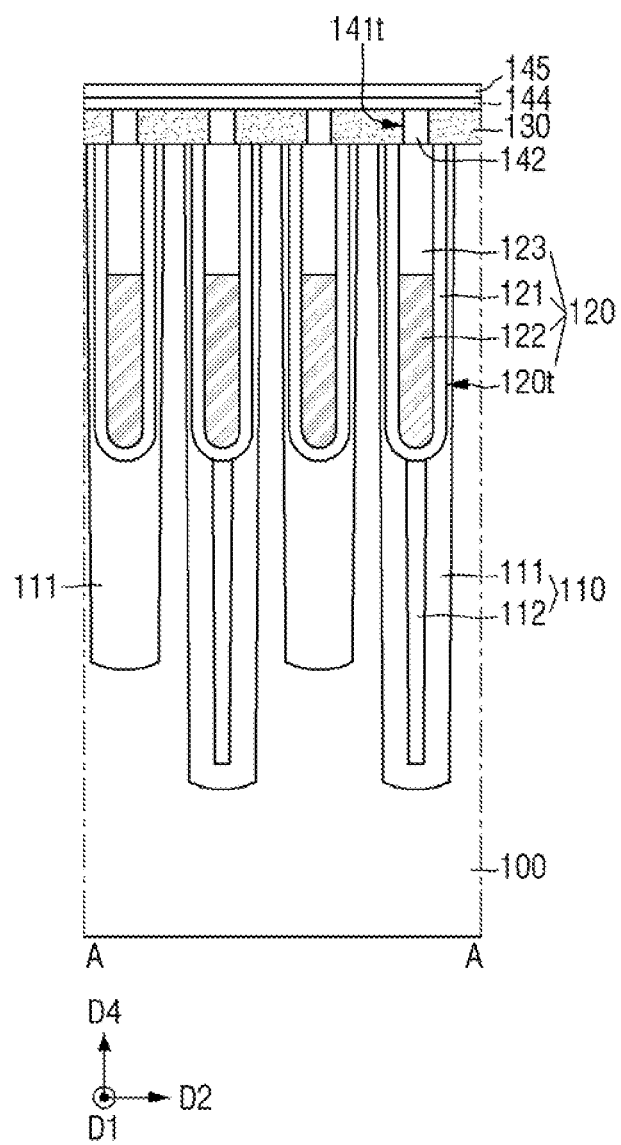
Figure 18B:
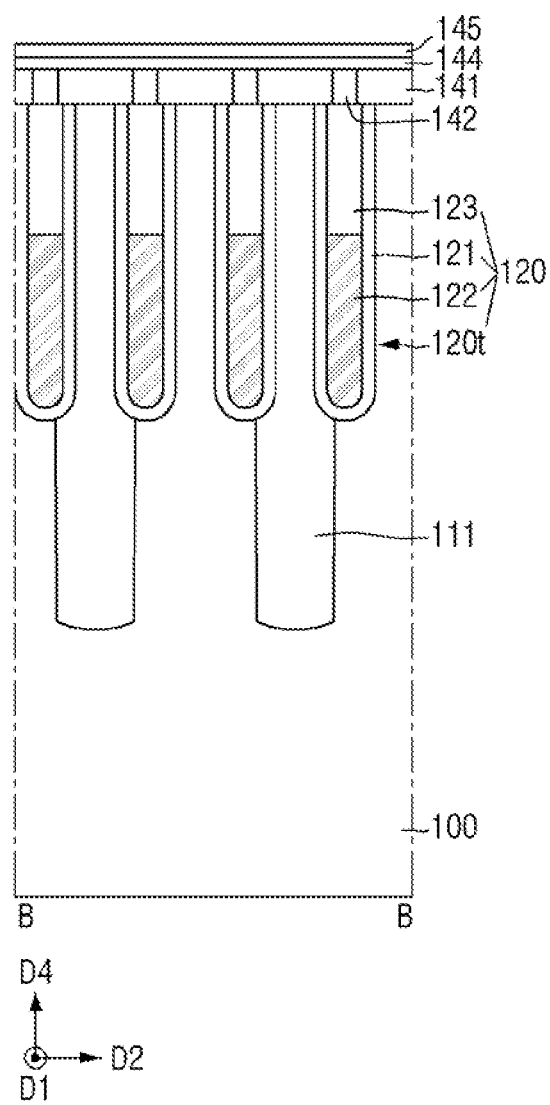
Figure 18C:
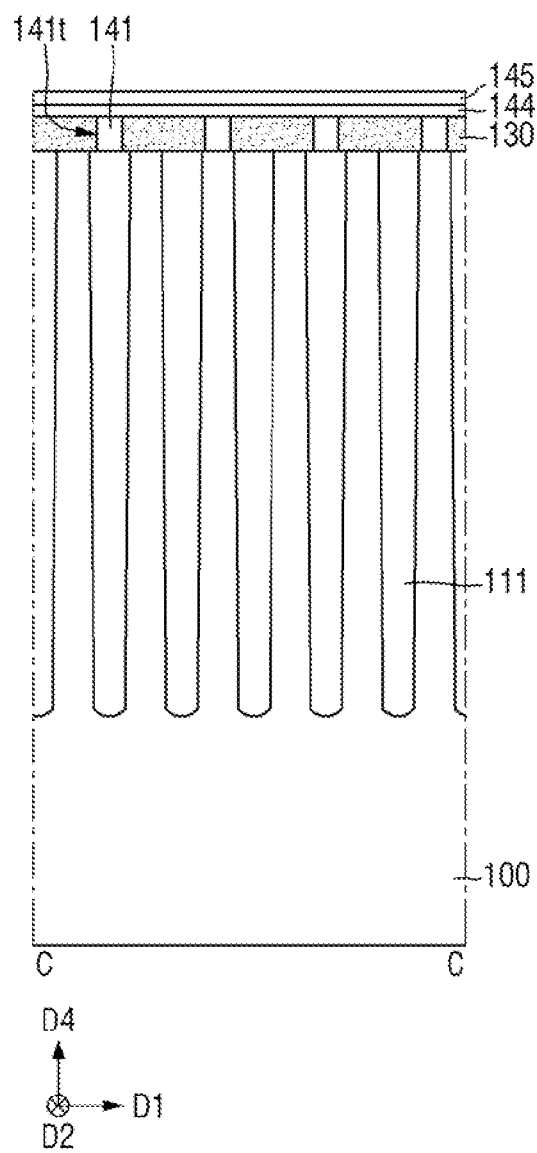
Figure 18D:
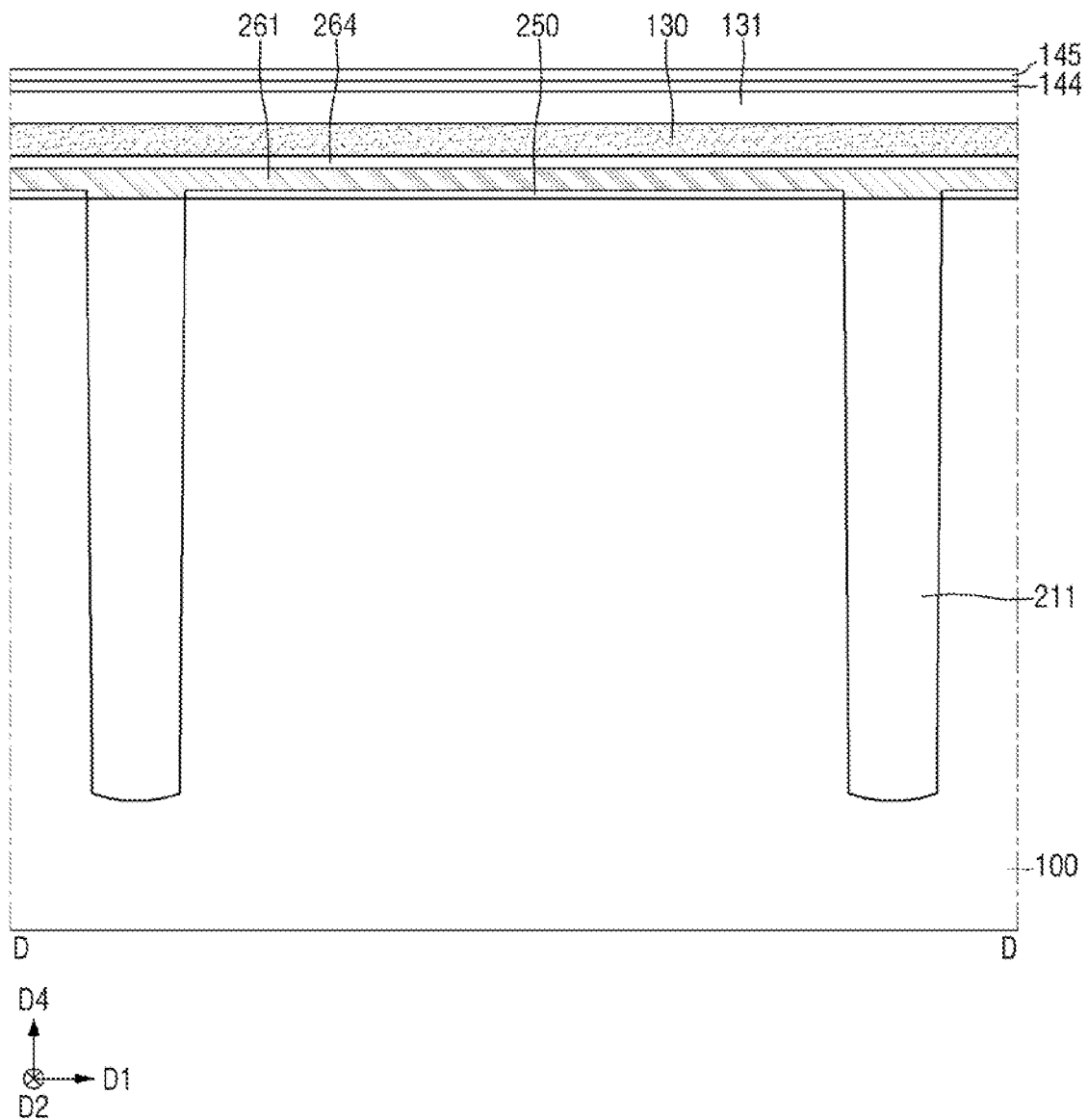
Figure 19A:
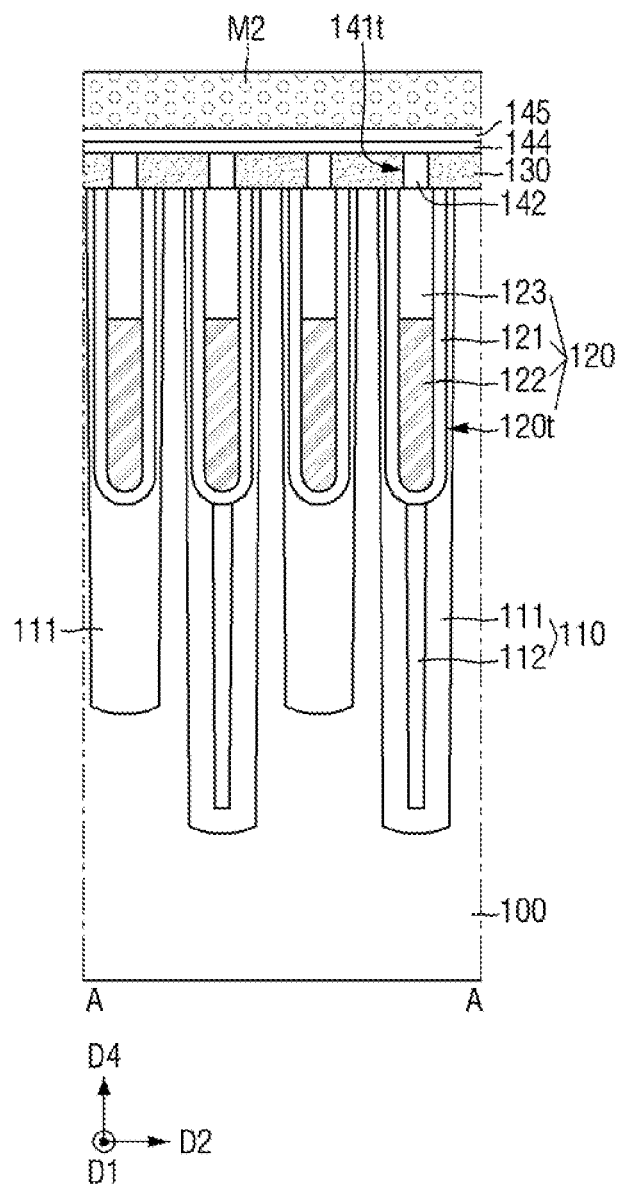
Figure 19B:
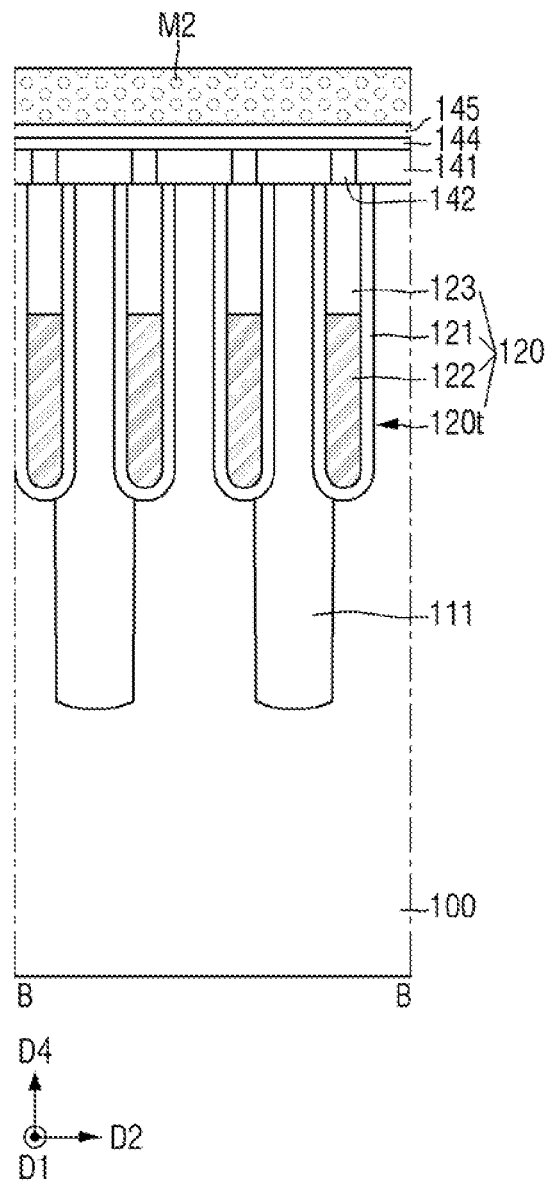
Figure 19C:
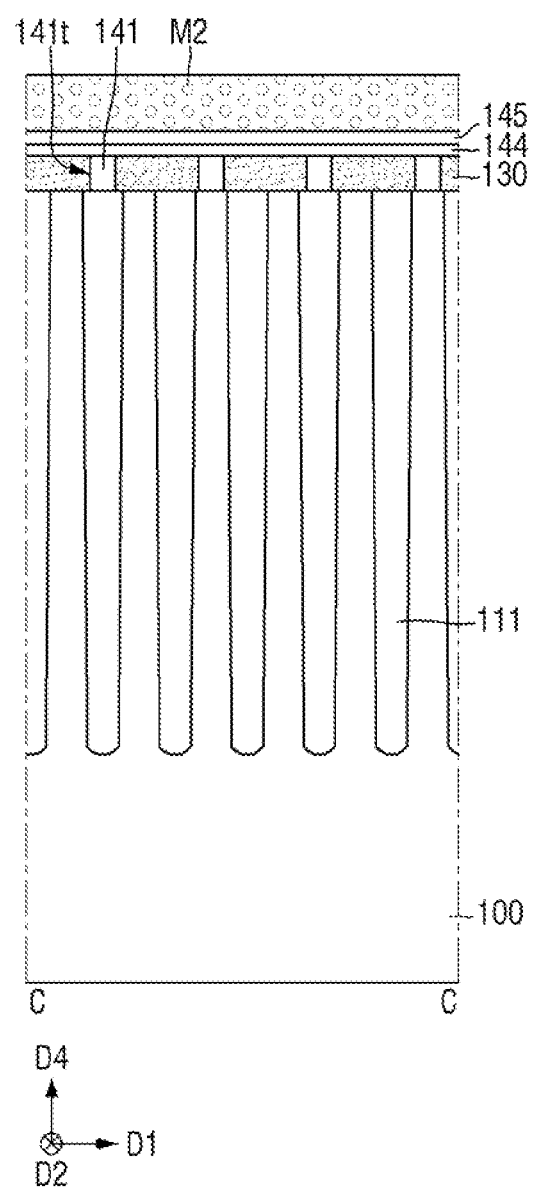
Figure 19D:
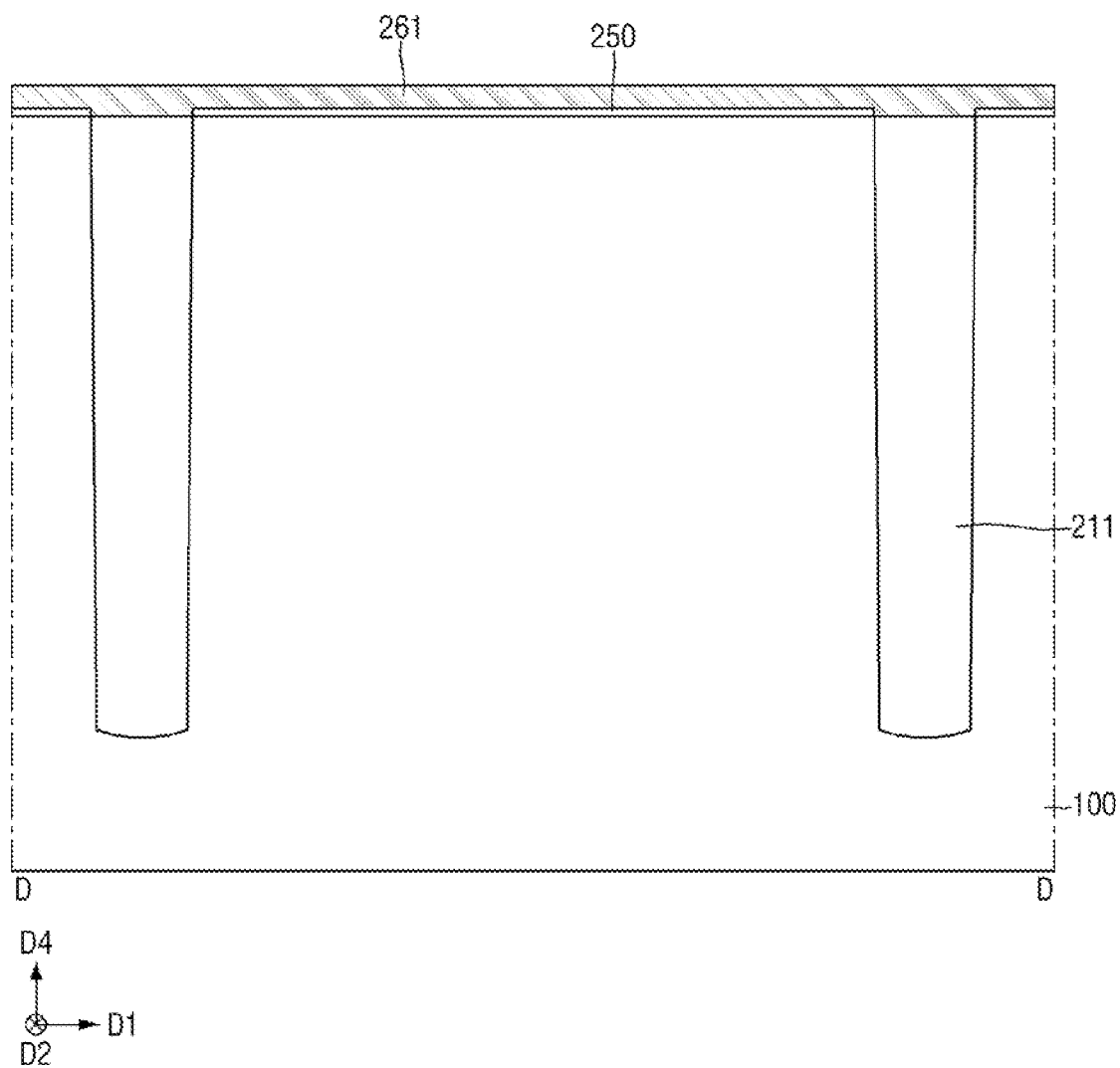
Figure 20A:
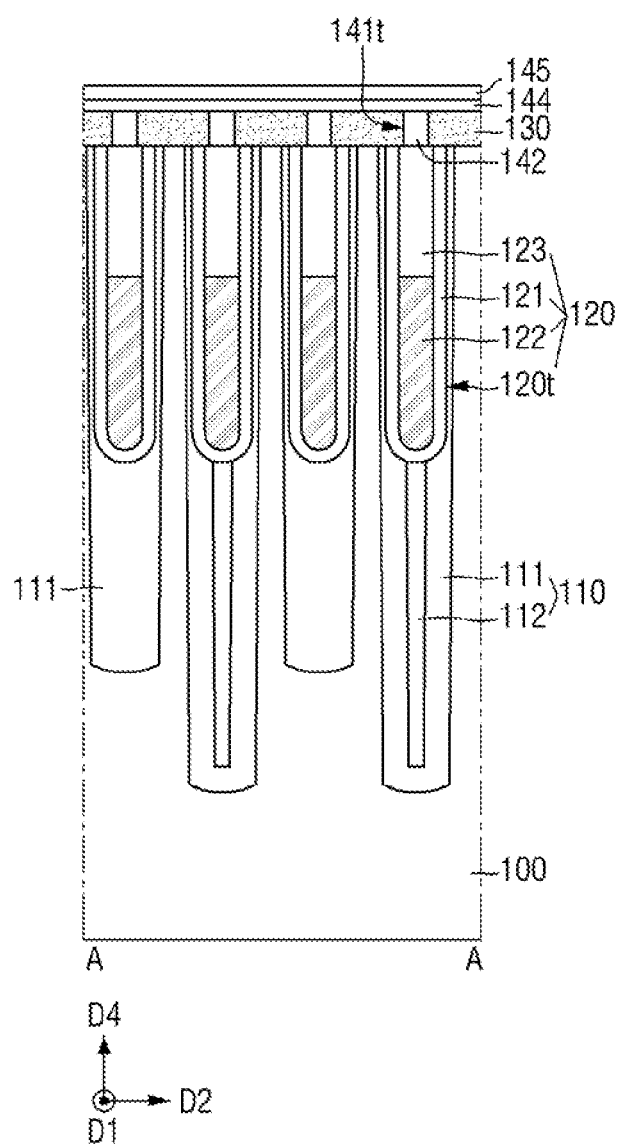
Figure 20B:
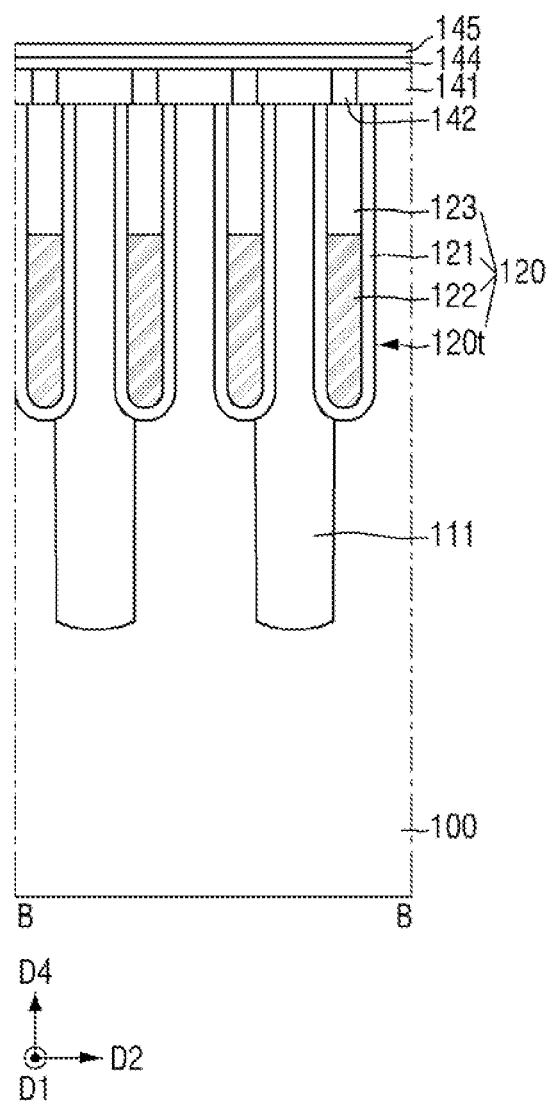
Figure 20C:
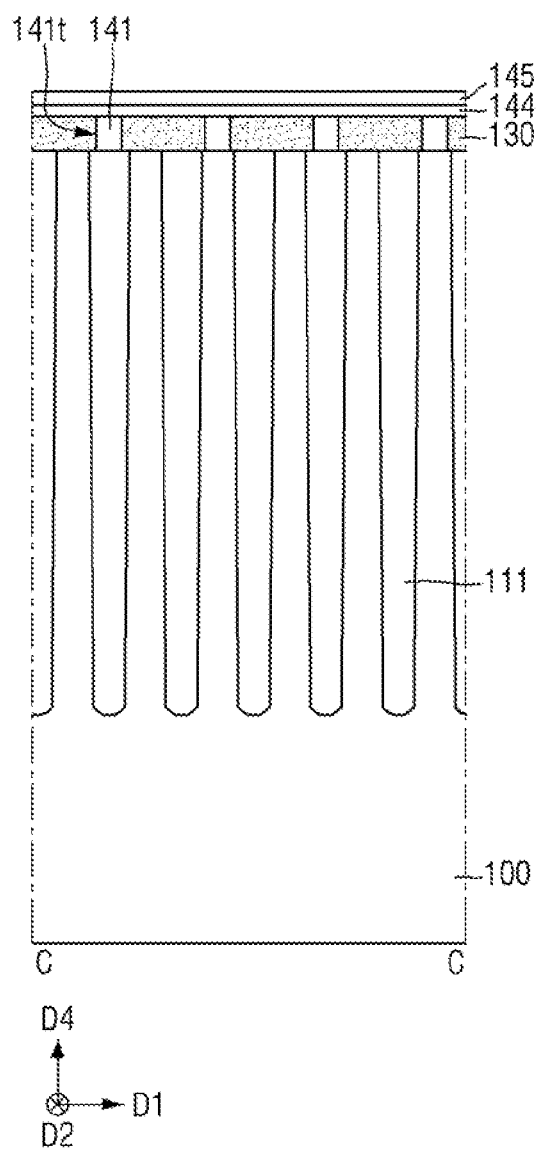
Figure 20D:
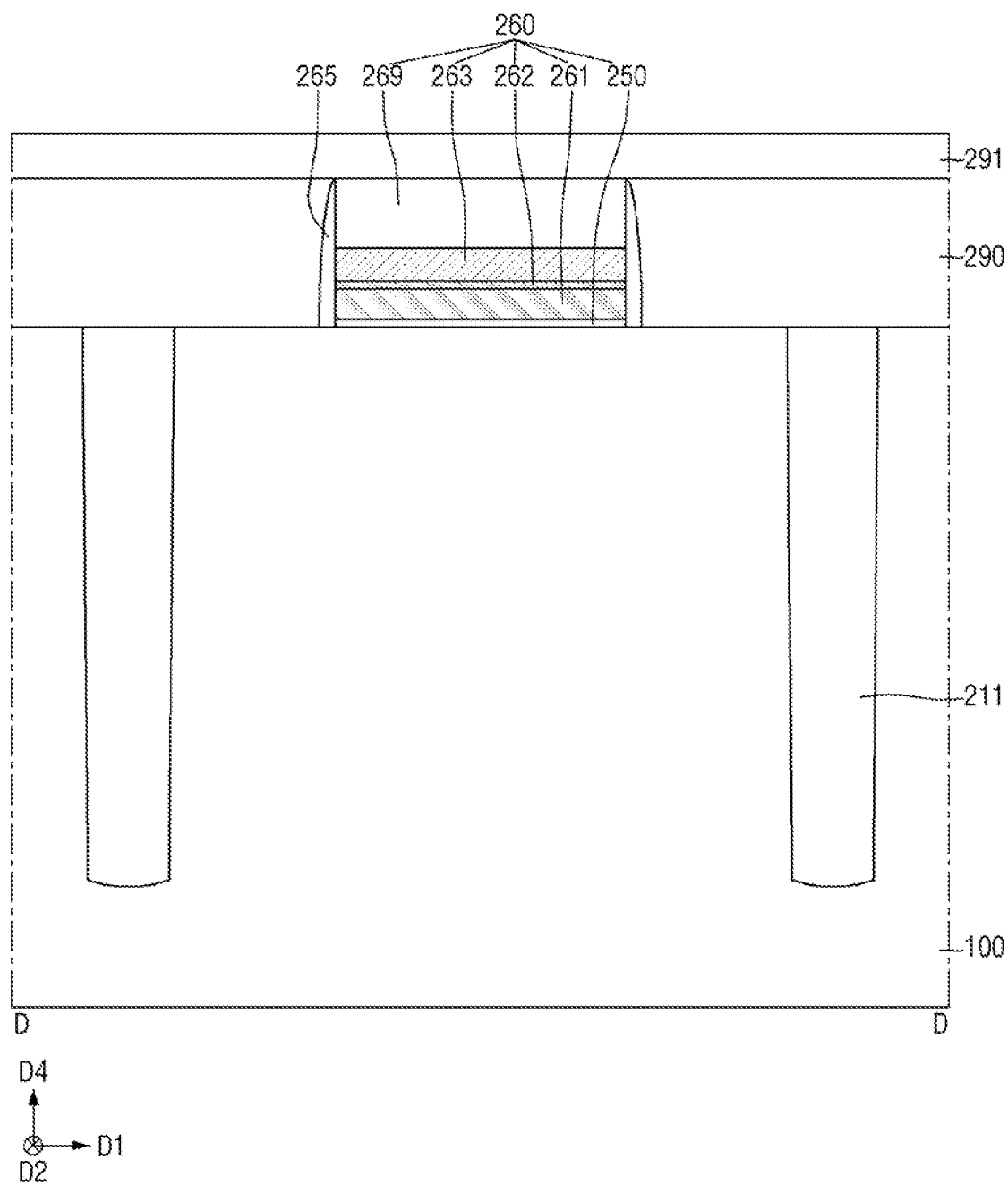
Figure 21:
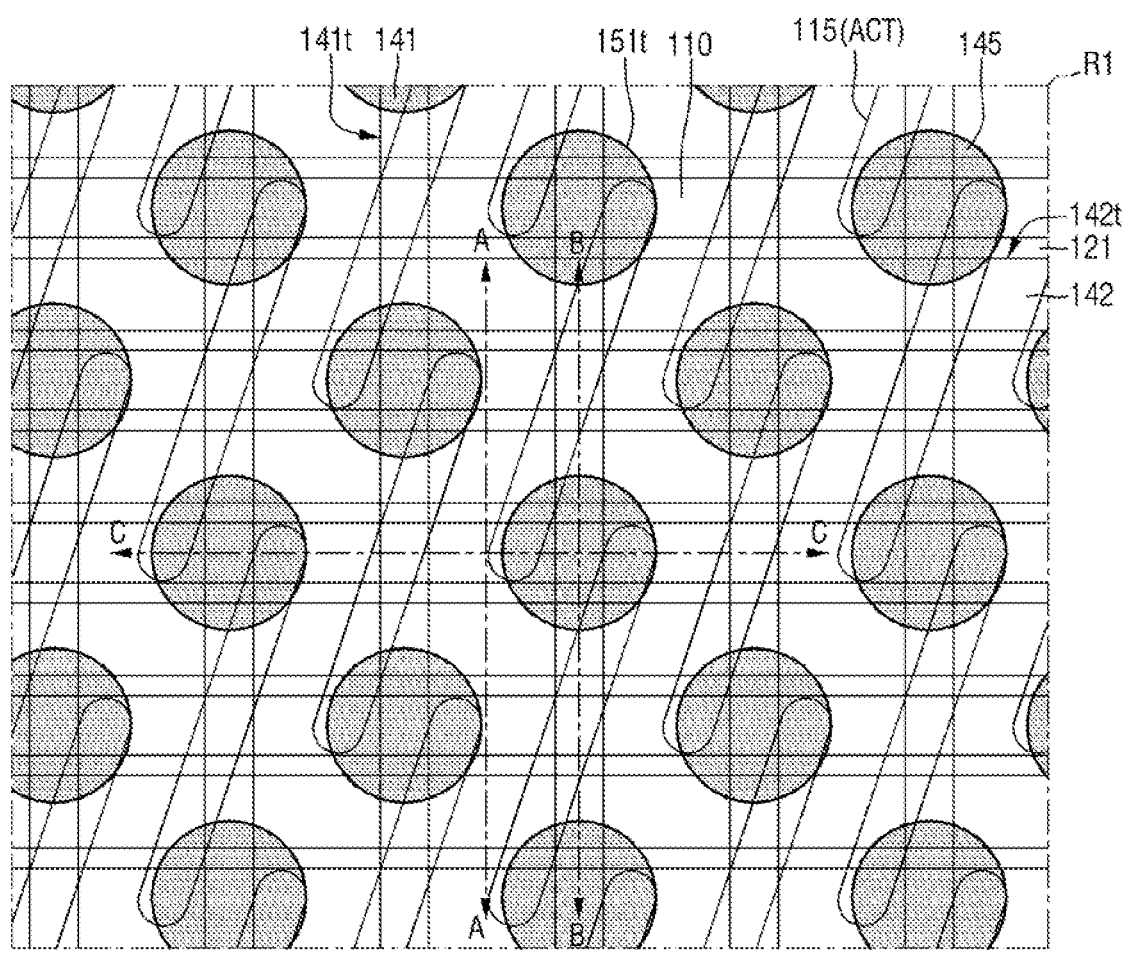
Figure 21:
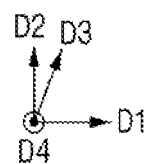

Referring to FIGS. 16 and 17, a third passivation layer 143 may be formed on the cell area 20. The third passivation layer 143 may include, for example, an oxide. A second trench 142t may then be formed on the cell area 20. The second trench 142t may be extended in the first direction D1. The second trench 142t may be formed on the gate structure 120. The second trench 142t may expose at least a portion of the upper surface of the gate structure 120.

The second buffer layer 142 may then be formed in the second trench 142t. The second buffer layer 142 may fill at least a portion of the second trench 142t. In an embodiment, the upper surface of the second buffer layer 142 may be positioned on the same plane as the upper surface of the contact pad 130. The second buffer layer 142 may be formed in such a manner that a buffer layer for filling the second trench 142t is formed and then its upper portion is etched by an etch-back process.

Then, the third passivation layer 143 may be removed.

In an embodiment, after the second trench 142t and the second buffer layer 142 for filling at least a portion of the second trench 142t are formed, the first trench 141t and the first buffer layer 141 for filling at least a portion of the first trench 141t may be formed.

In an embodiment, the first trench 141t extended in the second direction D2 and the second trench 142t extended in the first direction D1 may be formed at a time, and the first and second buffer layers 141 and 142 for filling at least a portion of the first trench 141t and the second trench 142t may be formed at a time.

Referring to embodiments of FIGS. 15A-18D, the third buffer layer 144 and a fourth buffer layer 145 may be sequentially formed on the substrate 100. The third buffer layer 144 and the fourth buffer layer 145 may be formed on the contact, pad 130, the first buffer layer 141 and the second buffer layer 142 on the cell area 20. The third buffer layer 144 and the fourth buffer layer 145 may be formed on the contact pad 130 on the peripheral area 24.

The third buffer layer 144 and the fourth buffer layer 145 may include an insulating material. The third buffer layer 144 and the fourth buffer layer 145 may include various insulating materials such as silicon oxide, silicon nitride and metal oxide. For example, the third buffer layer 144 may include silicon oxide, and the fourth buffer layer 145 may include silicon nitride.

Referring to embodiments of FIGS. 19A-19D, a second mask pattern M2 may be formed on the cell area 20. The second mask pattern M2 may expose the peripheral area 24. The first passivation layer 266, the contact pad 130, the second passivation layer 131, the third buffer layer 144 and the fourth buffer layer 145 of the peripheral area 24 may be removed using the second mask pattern M2. Therefore, the first peripheral gate conductive layer 261 may be exposed.

Subsequently, the second mask pattern M2 may be removed.

Referring to embodiments of FIGS. 20A-20D, the peripheral gate structure 260 may be formed. The second peripheral gate conductive layer 262, the third peripheral gate conductive layer 263 and the peripheral gate capping pattern 269 may be formed on the first peripheral gate conductive layer 261. The second peripheral gate conductive layer 262, the third peripheral gate conductive layer 263 and the peripheral gate capping pattern 269 may be formed by patterning after being formed on the cell area 20 and the peripheral area 24. The peripheral spacer 265 may then be formed on the sidewall of the peripheral gate structure 260.

Subsequently, the first insulating layer 290 and the second insulating layer 291 may be formed to cover the peripheral gate structure 260 and the peripheral spacer 265. The second insulating layer 291 may be disposed on the first insulating layer 290. The first insulating layer 290 may expose an upper surface of the peripheral gate structure 260, and the second insulating layer 291 may be disposed on the upper surface of the peripheral gate structure 260 and on an upper surface of the first insulating layer 290. For example, after the first insulating layer 290 and the second insulating layer 291 are formed on the cell area 20 and the peripheral area 24, the first insulating layer 290 and the second insulating layer 291 of the cell area 20 may be removed. Therefore, the third buffer layer 144 and the fourth buffer layer 145 of the cell area 20 may be exposed.

Referring to embodiments of FIGS. 21 and 22A-22C, a third trench 151t may be formed on the cell area 20. The third trench 151t may expose the portion of the bit line structure 160 overlapped with the bit line pass portion 160_2, which will be formed later. The third trench 151t may expose the upper surfaces of the contact pad 130, the first buffer layer 141 and the second buffer layer 142. Therefore, the third buffer layer 144 and the fourth buffer layer 145 may be protruded from the upper surfaces of the contact pad 130, the first buffer layer 141 and the second buffer layer 142 in a portion where the third trench 151t is not formed.

Referring to embodiments of FIGS. 23 and 24A-24C, the buried contact 150 may be formed on the cell area 20. The buried contact 150 may cover the contact pad 130, the first buffer layer 141, the second buffer layer 142, the third buffer layer 144 and the fourth buffer layer 145. In an embodiment, an upper surface of the buried contact 150 may be planarized by a planarization process.

Referring to embodiments of FIGS. 25 and 26A-26C, a fourth trench 160t may be formed on the cell area 20, The fourth trench 160t may be extended in the second direction D2. The fourth trench 160t may include a first portion 161t that exposes the second buffer layer 142, and a second portion 162t that exposes the upper surface of the substrate 100. A bottom surface 162t_bs of the second portion 162t may be disposed in the substrate 100. For example, the bottom surface 162t_bs of the second portion 162t may be defined by the substrate 100 and may be lower than an upper surface of the substrate 100.

Therefore, the fourth buffer layer 145 may form the second buffer pattern 145 of FIG. 3. The first buffer layer 141, the second buffer layer 142 and the third buffer layer 145 may form the first buffer pattern 140 of FIG. 3.

Referring to embodiments of FIGS. 27 and 28A-28C, the bit line structure 160, which includes the bit line stack 161 and the bit line capping pattern 162, and the bit line spacer 165 may be formed in the fourth trench 160t. The bit line stack 161 may fill at least a portion of the fourth trench 160t. The bit line capping pattern 162 may be formed on the bit line stack 161 to fill the fourth trench 160t. The bit line structure 160 may be formed in the fourth trench 160t, and the bit line spacer 165 may be filled between the bit line structure 160 and the fourth trench 160t.

Figure 29A:
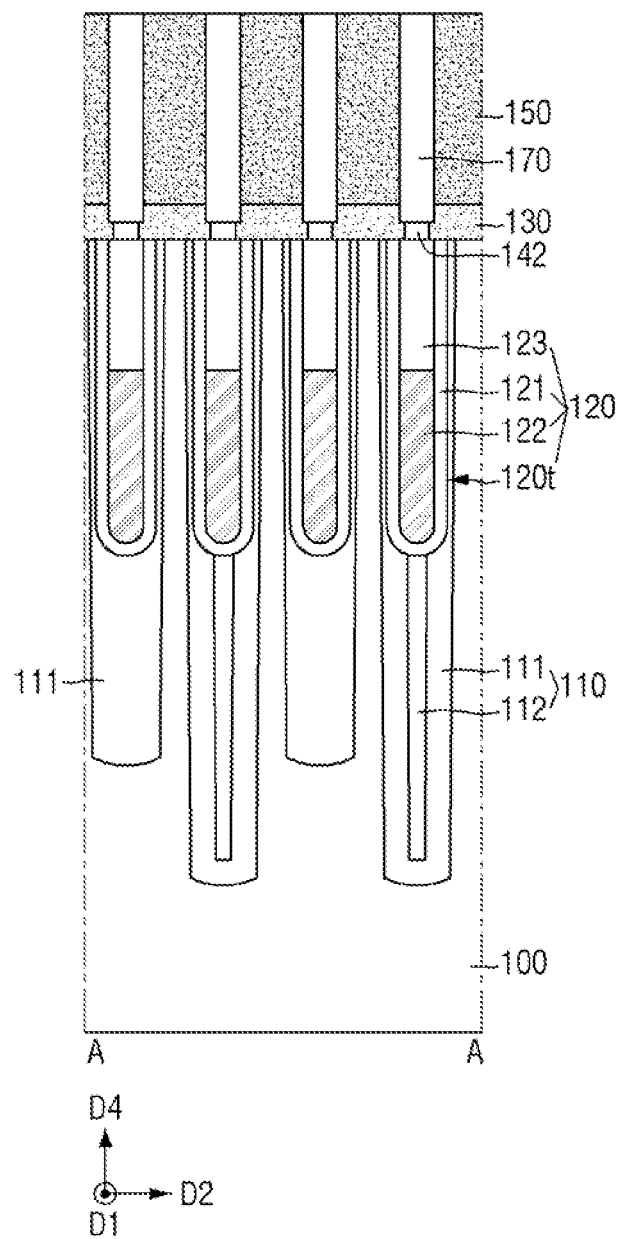
Figure 29B:
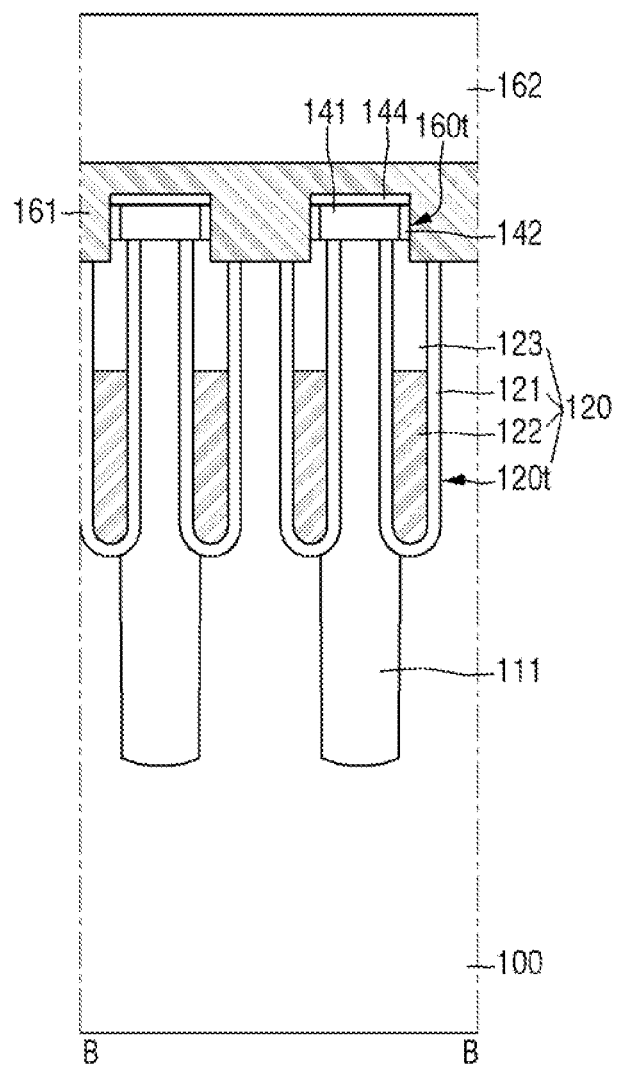
Figure 29B:
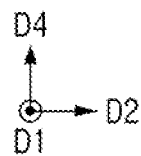
Figure 29C:
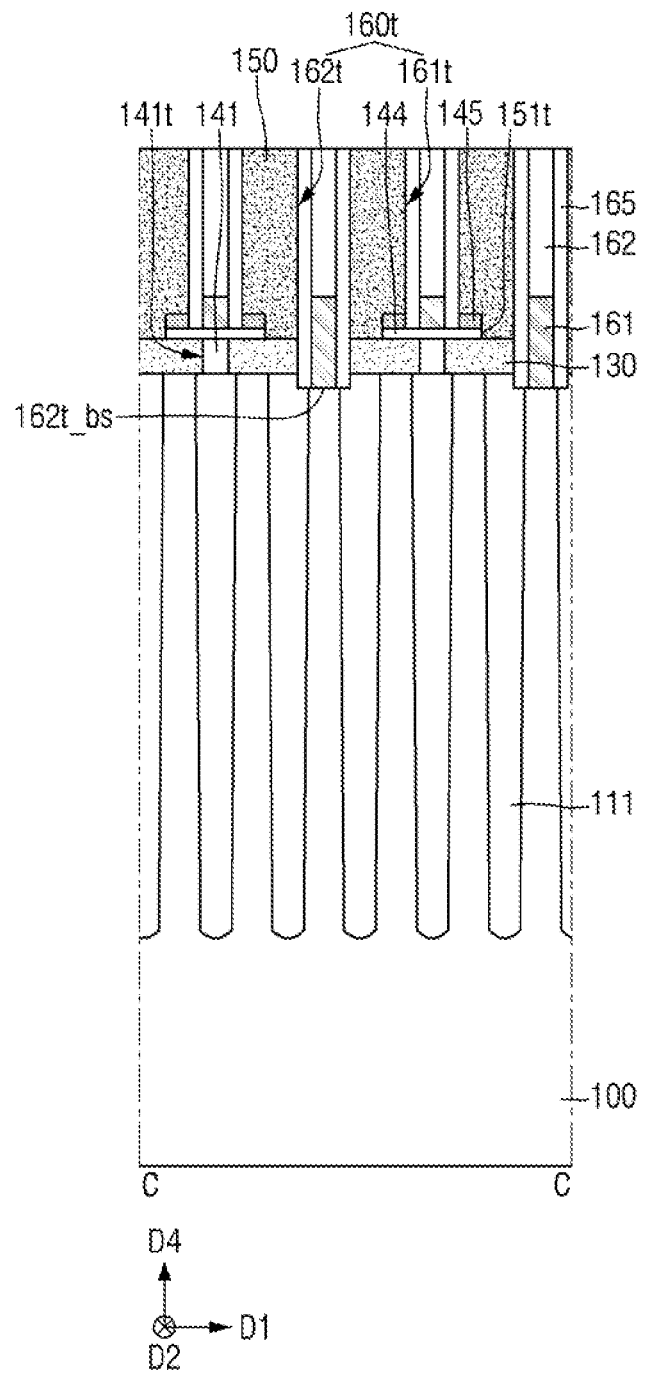

Referring to embodiments of FIGS. 29A-29C, the fence pattern 170 may be formed. The fence pattern 170 may be formed on the second buffer layer 142 on the gate structure 120. The buried contact 150 may be separated from an adjacent buried contact by the fence pattern 170. A portion of the second buffer layer 142 may be etched during the process of forming the fence pattern 170. Therefore, a portion of the fence pattern 170 may be formed in the contact pad 130.

Subsequently, referring to an embodiment of FIG. 3, a portion of the buried contact 150 may be etched. Therefore, a portion of the sidewall of the fence pattern 170 and a portion of the sidewall of the bit line structure 160 may be exposed.

Then, the landing pad 180 covering the fence pattern 170 and the bit line structure 160 may be formed. Subsequently, after a trench is formed by etching a portion of the bit line structure 160 and the landing pad 180, the pad isolation layer 185 for filling the trench may be formed. The landing pad 180 may be separated from an adjacent landing pad by the pad isolation layer 185. Also, the sacrificial spacer layer included in the bit line spacer 165 exposed by the trench may be removed. Therefore, the bit line spacer 165 may include an air spacer.

FIGS. 30 to 32 are views illustrating intermediate steps to describe a method of manufacturing a semiconductor device according to some embodiments. FIG. 30 is a view illustrating intermediate steps to describe steps subsequent to FIG. 20. For reference, the drawings named with 'A' correspond to cross-sectional views taken along line A-A of FIG. 2, the drawings added with 'B' correspond to cross-sectional views taken along line B-B of FIG. 2, and the drawings added with 'C.' correspond to cross-sectional views taken along line C-C of FIG. 2.

Figure 30A:
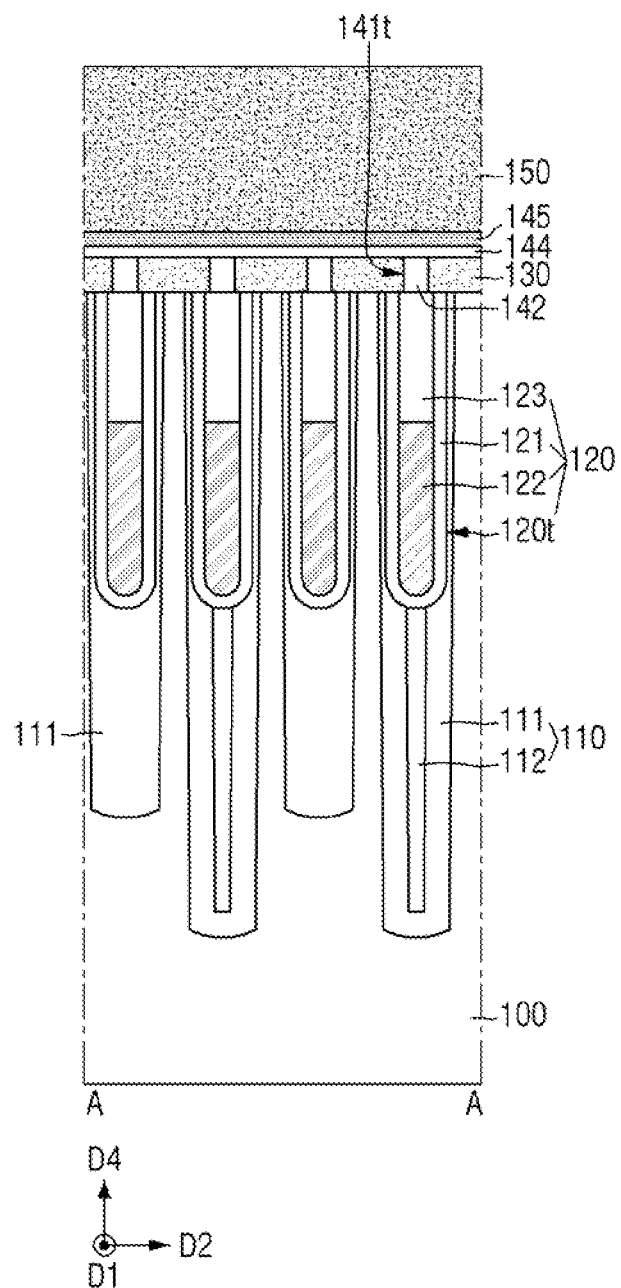
FIGS. 30A to 32C are views illustrating intermediate steps to describe a method of manufacturing a semiconductor device according to embodiments of the present disclosure.
Figure 30B:
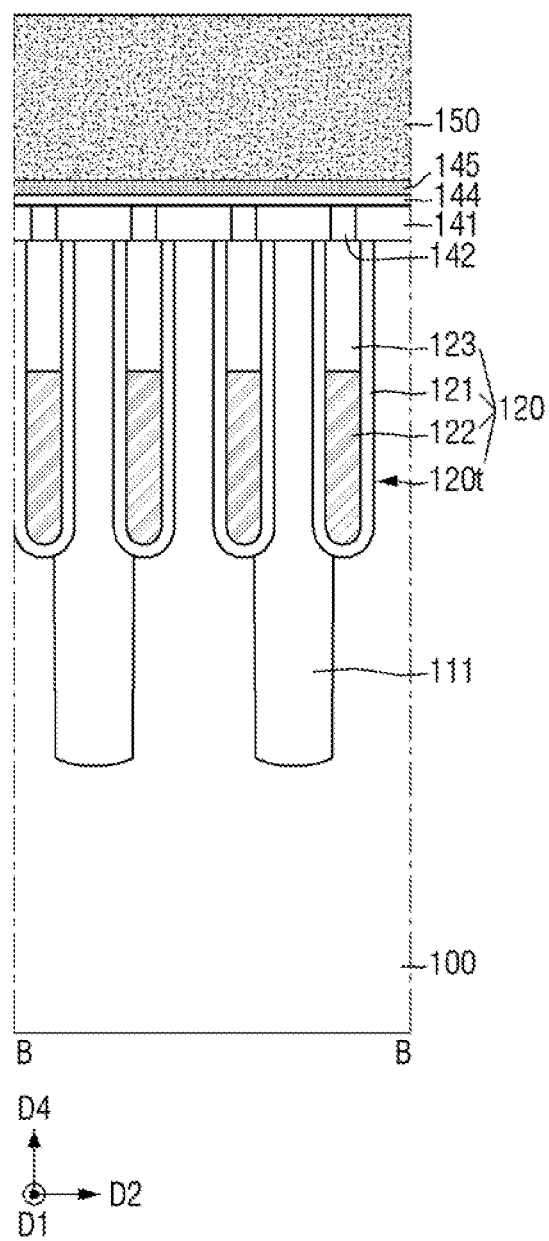
Figure 30C:
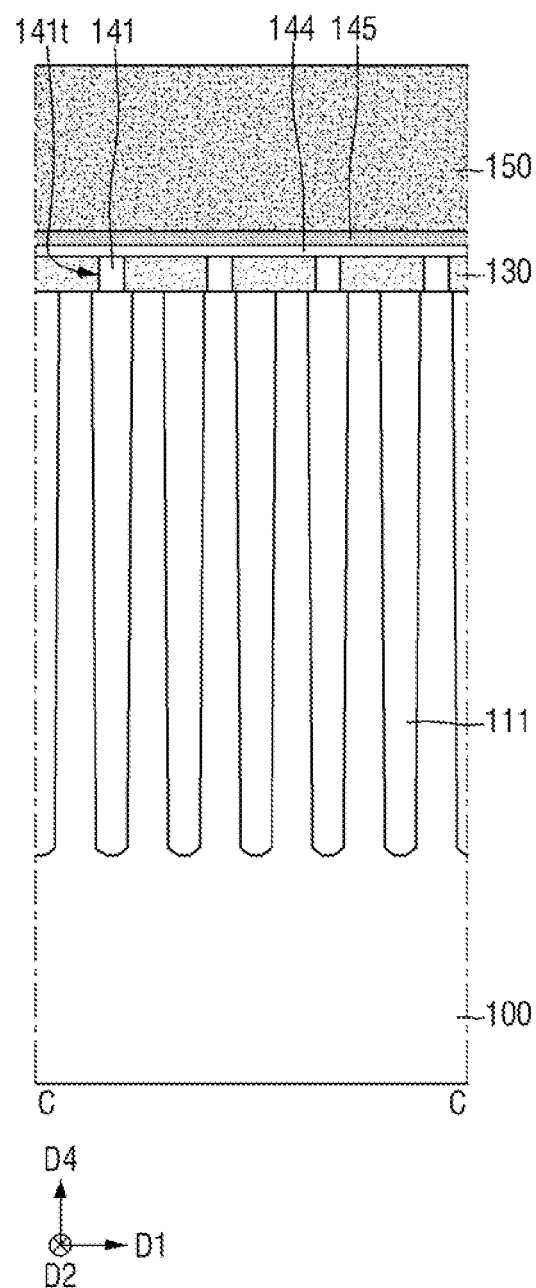
Figure 31A:
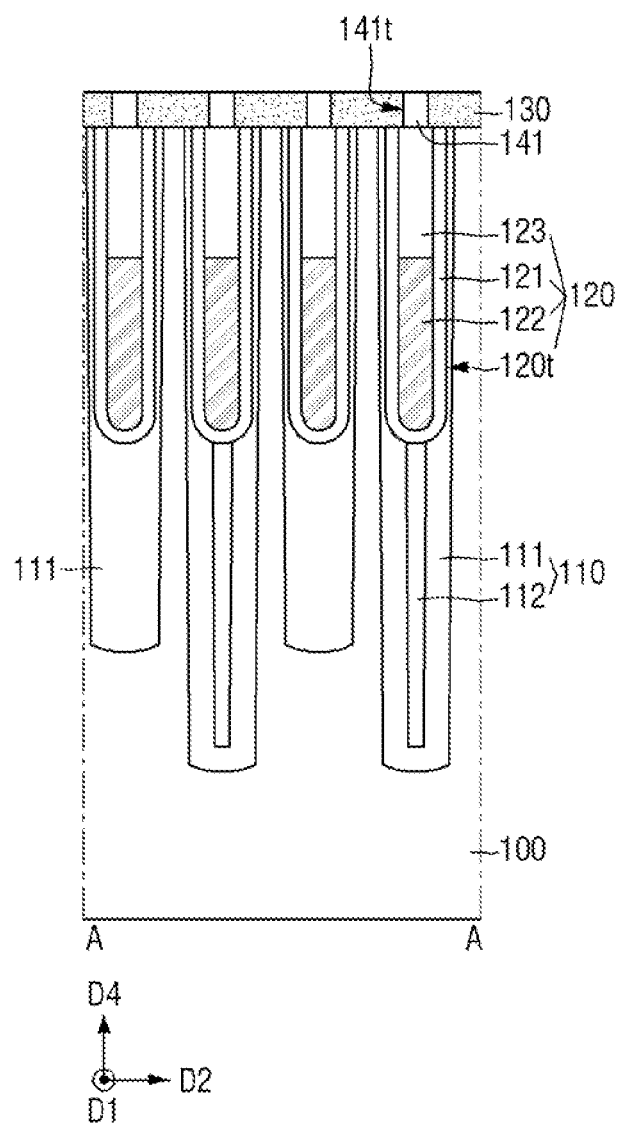
Figure 31B:
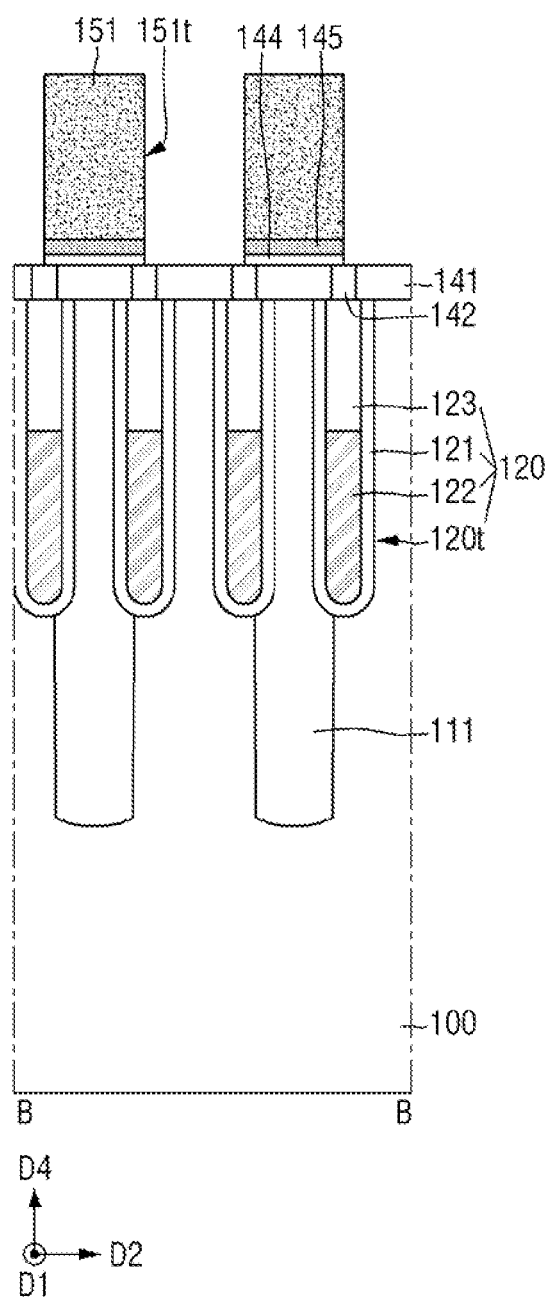
Figure 31C:
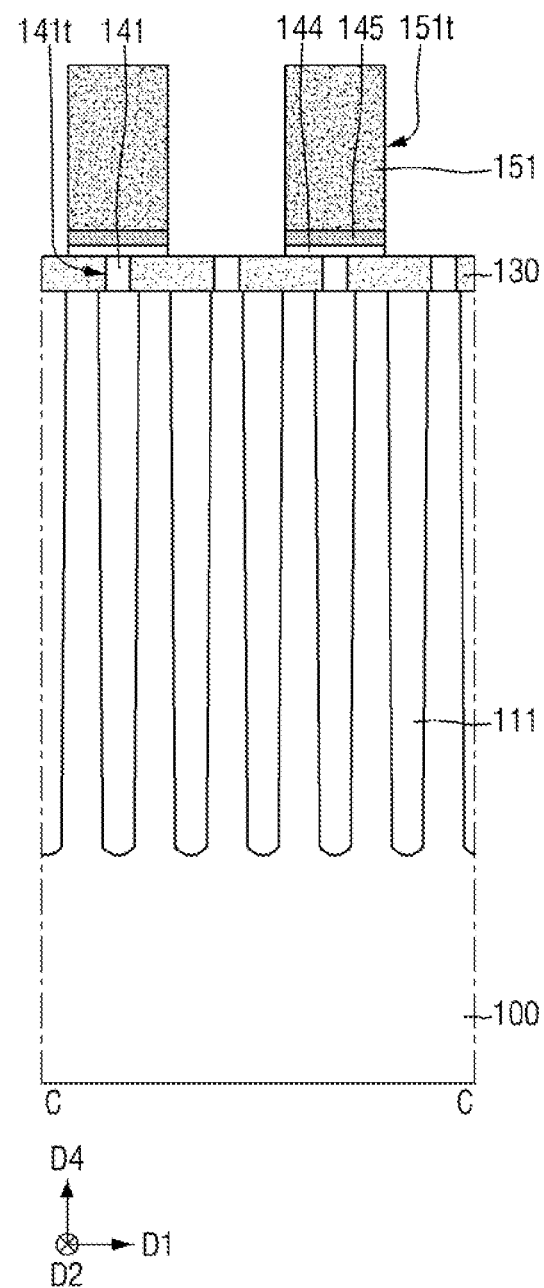

Referring to embodiments of FIGS. 30A-30C, the first conductive layer 151 may be formed in the cell area 20. The first conductive layer 151 may be formed on the fourth buffer layer 145. The upper surface of the first conductive layer 151 may be planarized by a planarization process.

Referring to FIGS. 21 and 31A-31C, the third trench 151t may be formed on the cell area 20. The third trench 151t may expose the upper surfaces of the contact pad 130, the first buffer layer 141 and the second buffer layer 142. Therefore, the third buffer layer 144, the fourth buffer layer 145 and the first conductive layer 151 may be protruded from the upper surfaces of the contact pad 130, the first buffer layer 141 and the second buffer layer 142.

Figure 32A:
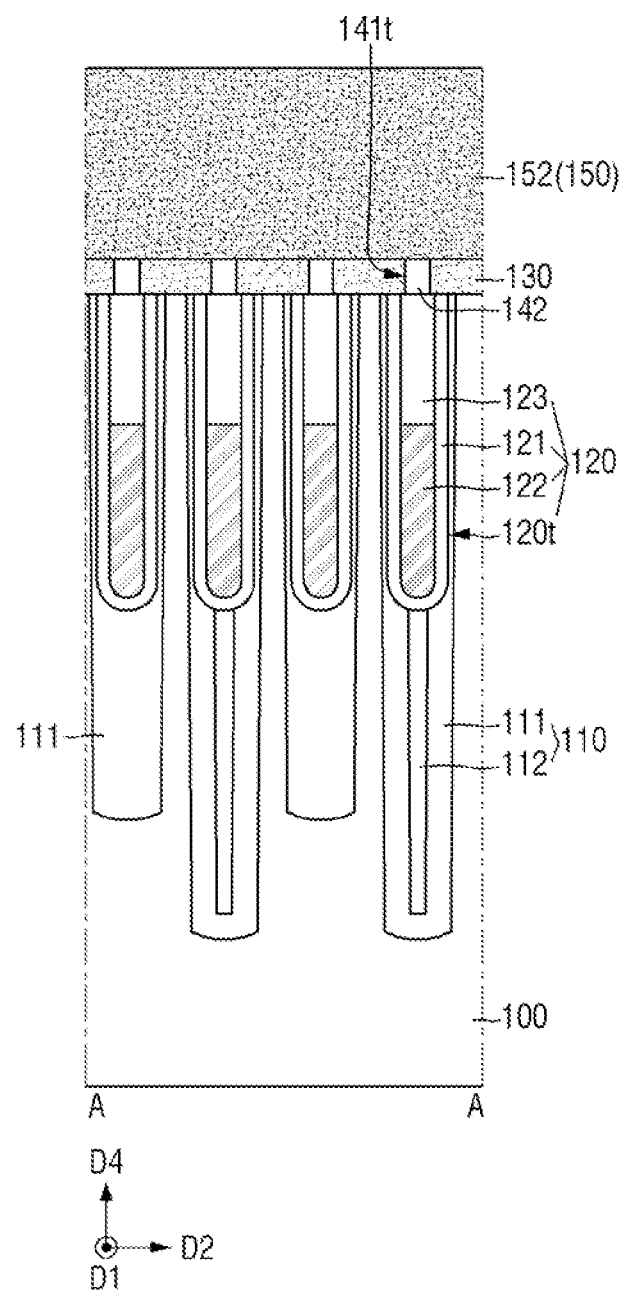
Figure 32B:
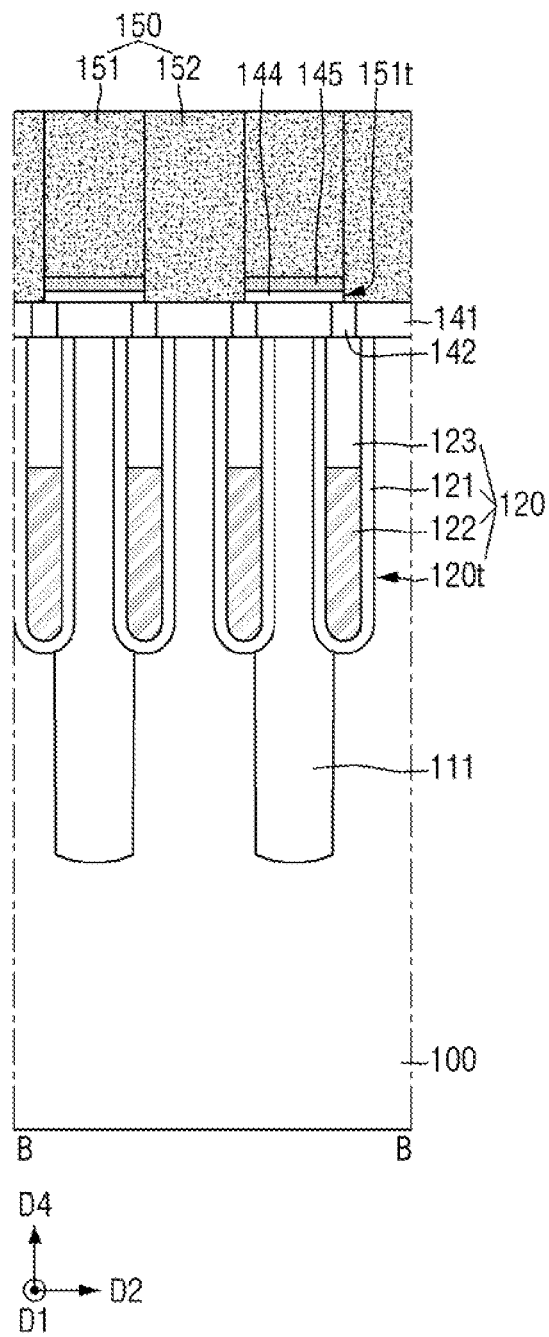
Figure 32C:
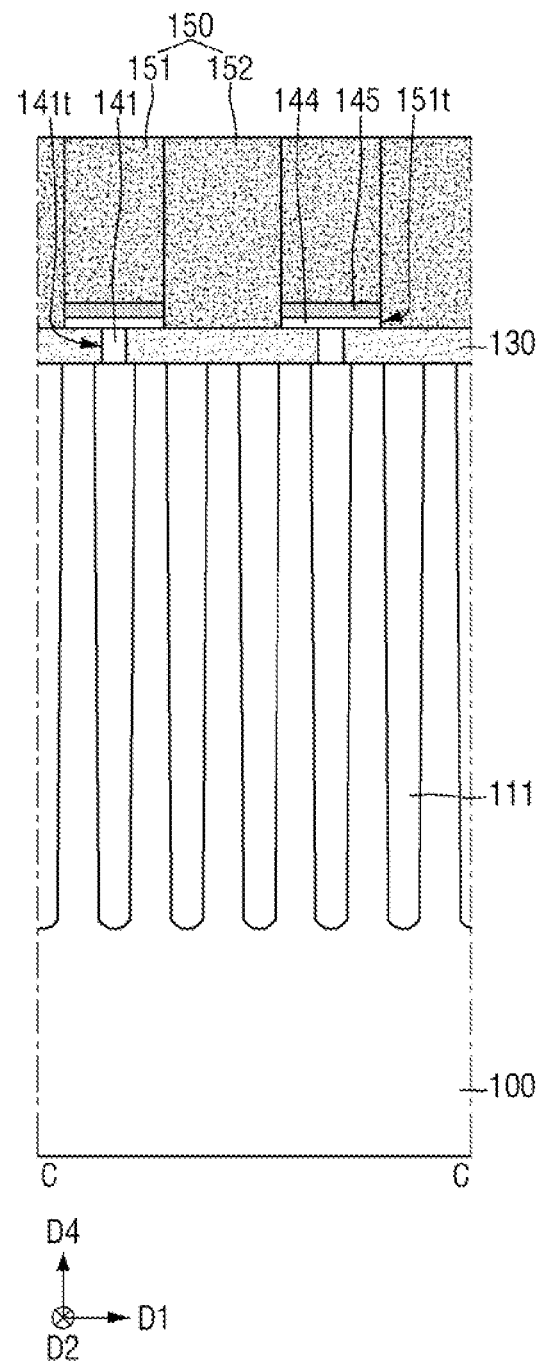

Referring to embodiments of FIGS. 32A-32C, the second conductive layer 152 for filling the third trench 151t may be formed. For example, after the second conductive layer 152 for filling the third trench 151t and covering the first conductive layer 151 is formed, the upper surfaces of the first conductive layer 151 and the second conductive layer 152 may be positioned on the same plane by a planarization process. Therefore, the buried contact 150 including the first conductive layer 151 and the second conductive layer 152 may be formed.

Subsequently, the manufacturing process described with reference to embodiments of FIGS. 25 to 29C may be performed.

Figure 22A:
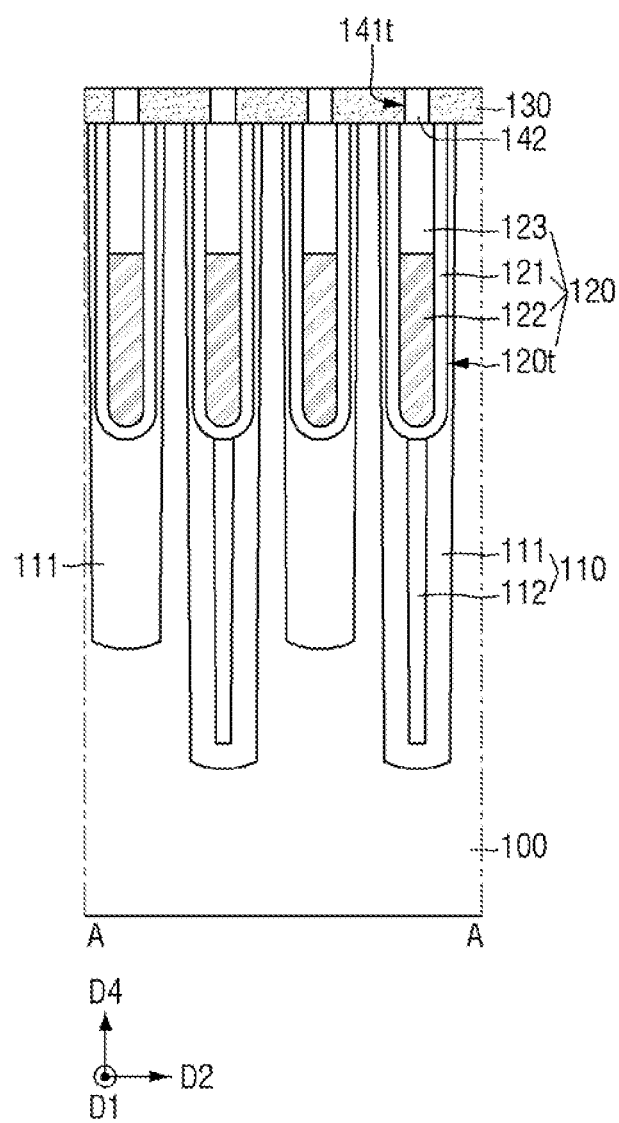
Figure 22B:
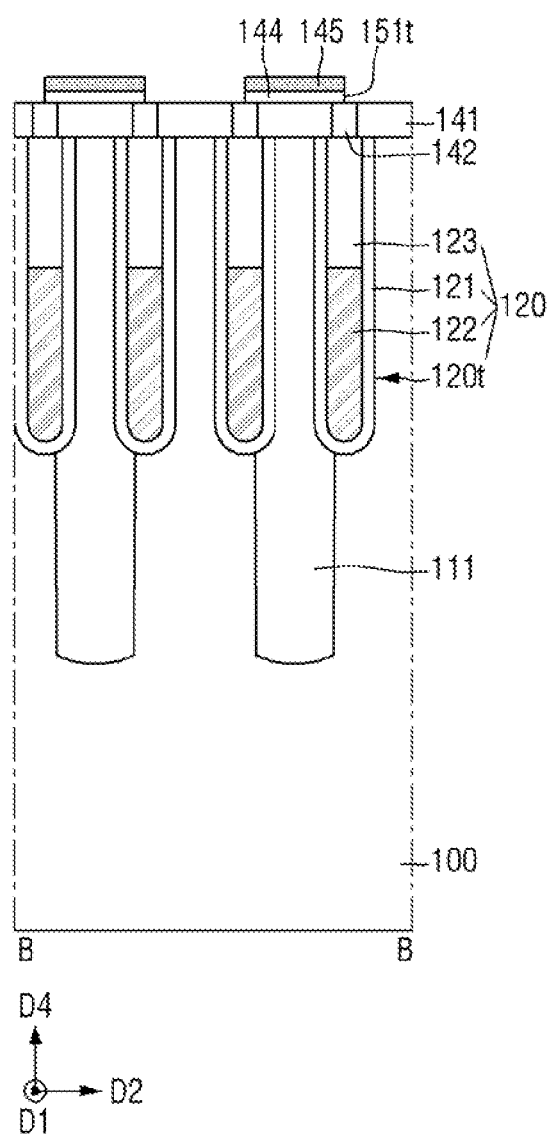
Figure 22C:
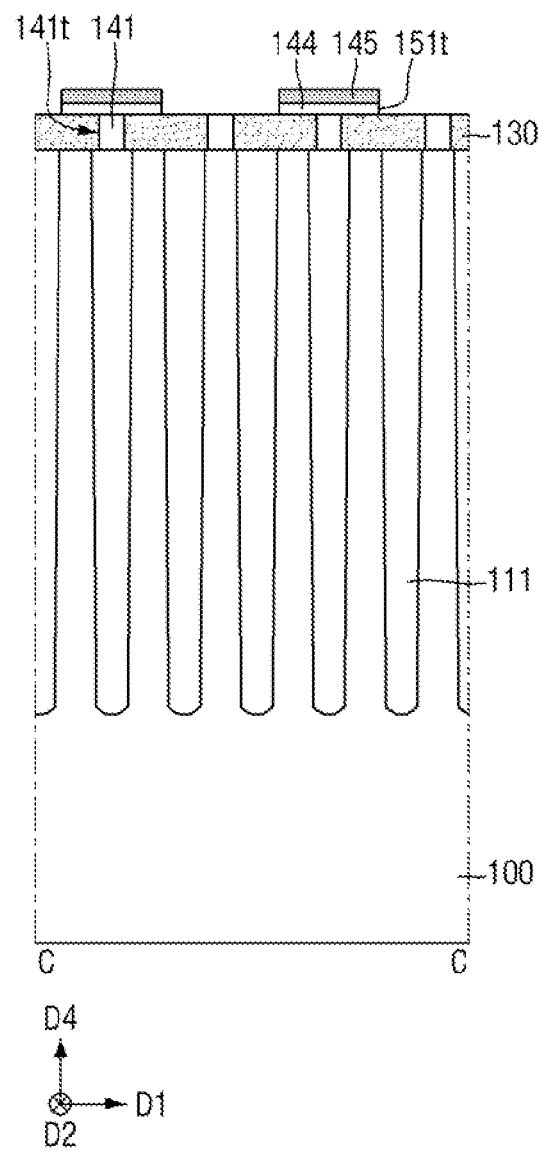
Figure 23:
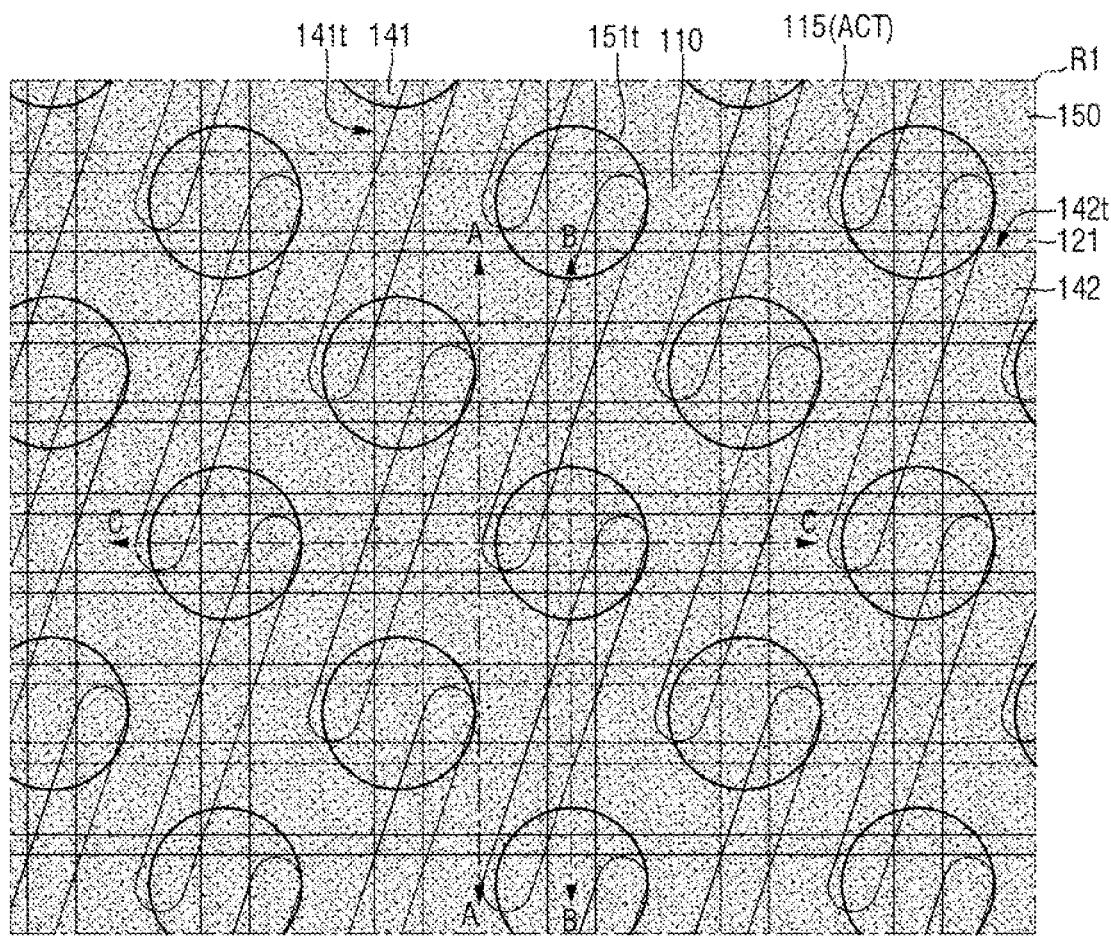
Figure 23:
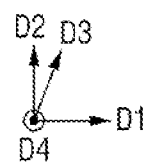
Figure 24A:
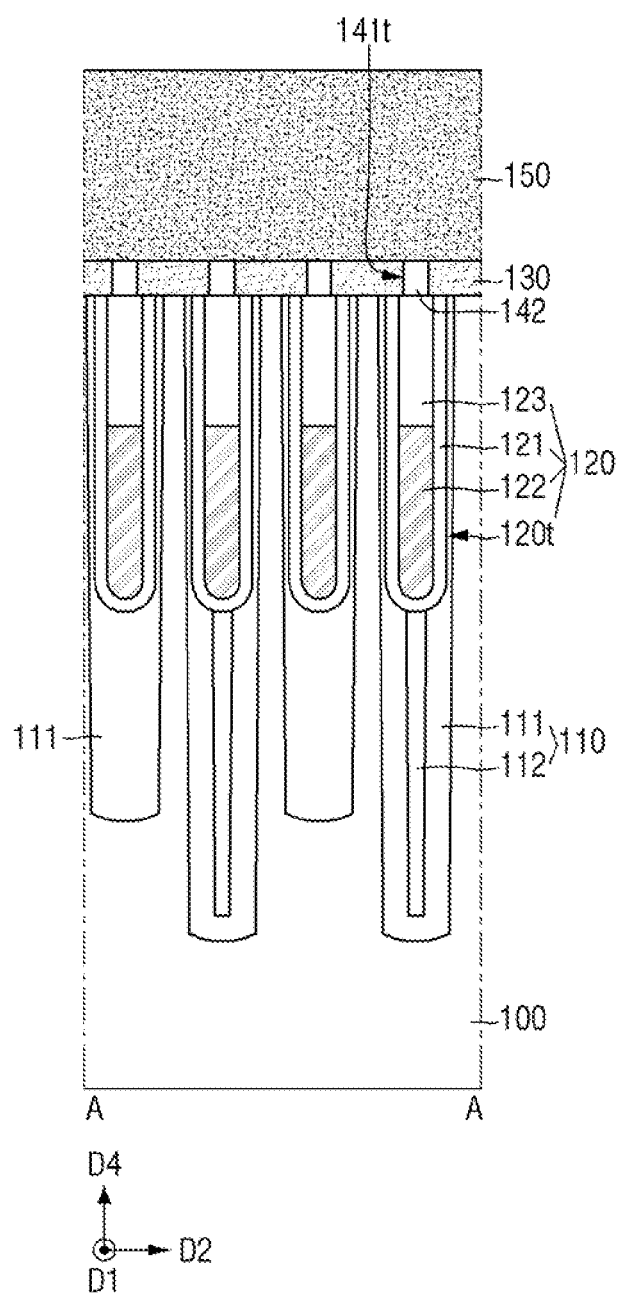
Figure 24B:
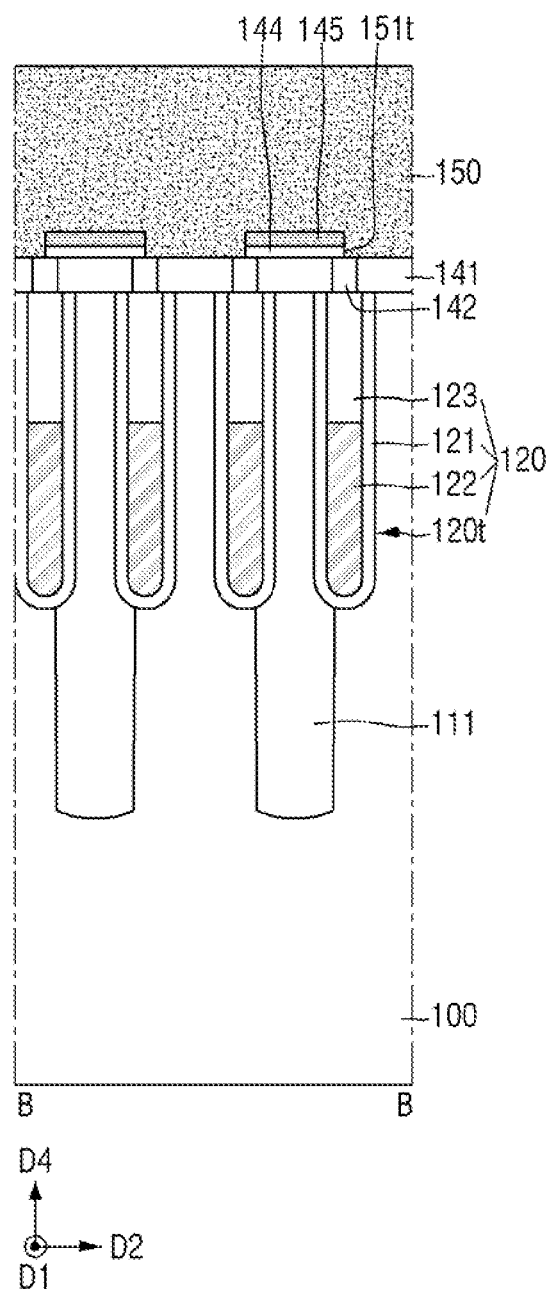
Figure 24C:
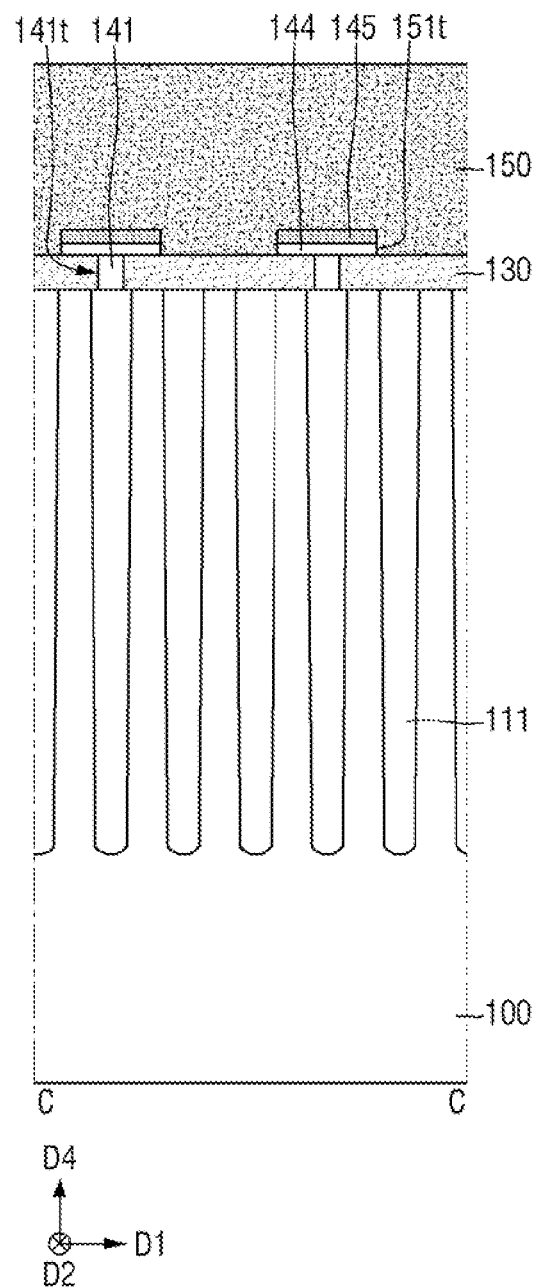
Figure 25:
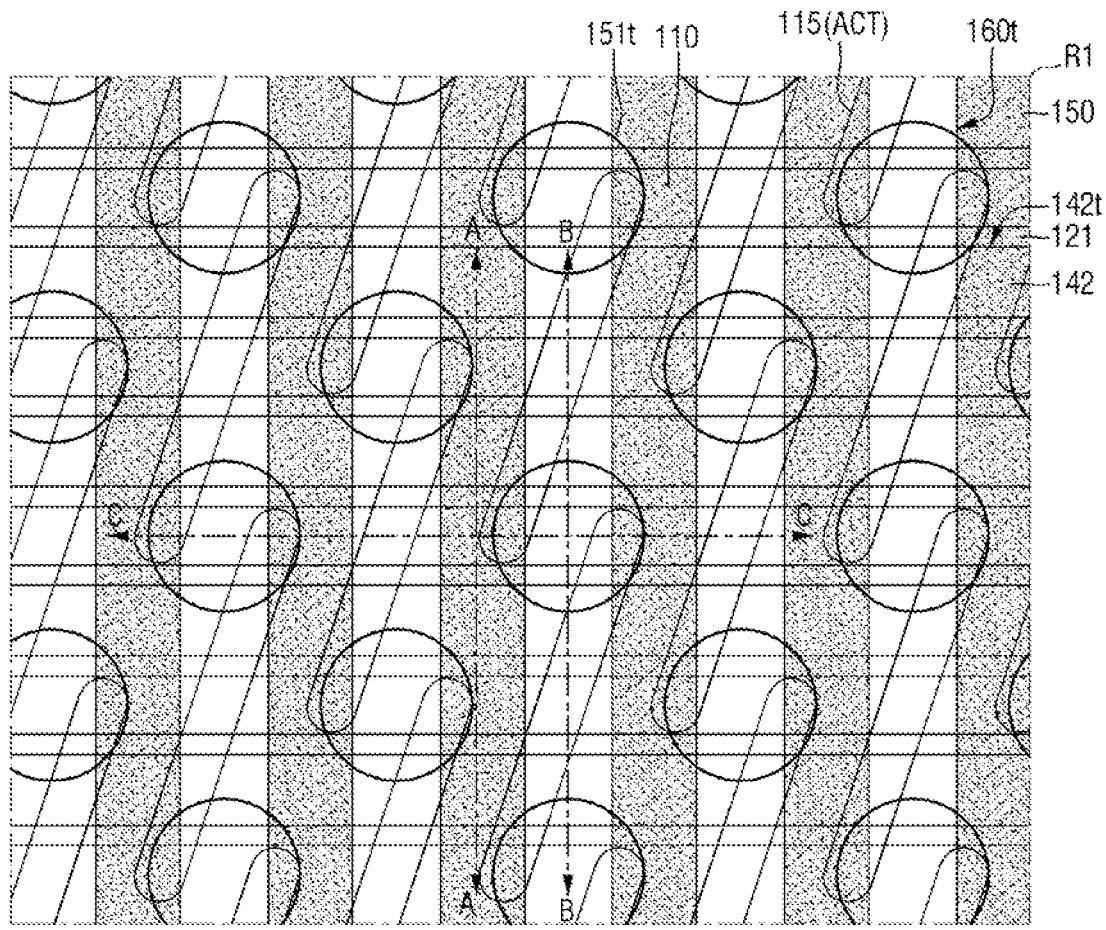
Figure 26A:
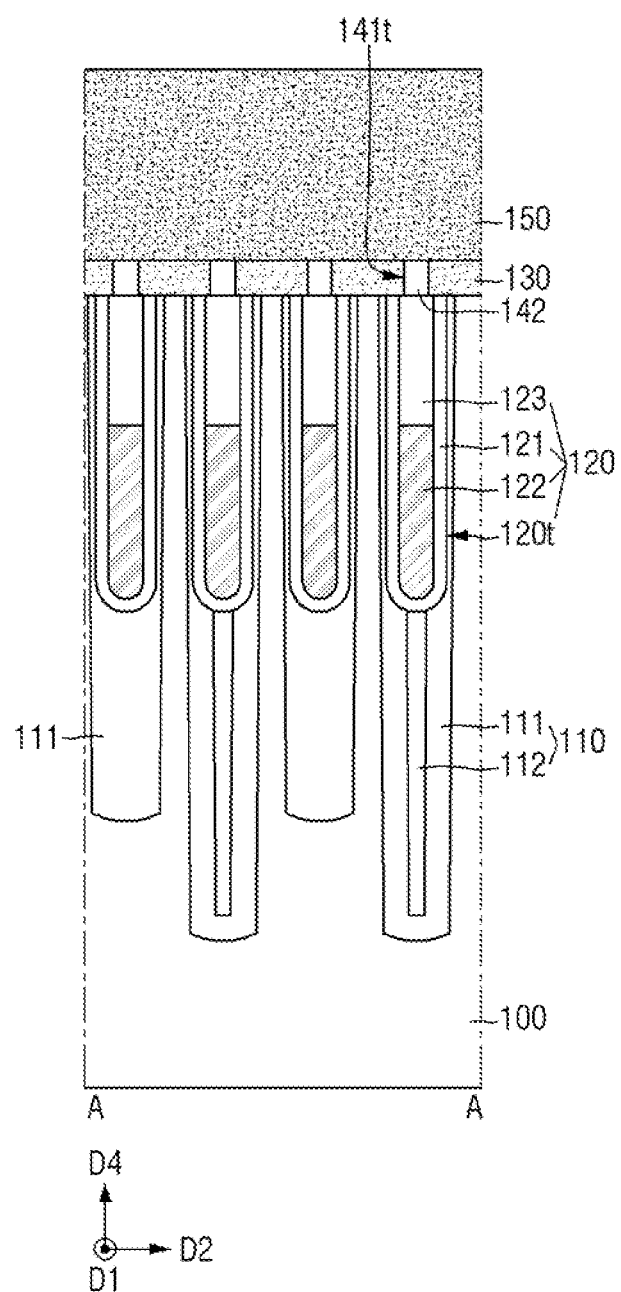
Figure 26B:
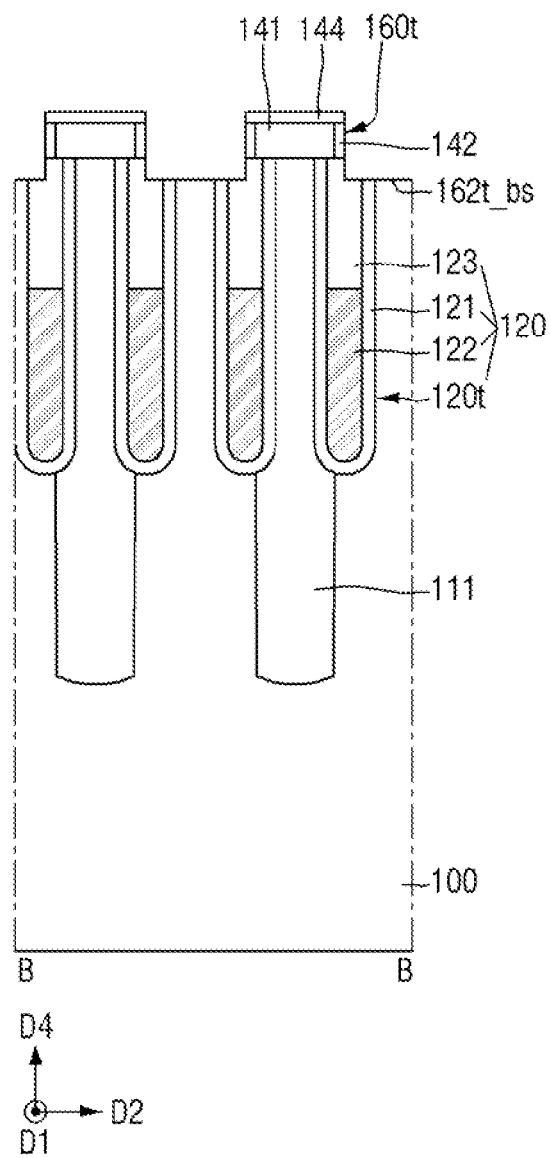
Figure 26C:
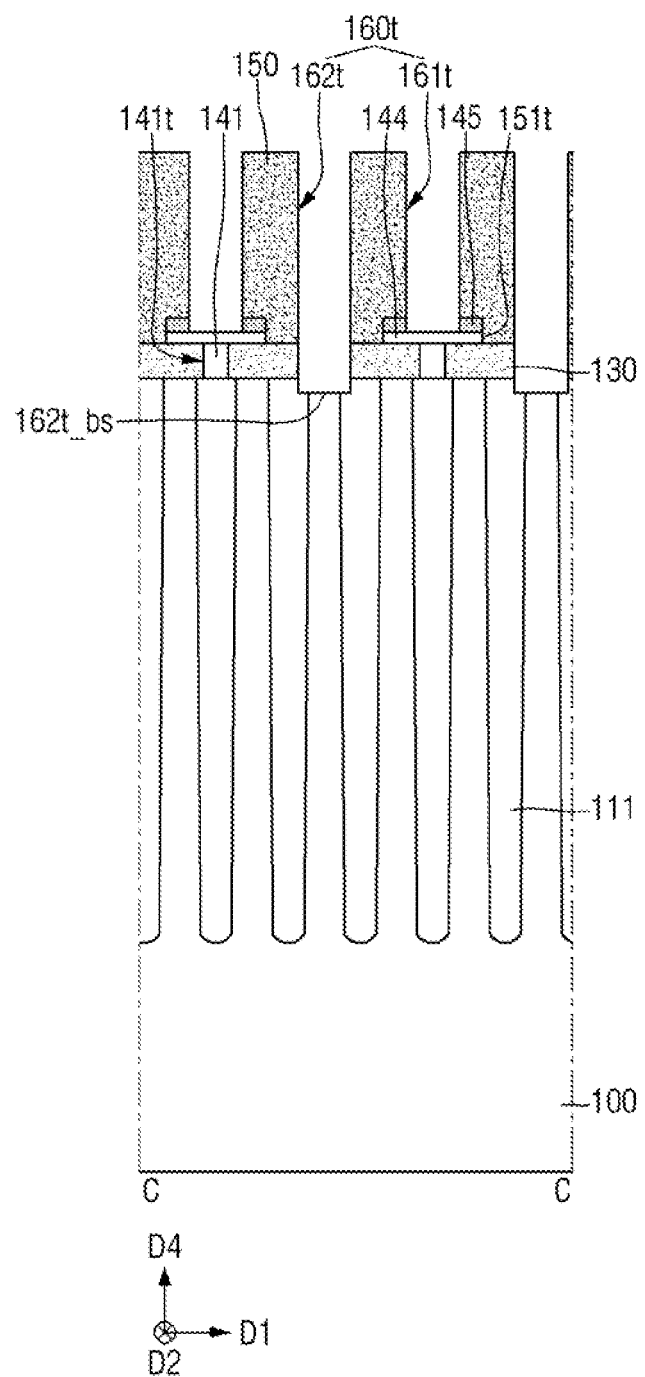
Figure 27:
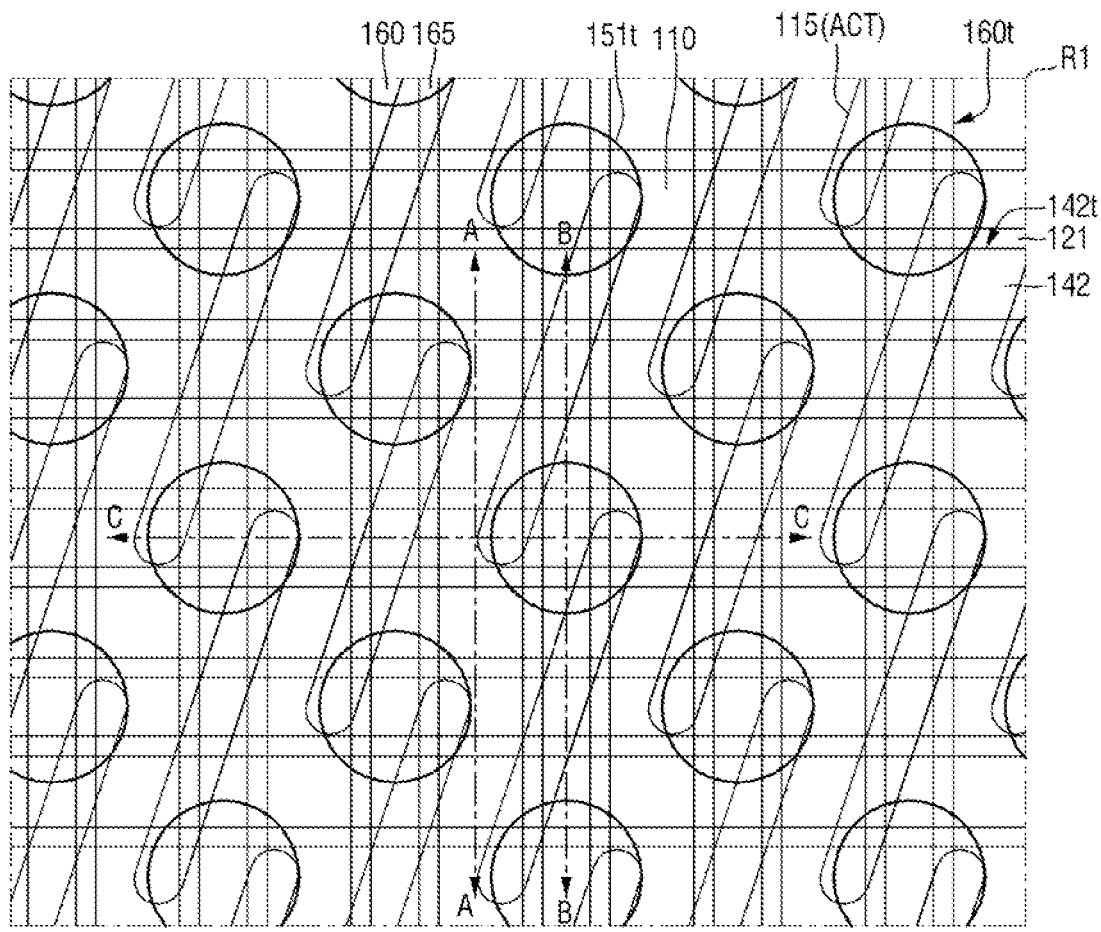
Figure 28A:
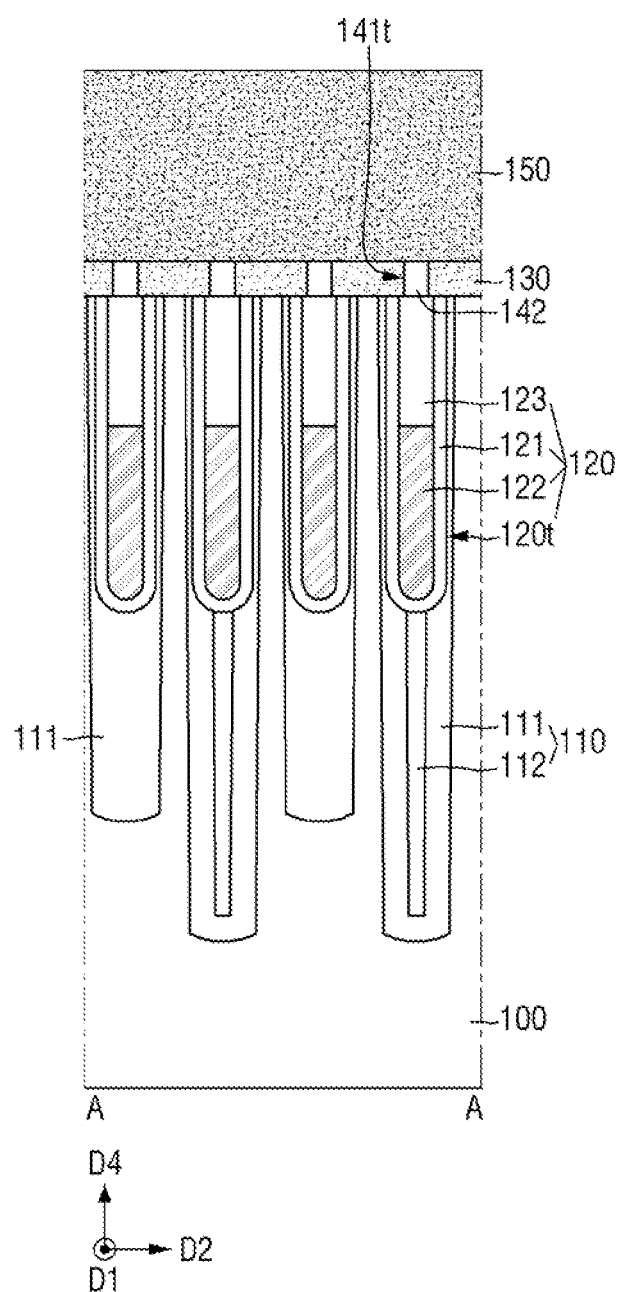
Figure 28B:
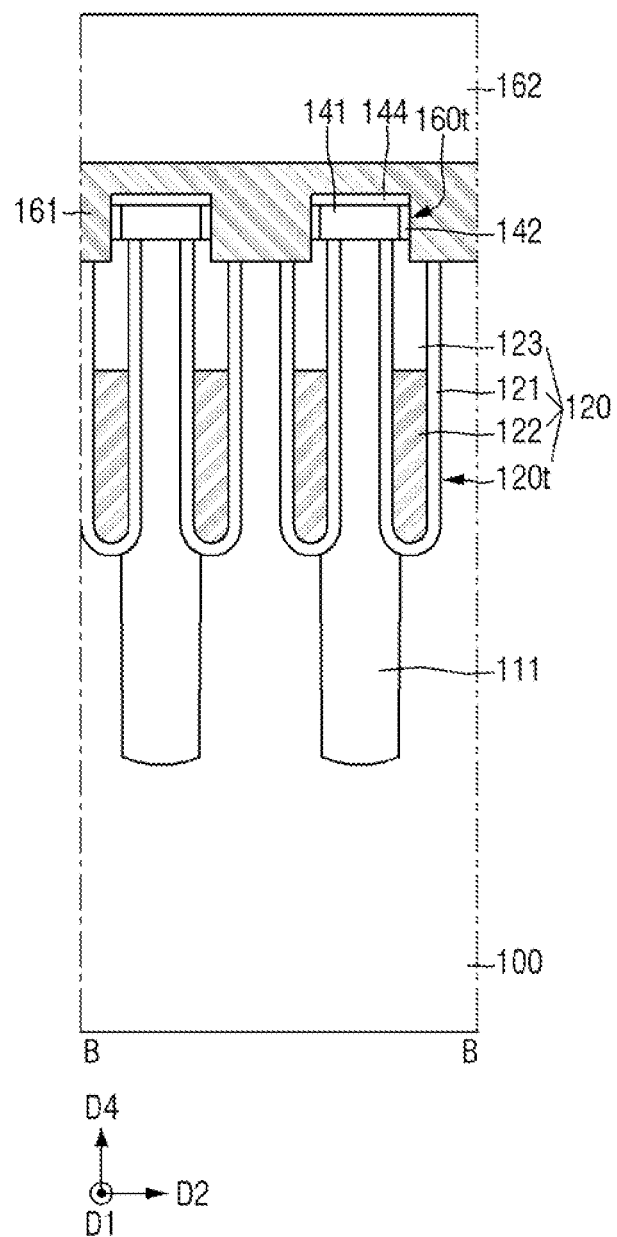
Figure 28C:
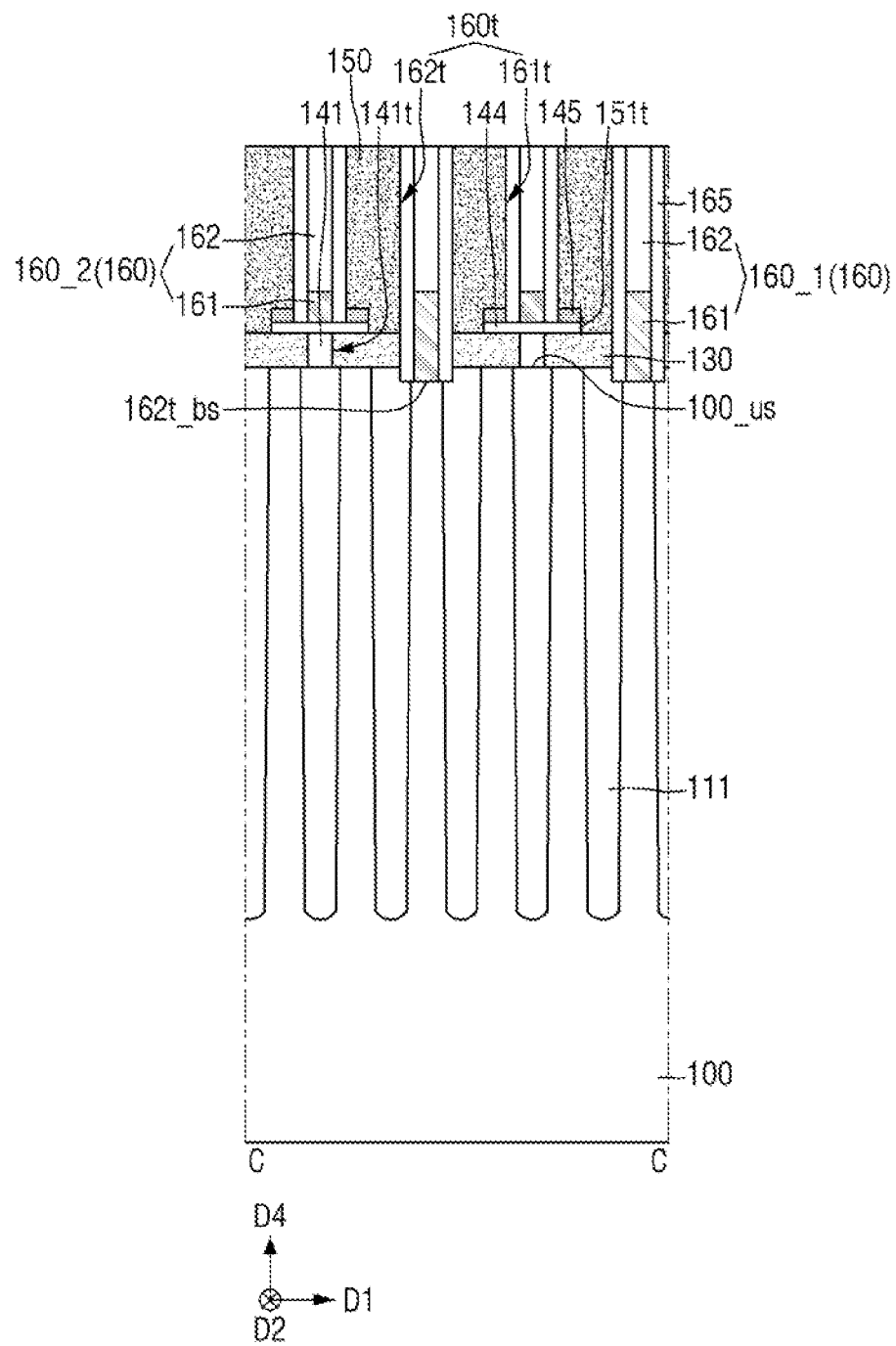
Figure 33:
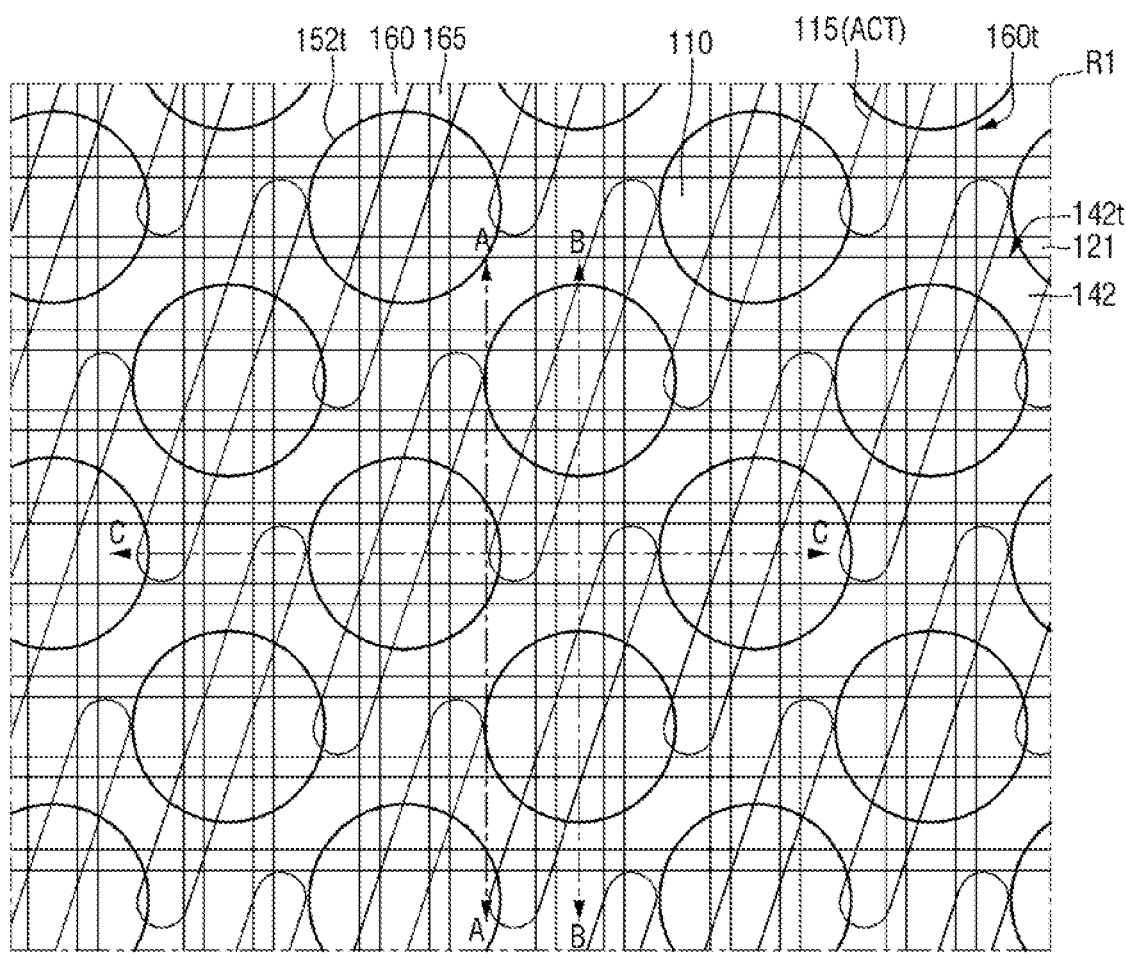
FIG. 33 is a schematic layout view illustrating intermediate steps to describe, a method of manufacturing a semiconductor device according to an embodiment of the present disclosure.
Figure 33:
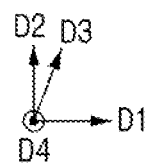

FIG. 33 is a layout view illustrating intermediate steps to describe a method of manufacturing a semiconductor device according to some embodiments. FIG. 33 is a view illustrating intermediate steps to describe steps subsequent to FIG. 20. FIG. 22A corresponds to a cross-sectional view taken along line A-A of FIG. 33, FIG. 22B corresponds to a cross-sectional view taken along line B-B of FIG. 33, and FIG. 22C corresponds to a cross-sectional view taken along line C-C of FIG. 33.

Referring to FIG. 33, a fifth trench 152*t* may be formed on the cell area 20. The fifth trench 152*t* may expose a position overlapped with the bit line contact portion 160_1 of the bit line structure 160, which will be formed later. The fifth trench 152*t* may expose the upper surfaces of the contact pad 130, the first buffer layer 141 and the second buffer layer 142. Therefore, the third buffer layer 144 and the fourth buffer layer 145 may be protruded from the upper surfaces of the contact pad 130, the first buffer layer 141 and the second buffer layer 142 in a portion where the fifth trench 152*t* is not formed.

Subsequently, the manufacturing process described with reference to FIGS. 23 to 29C may be performed.

Although embodiments according to the present disclosure have been described with reference to the accompanying drawings, the present disclosure can be manufactured in various forms without being limited to the above-described embodiments and the person with ordinary skill in the art to which the present disclosure pertains can understand that the present disclosure can be embodied in other specific forms without departing from technical spirits and essential characteristics of the present disclosure. Thus, the above embodiments are to be considered in all respects as illustrative and not restrictive.

What is claimed is:

1. A semiconductor device comprising:
a device isolation layer defining a cell active area in a substrate;
a plurality of buried contacts electrically connected with the substrate and arranged in a first direction;
a bit line structure extending in a second direction between adjacent buried contacts of the plurality of buried contacts, the bit line structure including a bit line pass portion and a bit line contact portion, wherein the bit line structure is electrically connected with the cell active area; and
a first buffer pattern disposed between the substrate and the bit line pass portion, the first buffer pattern having an upper portion and a lower portion, wherein the upper portion is wider than a lower portion thereby collectively forming a T-shape in a cross-section taken along the first direction.

2. The semiconductor device of claim 1, further comprising:
a contact pad between the plurality of buried contacts and the substrate;
a landing pad on the plurality of buried contacts; and
a capacitor structure on the landing pad.

3. The semiconductor device of claim 2, wherein an upper surface of the contact pad is disposed below an upper surface of the first buffer pattern.

4. The semiconductor device of claim 1, wherein the bit line structure includes a bit line spacer, a bit line stack for filling a portion of a bit line trench defined by the bit line spacer, and a bit line capping pattern on the bit line stack.

5. The semiconductor device of claim 4, wherein the bit line spacer is disposed directly on the first buffer pattern.

6. The semiconductor device of claim 4, wherein the bit line spacer exposes a lower surface of the bit line pass portion and a lower surface of the bit line contact portion.

7. The semiconductor device of claim 1, wherein the lower portion of the first buffer pattern includes a material that is different from a material of the upper portion of the first buffer pattern.

8. The semiconductor device of claim 1, further comprising a second buffer pattern disposed on the first buffer pattern.

9. The semiconductor device of claim 8, wherein the second buffer pattern includes a material that is different from a material of the upper portion of the first buffer pattern.

10. The semiconductor device of claim 8, wherein the second buffer pattern is disposed on a first portion of the first buffer pattern that is not overlapped with the bit line structure, and is not disposed on a second portion of the first buffer pattern overlapped with the bit line structure.

11. The semiconductor device of claim 1, further comprising:
a second buffer pattern disposed on the upper portion of the first buffer pattern and having a width substantially the same as that of the upper portion of the first buffer pattern in the cross-section taken along the first direction.

12. A semiconductor device comprising:
a substrate including a device isolation layer and a cell active area defined by the device isolation layer;
a plurality of gate electrodes extending in a first direction in the substrate and arranged in a second direction;
a plurality of buried contacts disposed in the first direction between adjacent gate electrodes of the plurality of gate electrodes;
a plurality of contact pads electrically connected with the substrate and disposed between the substrate and the plurality of buried contacts;
a plurality of landing pads disposed on the plurality of buried contacts and electrically connected with the plurality of buried contacts;
a first buffer pattern disposed on the substrate and having an upper portion and a lower portion, wherein the upper portion is wider than a lower portion thereby collectively forming a T-shape in a cross-section taken along the first direction; and
a bit line structure extended in the second direction between adjacent buried contacts of the plurality of buried contacts, the bit line structure including a bit line pass portion and a bit line contact portion, wherein the bit line contact portion is electrically connected with the cell active area by passing through the first buffer pattern.

13. The semiconductor device of claim 12, wherein:
the plurality of contact pads are disposed on a sidewall of the lower portion of the first buffer pattern; and
the plurality of buried contacts are disposed on a sidewall of the upper portion of the first buffer pattern.

14. The semiconductor device of claim 12, further comprising a second buffer pattern disposed on the first buffer pattern and protruding from a sidewall of the bit line structure.

15. The semiconductor device of claim 12, further comprising a fence pattern separating adjacent buried contacts of the plurality of buried contacts from each other,
wherein the lower portion of the first buffer pattern is disposed between the plurality of gate electrodes and the fence pattern.

16. The semiconductor device of claim 12, wherein the lower portion of the first buffer pattern includes a material that is different from a material of the upper portion of the first buffer pattern.

17. The semiconductor device of claim 12, wherein the lower portion of the first buffer pattern includes a silicon oxide, and the upper portion of the first buffer pattern includes silicon nitride.

18. The semiconductor device of claim 12, further comprising a bit line spacer extended in the second direction,
wherein the bit line structure includes the bit line spacer, a bit line stack for filling a portion of a bit line trench defined by the bit line spacer, and a bit line capping pattern on the bit line stack, and
the bit line spacer is disposed on the first buffer pattern in the bit line pass portion, and is disposed on the substrate in the bit line contact portion.

19. A semiconductor device comprising:
a device isolation layer defining a cell active area in a substrate;
a plurality of gate electrodes extended in a first direction in the substrate and arranged in a second direction;
a plurality of buried contacts electrically connected with the substrate and arranged in the first direction between the gate electrodes adjacent to each other;
a plurality of landing pads disposed on the plurality of buried contacts and electrically connected with the plurality of buried contacts;
a plurality of capacitor structures disposed on the plurality of landing pads and electrically connected with the plurality of landing pads;
a bit line structure extending in the second direction between adjacent buried contacts of the plurality of buried contacts, the bit line structure including a bit line pass portion and a bit line contact portion, wherein the bit line contact portion is electrically connected with the substrate;
a first buffer pattern disposed between the substrate and the bit line pass portion, the first buffer pattern having a T-shape in a cross-section taken along the first direction; and
a second buffer pattern disposed on the first buffer pattern, wherein an upper surface of the second buffer pattern is covered by the plurality of buried contacts;
wherein the bit line pass portion passes through the second buffer pattern and is disposed directly on the first buffer pattern.

20. The semiconductor device of claim 19, wherein an upper portion of the first buffer pattern includes a material that is different from a material of a lower portion of the first buffer pattern.

* * * * *